(12) United States Patent
Hayashi et al.

(10) Patent No.: US 7,750,413 B2
(45) Date of Patent: Jul. 6, 2010

(54) SEMICONDUCTOR DEVICE AND METHOD FOR MANUFACTURING SAME

(75) Inventors: Yoshihiro Hayashi, Tokyo (JP); Naoya Inoue, Tokyo (JP); Kenichiro Hijioka, Tokyo (JP)

(73) Assignee: NEC Corporation, Tokyo (JP)

( * ) Notice: Subject to any disclaimer, the term of this patent is extended or adjusted under 35 U.S.C. 154(b) by 1033 days.

(21) Appl. No.: 10/561,089

(22) PCT Filed: Jun. 16, 2004

(86) PCT No.: PCT/JP2004/008450

§ 371 (c)(1),
(2), (4) Date: Dec. 16, 2005

(87) PCT Pub. No.: WO2004/112138

PCT Pub. Date: Dec. 23, 2004

(65) Prior Publication Data

US 2006/0157798 A1 Jul. 20, 2006

(30) Foreign Application Priority Data

Jun. 16, 2003 (JP) .............................. 2003-170267

(51) Int. Cl.
*H01L 29/76* (2006.01)
(52) U.S. Cl. .................. 257/374; 257/506; 257/513; 257/516; 257/531
(58) Field of Classification Search .................. 257/374, 257/506, 513, 516, 531
See application file for complete search history.

(56) References Cited

U.S. PATENT DOCUMENTS

2001/0053672 A1* 12/2001 Masaki ...................... 455/90

2002/0050626 A1* 5/2002 Onuma et al. ............... 257/531
2004/0185183 A1* 9/2004 Srinivasan et al. .......... 427/578

FOREIGN PATENT DOCUMENTS

| JP | 7-183458 | 7/1995 |
| JP | 9-181264 | 7/1997 |

(Continued)

OTHER PUBLICATIONS

International Search Report, PCT/JP2004/008450, mailed Oct. 12, 2004.

(Continued)

*Primary Examiner*—Long Pham
(74) *Attorney, Agent, or Firm*—Micheal Best & Friedrich LLP

(57) ABSTRACT

An object of the present invention is to mount both a RF circuit including an inductor formed therein and a digital circuit on a single chip.

MOSFETs are formed on a semiconductor substrate 1 in regions isolated by an element isolation film 2. A plurality of low-permittivity insulator rods including a low-permittivity insulator embedded therein and penetrating a first interlevel dielectric film 4 to reach the internal of the silicon substrate are disposed in the RF circuit area 100. An inductor 40 is formed on the interlevel dielectric film in the RF circuit area by using multi-layered interconnects. A high-permeability isolation region in which a composite material including a mixture of high-permeability material and a low-permittivity material is formed in the region of the core of the inductor and periphery thereof.

5 Claims, 48 Drawing Sheets

51 SEMICONDUCTOR SUBSTRATE
52 LEYERED FILM
53 INDUCTOR
54 LOW-PERMITTIVITY FILLING MEMBER
100 RF CIRCUIT AREA
200 DIGITAL CIRCUIT AREA

FOREIGN PATENT DOCUMENTS

| | | |
|---|---|---|
| JP | 09-213894 | 8/1997 |
| JP | 10-154795 | 6/1998 |
| JP | 11-177027 | 7/1999 |
| JP | 2000-40786 | 2/2000 |
| JP | 2000-40789 | 2/2000 |
| JP | 2001-284533 | 10/2001 |
| JP | 2001-308273 * | 11/2001 |
| JP | 2002-289784 | 10/2002 |
| JP | 2002-305110 | 10/2002 |

OTHER PUBLICATIONS

International Preliminary Report on Patentability, PCT/JP2004/008450, mailed Jan. 5, 2006.

* cited by examiner

51 SEMICONDUCTOR SUBSTRATE
52 LEYERED FILM
53 INDUCTOR
54 LOW-PERMITTIVITY FILLING MEMBER
100 RF CIRCUIT AREA
200 DIGITAL CIRCUIT AREA

55 HIGH PEMEABILITY FILLING MEMBER
300 HIGH-PERMEABILITY AREA

55A ROD MEMBER
55B PLANE MEMBER

11 THIRD INTERLEVEL DIELECTRIC FILM
12 SECOND INTERLEVEL DIELECTRIC FILM
13 FOURTH INTERLEVEL DIELECTRIC FILM
14 THIRD-LEVEL COPPER INTERCONNECT
40 INDUCTOR

15 FIFTH INTERLEVEL DIELECTRIC FILM
16 DEPRESSION
17 OPENING

22 FOURTH-LEVEL COPPER INTERCONNECT
23 SIXTH INTERLEVEL DIELECTRIC FILM

24 FIFTH-LEVEL COPPER INTERCONNECT
25 HIGH-PERMEABILITY ISOLATION PLANE

28 SEMI-INSULATING GAAS SUBSTRATE
29 H⁺-DOPED HIGH RESISTANCE AREA
30 N⁺-GAAS LAYER
31 N⁻-GAAS LAYER
32 P⁺-GAAS LAYER
33 N⁻-ALGAAS LAYER
34 N-INGAAS LAYER
35 AU/NI/AUGE LAYER
36, 38 AU/PT LAYER
37 WSI LAYER

41 ON-CHIP ANTENNA INTERCONNECT
400 PERIPHERAL HIGH-RESISTANCE AREA

- 61    RF COMMUNICATION CIRCUIT AREA
- 61A   LNA
- 61B   TRANSMISSION SIGNAL GENERATING CIRCUIT
- 61C   SWITCH CIRCUIT
- 62    DIGITAL BASEBAND
- 62A   A/D CIRCUIT
- 62B   DIGITAL SIGNAL PROCESSING CIRCUIT
- 63C   D/A CIRCUIT (a)

(b) A-A' SECTION (c) B-B' SECTION (a)

(b)

(c)'

(d)

(e)

(f)

(g)

(h)

(i)

(j)

(k)

(e)

(f)

(g)

(h)

(i)

(j)

(k)

(l)

(m)

(e)

(f)

(g)

(h)

(i)

(i)'

SEMICONDUCTOR DEVICE AND METHOD FOR MANUFACTURING SAME

This application claims the benefit of International Patent Application No. PCT/JP2004/008450, filed Jun. 16, 2004, which claims priority of Japanese patent application No. 2003-170267.

TECHNICAL FIELD

The present invention relates to a semiconductor device capable of processing a high-frequency signal and a fabrication method thereof and, more particularly, to a semiconductor device including at least a high-frequency signal processing area on a semiconductor substrate and a fabrication method thereof.

BACKGROUND ART

Development of mobile computing requires a silicon chip to have a radio frequency communication function (RF communication function). A conventional silicon chip has therein CMOS gates including CMOS transistors, wherein signal processing is performed only in a digital logic processing scheme using the CMOS gates. On the other hand, the RF communication function is directed to analog signal processing, and includes an amplifying function for a received wave by using passive elements such as inductors, and a transmitting function using pulse generator, pulse delay circuit etc., in addition to an analog processing function of the CMOS transistors, such as an analog signal amplification function.

More specifically, a communication terminal includes in a silicon semiconductor chip, as shown in FIG. 26, at least a RF communication circuit area 61 including a LNA (Low noise amplifier) 61a, a transmission signal generating circuit 61b and a switch circuit 61c, and a digital baseband (BB) area 62 including an A/D converter 62a for converting those analog signals into digital signals, a digital signal processing circuit 62b, and a D/A converter for again converting the digital signals, for which signal processing is performed, into analog signals. Although a memory area such as SRAM and DRAM is needed therein in fact, it is not depicted in the figure.

The amplifying function of the CMOS transistors is significantly improved along with the development of the microfabrication technique, to the extent that enables the analog signal processing in the RF area. However, the analog circuit requires an LCR circuit configuration, and there are technical problems in development of the high-performance and small-size inductors formed on the silicon semiconductor chips, whereby the practical application thereof is delayed. FIG. 27 shows a schematic top plan view of an inductor formed on a silicon semiconductor chip and an equivalent circuit thereof. The inductor is formed by using multi-layered interconnects formed on the silicon semiconductor chip.

If the loss of the inductor is neglected, the inductance L of the inductor is expressed by the following formula (1):

$$L \propto \mu \times n^2 \times r \quad (1),$$

where $\mu$, n and r are permeability of the inductor-formed area, number of windings and a maximum radius of the windings, respectively.

A silicon oxide film is used for the isolation between the multi-layered interconnects, and the permittivity can be assumed as the permittivity $\mu_0$ of vacuum. According to the formula (1), it is necessary to adopt n=26 as the number of windings and around 2r=250 μm as one side of the inductor, for obtaining L=100 nH. Although this is an extremely small size compared to the off-chip inductor part, it occupies a large area in the normal logic chip. Thus, it is difficult to use a large number of inductors in the RF circuit. Increase of the inductance L without changing the size of the inductor can be achieved by raising the permeability of the inductor-formed area. The formula (1) shows this is achieved by adopting a high-permeability material.

In the formula (1), the inductance (L) of the inductor is noticed. The inductor has a power loss factor, as shown by the equivalent circuit on the silicon semiconductor chip in FIG. 27, which impedes the high-frequency characteristic of the circuit. For example, the resistance (Rs) of the inductor line configured by the multi-layered interconnects causes a large power dissipation because a large-size inductor has an increased line length. In addition, the loss by charge/discharge of the coupling capacitance (Cp) between the lines of the inductor, the loss by the coupling capacitance (Cox/2) between the inductor and the silicon semiconductor substrate, and the loss caused by the p-n junction capacitance in the silicon substrate are the causes of the large power dissipation.

As another factor other than the above losses, there is a noise propagation via the silicon substrate and the loss thereof, which is incurred by an induction current (eddy current) due to the fluctuation of the high-frequency magnetic field from the inductor. The noise propagation phenomenon is a technical problem common to the RF circuits formed on the silicon semiconductor substrate as well as the inductor. For reducing the substrate noise, it is important to increase the substrate resistance (R1) and reduce the substrate capacitance (C1). It is to be noted that the substrate resistance R1 is determined by the specific resistance $\rho$ and the substrate thickness $t_{sub}$.

Under the technical background as described above, the technical development for forming a high-performance inductor on the silicon semiconductor substrate has been advanced. A first conventional technique is such that a groove (trench) is formed on a silicon substrate in an inductor-forming area and filled with a silicon oxide etc. (refer to, for example, JP-A-2000-77610, 2002-93622 and 2000-40789).

FIG. 28 is a sectional view of the on-chip inductor proposed in JP-A-2000-77610. As shown in the same figure, lattice-like trenches are formed on a silicon substrate 71 and filled with a silicon oxide film 72, and an inductor 73 is formed on the resultant trench-forming area. Embedding the silicon oxide film 72 within the silicon substrate 71 reduces the capacitance (C1) of the inductor-formed area and the coupling capacitance (Cox/2) between the inductor line and the substrate, thereby achieving reduction of the leakage current and inductive current of the inductor.

JP-A-2002-93622 describes an element wherein a spiral trench is formed on a silicon substrate in the gaps between spiral lines of the inductor and the outer periphery thereof, and the trench is filled with an insulating material (silicon oxide).

JP-A-2000-40789 describes a technique wherein an inductor is formed using multi-layered interconnects on a silicon substrate, and an opening formed from the surface of the silicon substrate is filled with an insulator (silicon dioxide, or silicon nitride) and an intrinsic silicon, whereby a plate-like insulating film and a shallow-trench insulating film are alternately formed from the surface of the silicon substrate toward the internal of the substrate in the inductor-formed area.

The techniques as described above are such that the silicon substrate is drilled from the surface thereof and the internal of the resultant structure is filled with an insulator.

As a second conventional technique, it is proposed to increase the permeability of the periphery of the windings by embedding a ferromagnetic or soft magnetic material within the inductor-forming area, thereby increasing the inductance (refer to, for example, JP-A-2001-284533). More specifically, JP-A-284533 describes a technique wherein windings of an inductor 83 are formed in an insulating film 82 on a silicon substrate 81, and a magnetic core 84 made of a ferromagnetic substance such as an iron-cobalt alloy is disposed in the insulating film in the central area (and the peripheral area) of the windings, as shown in FIG. 29.

JP-A-2001-285433 describes a technique for reducing the resistance of an inductor line by connecting together a first interconnect layer and a second interconnect layer and thus using a plurality of interconnect layers.

DISCLOSURE OF THE INVENTION

Problems to be Solved by the Invention

All the conventional techniques are proposed for improving the performance of the inductors that are formed on the silicon substrate, and have respective problems as described hereinafter. In either of the first conventional techniques, the groove or trench is drilled from the surface of the silicon substrate. In addition, relatively-high-permittivity materials such as silicon oxide and silicon nitride are to be used as the insulating materials for filling the groove or trench are. Although it is effective to embed an insulating film having a lower permittivity for reducing the parasitic capacitance, the low-permittivity insulating film cannot be used in the conventional techniques because a transistor-forming process is scheduled after embedding the insulating film. As the low-permittivity insulating films, known are an organic siloxane film wherein the oxygen of silicon oxide is partially replaced by organic groups such as a methyl group, a porous insulating film wherein a number of tiny pores having a diameter of 5 nm or less are distributed in an organic siloxane film, and so on. However, these low-permittivity insulating films in general have a heat resistance at a temperature of around 500 degrees C. or lower. On the other hand, a high-temperature heat treatment as high as at 700 degrees C. is necessary for manufacturing the transistors in the steps such as forming a gate insulating film or activation annealing after impurity implantation. Use of a structure, wherein the insulating film is embedded in the inductor-forming area before forming the transistors, inevitably limits the embedded insulating film to a silicon oxide film etc having a higher heat resistance. Accordingly, the first conventional techniques do not well reduce the parasitic capacitance with respect to the substrate.

In addition, although an object of the first conventional techniques is to reduce the substrate current, there is no consideration as to the relationship between the trench depth and the silicon substrate thickness, i.e., to what depth the trench is to be drilled in relation to the thickness of the silicon substrate. Since the silicon substrate is doped with impurities and thus has a low resistance, the substrate current cannot be well reduced so long as the substrate has a large thickness. That is, it is impossible to well reduce the noise and loss therein.

In the second conventional technique as described above, an opening provided therein has a large area compared to its depth and is filled with a ferromagnetic substance. In the case where the cross-sectional area/diameter of the ferromagnetic substance is larger compared to the embedded depth, there is an increased loss resulting from the eddy current caused by fluctuation of the magnetic field passing through the ferromagnetic substance area. For reducing the eddy current, the cross-sectional area must be reduced. However, a smaller cross-sectional area employed alone is not expected to improve the magnetic flux density due to the resultant smaller covering area for the core region.

Furthermore, for reducing the loss of the inductor, it is necessary to reduce the coupling capacitance (Cp) between the lines of the inductor. JP-A-2001-284533 as described above describes embodiments wherein the magnetic core is configured by soft magnetic particles which are fixed together using polyimide. However, there is no consideration as to the reduction of Cp, and remains in the mere use of organic adhesive (polyimide) having a relative permittivity of 3 or above for fixing the magnetic substance.

In the same publication, JP-A-2001-284533, it is recited that the electrical connection of two interconnect layers in parallel can reduce the resistance loss of the inductor line; however, there is a problem in that the use of the underlying interconnect layer as an interconnect of the inductor increases the parasitic capacitance. That is, use of the lower-level interconnect layer that is in the closer vicinity of the substrate causes a smaller distance from the substrate, resulting in the problem of an increase of the parasitic capacitance Cox between the interconnect and the substrate in the equivalent circuit shown in FIG. 27 and thus causing the problem of degradation in the performance of the inductor.

It is an object of the present invention to solve the above problems and to provide a semiconductor device which includes at least a high-frequency signal processing circuit area on a semiconductor substrate, and is capable of reducing loss and noise in the high-frequency range and especially reducing the size and loss of the inductor used as a passive element.

Means for Solving the Problems

In order to achieve the above object, the present invention provides, in a first aspect thereof, a semiconductor device including a semiconductor substrate having therein a low-capacitance substrate region, a transistor formed on a surface area of the semiconductor substrate, and a multi-layered interconnection structure including a plurality of interlevel dielectric films and a plurality of interconnect layers overlying the transistor, characterized in that a plurality of substrate openings are formed in the low-capacitance substrate region, penetrating at least an undermost one of the interlevel dielectric films to reach an internal of the semiconductor substrate.

It is preferable that a low-permittivity insulating material be embedded in the substrate openings. It is more preferable that a length of the substrate openings within the semiconductor substrate be equal to or larger than half a thickness of the semiconductor substrate, or the substrate opening penetrate the semiconductor substrate.

In order to achieve the above object, the present invention provides, in a second aspect thereof, a semiconductor device including a semiconductor substrate, a transistor formed on a surface area of the semiconductor substrate, and a multi-layered interconnection structure including a plurality of interlevel dielectric films and a plurality of interconnect layers overlying the transistor, wherein a high-permeability region is provided in an interlevel dielectric film, characterized in that the high-permeability region includes therein a plurality of high-permeability magnetic rods including a high-permeability material having an electric conductivity and embedded in respective film openings, the film openings having an aspect ratio (depth/diameter or a side) of 1 or above and penetrating at least one of the interlevel dielectric films to reach another of the interlevel dielectric films.

In order to achieve the above object, the present invention provides, in a third aspect thereof, semiconductor device wherein oxide-based the high-permeability region includes a plurality of high-permeability magnetic rods including a high-permeability material having an insulating property and embedded in respective film openings, the film openings penetrating at least one of the interlevel dielectric films to reach another of the interlevel dielectric films.

It is preferable that the high-permeability material be a composite material including a low-permittivity insulating material and a high-permeability material having an electric conductivity or an insulating property. The high-permeability material having an insulating property is an oxide-based high-permeability material, for example. Examples of the high-permeability material having an electric conductivity include: a NiFe-based binary alloy, and polymetal alloys including this binary alloy and an additive element such as Mo, Cr, Cu and Co, i.e., generally called Permalloy-based materials; Fe—Co-based alloy, Ni—Co-based alloy, Fe—Al-based alloy, Fe—Al—Si alloy generally called Sendast, and these alloys added with a minute amount of other elements; amorphous materials such as FeP-based and FeB-based alloys, and these alloys added with other elements; amorphous-state forming element including SiB, such as FeSiB, NiSiB, CoSiB, CoFeSiB, CoFeNiSiB, CoFeMoSiB, CoFeNiNbSiB, and CoFeMnSiB; amorphous materials for a Co-based sputtered film, such as Co—(Zr, Hf, Nb, Ta, Ti)-based material and metal-metal alloys added with several percents of Fe, Mn and Ni, such as CoFePbAl, CoMnB, CoMoZr, CoTaZr, CoNbZr, CoNbTi, CoFeNb, C0MnNb. Granular-film materials such as FeTaN and FeTaC may also be used for this purpose.

Examples of the oxide-based high-permeability material include: materials generally called ferrite expressed by chemical formula $MFe_2O_4$ (M represents divalent metal ions such as $Mn^{2+}$, $Ni^{2+}$ and $Cu^{2+}$); and materials generally called composite ferrite, i.e., mixture of those ferrite materials and non-magnetic oxide such as $ZnFe_2O_4$, for example, Mn—Zn ferrite, Mg—Fe ferrite, Cu—Zn ferrite, Cu—Zn—Mg ferrite, Ni—Cu—Zn ferrite. Moreover, Mn—Mg ferrite, Mn—Mg—Al ferrite, Ni ferrite, Ni—Zn ferrite and YIG ($Y_2Fe_5O_{12}$), which are used in relatively-high-frequency ranges such as MHz range and GHz range; garnet-type ferrite wherein YIG is added with a minute amount of additive elements, such as Al-based YIG, Gd-based YIG, Ca-based YIG, Nb-based YIG; hexagonal-system-type Ba ferrite and Ba ferrite added with a minute amount of other elements; and Ni—Co ferrite and Ni—Cu—Co—Fe ferrite may also be exemplified as preferable materials.

It is to be noted that those examples of high-permeability material do not limit the present invention, and that the composition ratio as to the recited examples of the soft magnetic material is not considered here, which therefore do not limit the present invention.

In order to achieve the above object, the present invention provides, in a fourth aspect thereof, a semiconductor device including a semiconductor substrate having therein a low-capacitance substrate region, a transistor formed on a surface area of the semiconductor substrate, and a multi-layered interconnection structure including a plurality of interlevel dielectric films and a plurality of interconnect layers overlying the transistor, characterized in that a plurality of substrate openings are formed in the low-capacitance substrate region, penetrating at least an undermost one of the interlevel dielectric films to reach an internal of the semiconductor substrate, and a plurality of interconnect layers including at least two interconnect layers are formed overlying the low-capacitance substrate region.

In order to achieve the above object, the present invention provides, in a fifth aspect thereof, a method for manufacturing a semiconductor device including a semiconductor substrate, a transistor formed on a surface area of the semiconductor substrate, and a multi-layered interconnection structure including a plurality of interlevel dielectric films and a plurality of interconnect layers overlying the transistor, wherein a high-permeability region is provided in the interlevel dielectric film, the method including the consecutive steps of:

(1) forming the transistor on the semiconductor substrate;
(2) forming a plurality of substrate openings penetrating at least undermost one of the interlevel dielectric films to reach an internal of the semiconductor substrate;
(3) embedding an insulating material in the openings; and
(4) grinding a bottom surface of the semiconductor substrate.

EFFECTS OF THE INVENTION

In a preferred embodiment of the semiconductor device of the present invention, low-permittivity insulator rods including low-permittivity insulating film embedded in the semiconductor substrate underlying the inductor-forming region are disposed, and the substrate thickness is made small. This configuration is capable of suppressing the coupling capacitance between the inductor and the substrate to a lower value and also reducing the current induced in the substrate.

Moreover, if the inductor-forming region is provided with high-permeability material rods wherein a soft magnetic material is embedded within openings having a high aspect ratio, size reduction of the inductor can be achieved while suppressing the eddy current.

A configuration wherein a mixture of a soft magnetic material (high-permeability material) and a low-permittivity material is embedded within the openings in the inductor-forming area, if employed, achieves reduction in the capacitance between the lines of the inductor in addition to the size reduction of the inductor. This configuration reduces the loss and size of the RF circuit including the inductor, and achieves a semiconductor chip on which both a digital signal processing function and a RF circuit are mounted.

In the present invention, the semiconductor substrate is not limited to any specific one. By forming an area including low-permittivity insulator rods embedded in a silicon semiconductor substrate on which CMOS devices are formed, the silicon substrate, which is inherently a low resistance material, is provided with a high-resistance and low-permittivity area as a low-noise propagation area in a desired portion of the silicon substrate. The multi-layered interconnection structure includes an interconnection structure including two or more interconnect layers.

BRIEF DESCRIPTION OF HE DRAWINGS

Figure 8:
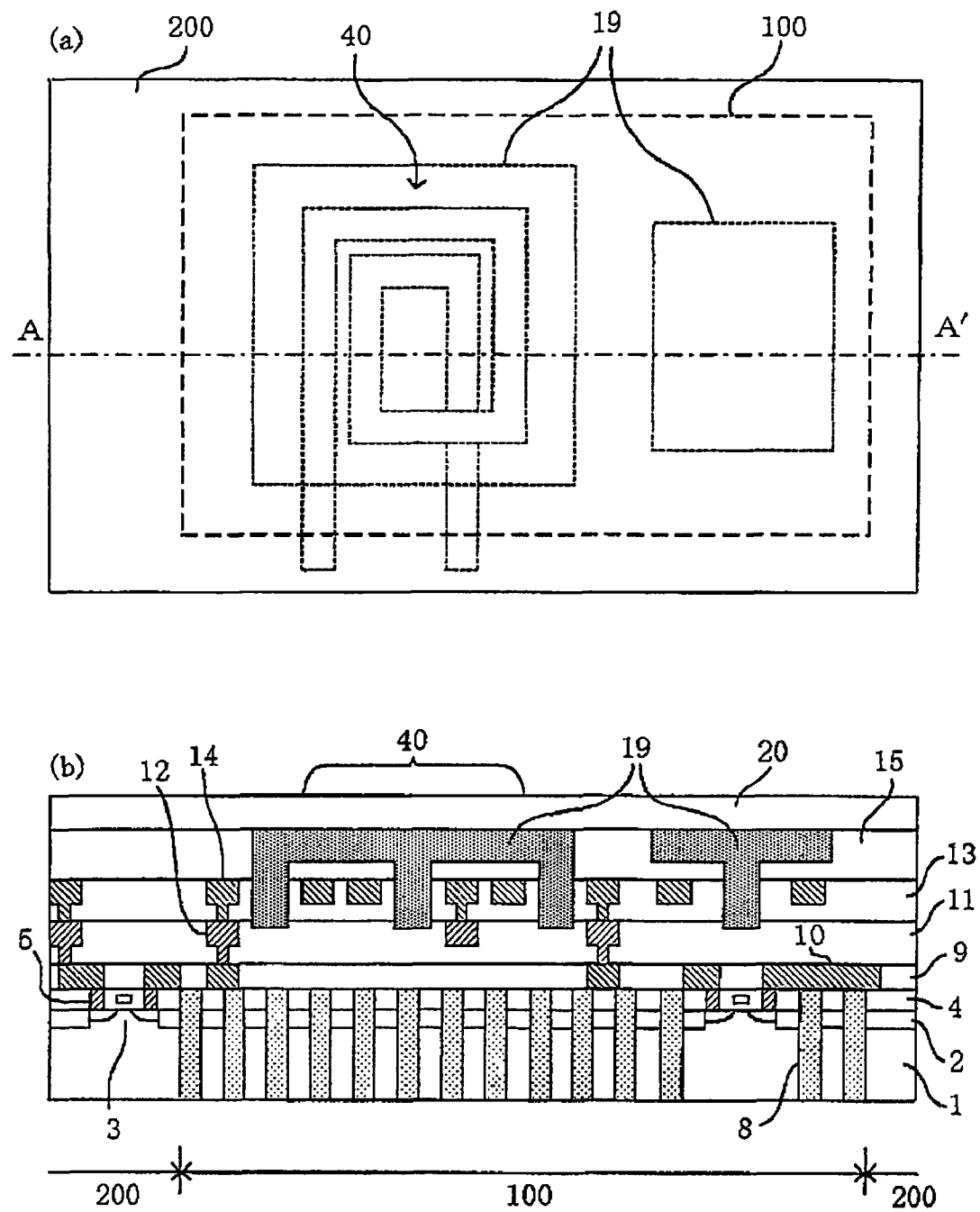

FIG. 8 includes a top plan view and a sectional view of a semiconductor device of a first example of the present invention.

Figure 9:
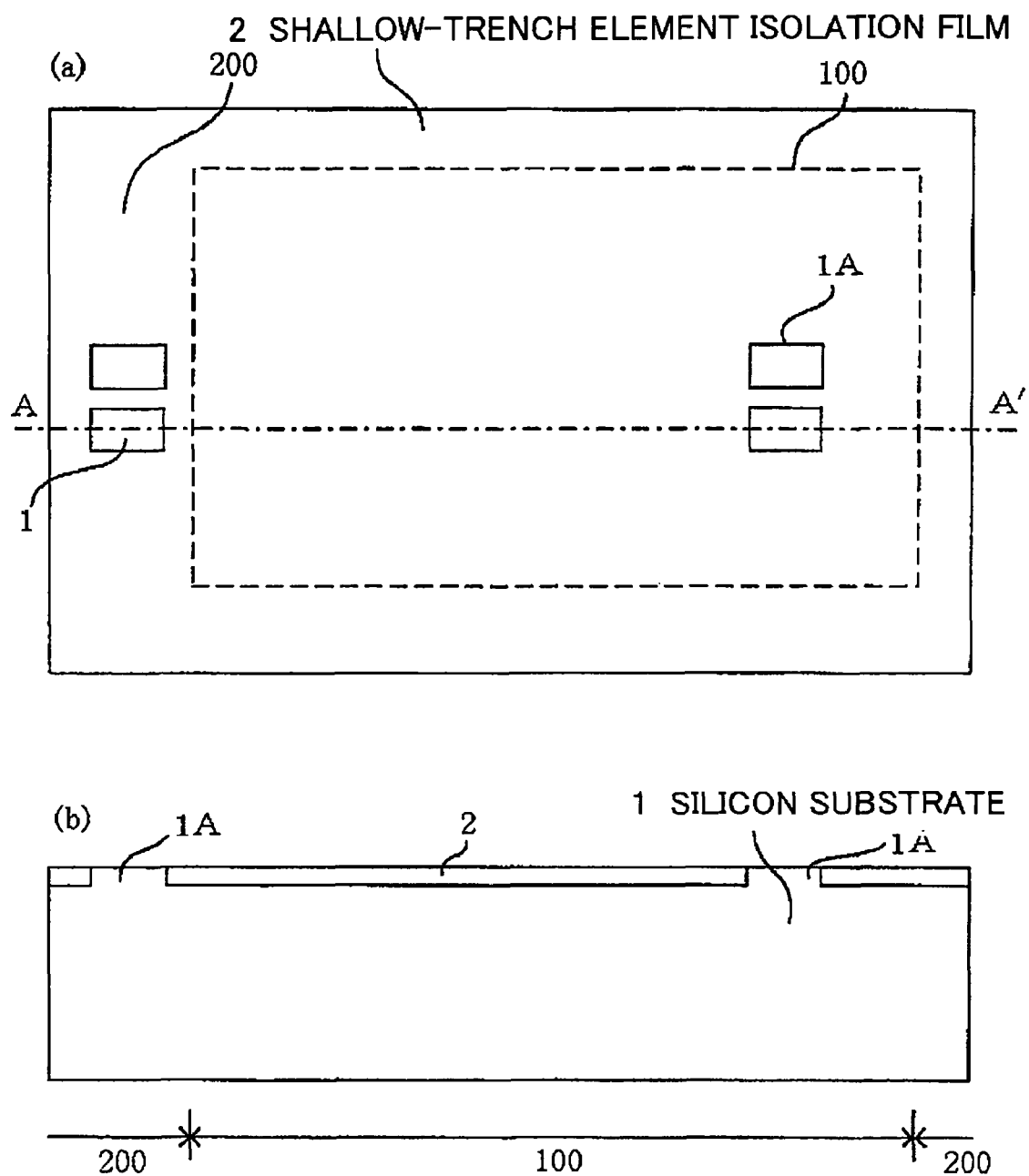

FIG. 9 includes a top plan view and a sectional view of the semiconductor device of the first example in a process step of a fabrication method thereof.

Figure 10:
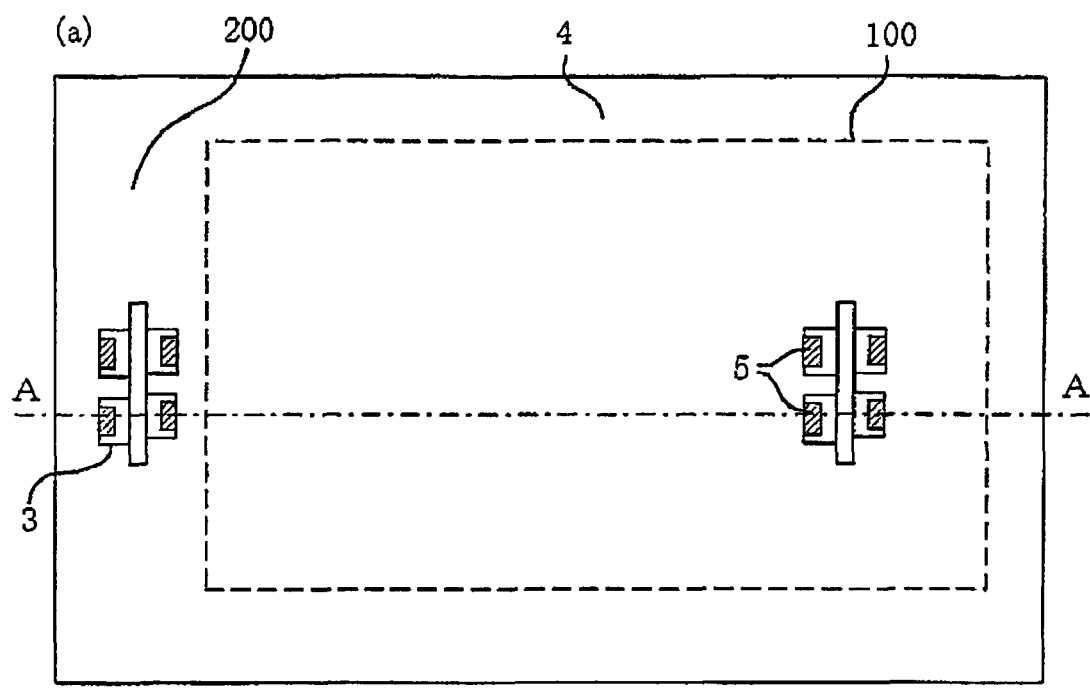
Figure 10:
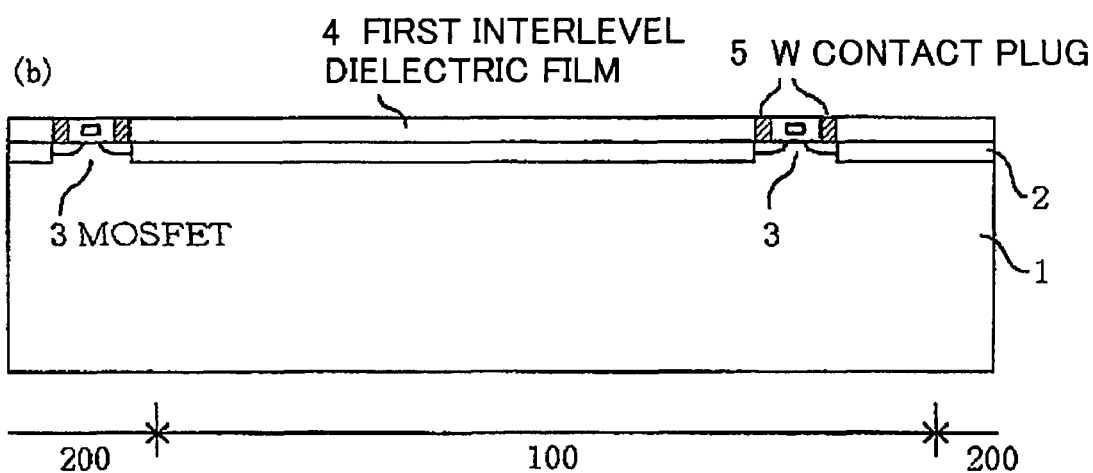

FIG. 10 includes a top plan view and a sectional view of the semiconductor device of the first example in a process step of a fabrication method thereof.

Figure 11:
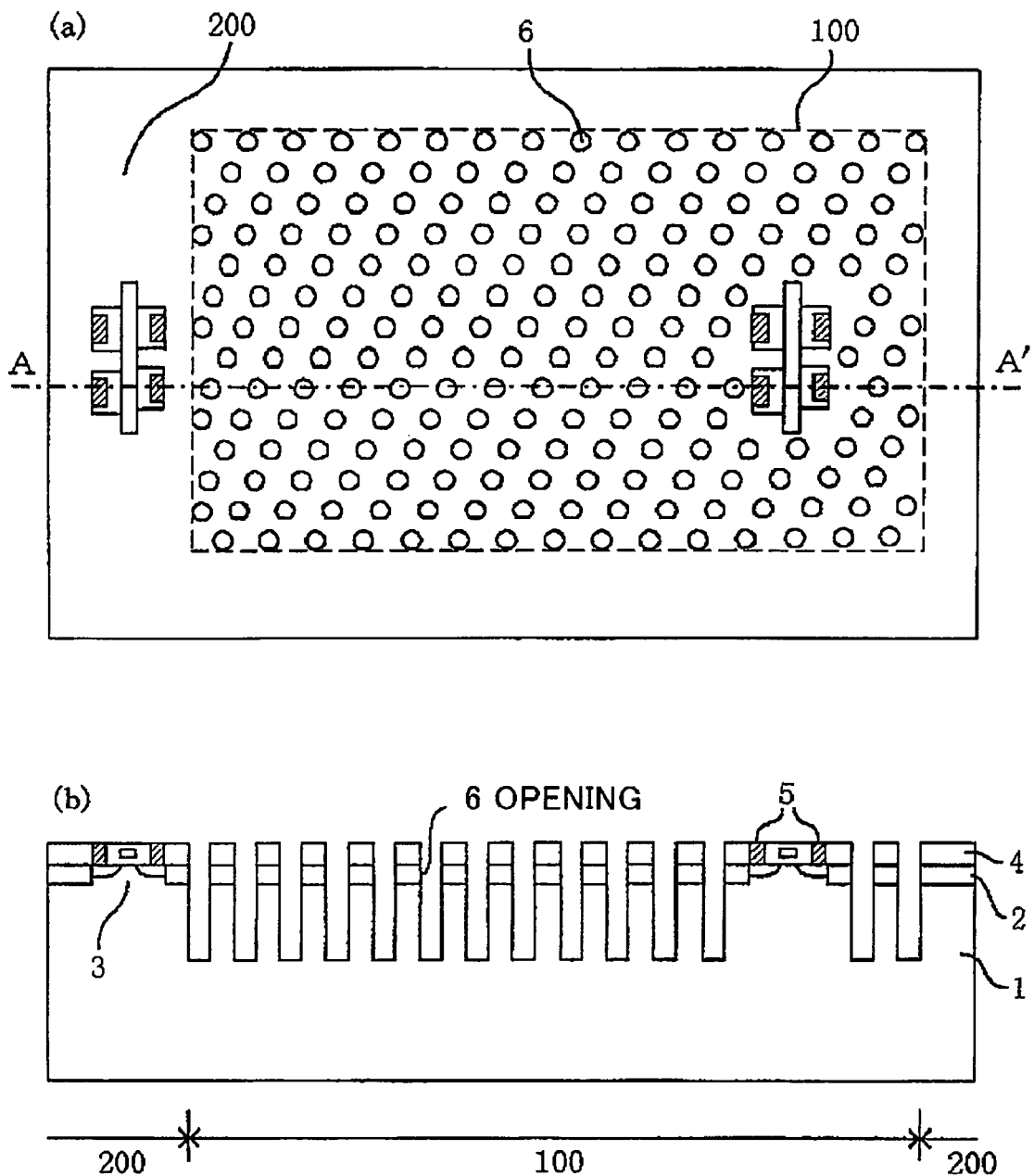

FIG. 11 includes a top plan view and a sectional view of the semiconductor device of the first example in a process step of a fabrication method thereof.

Figure 12:
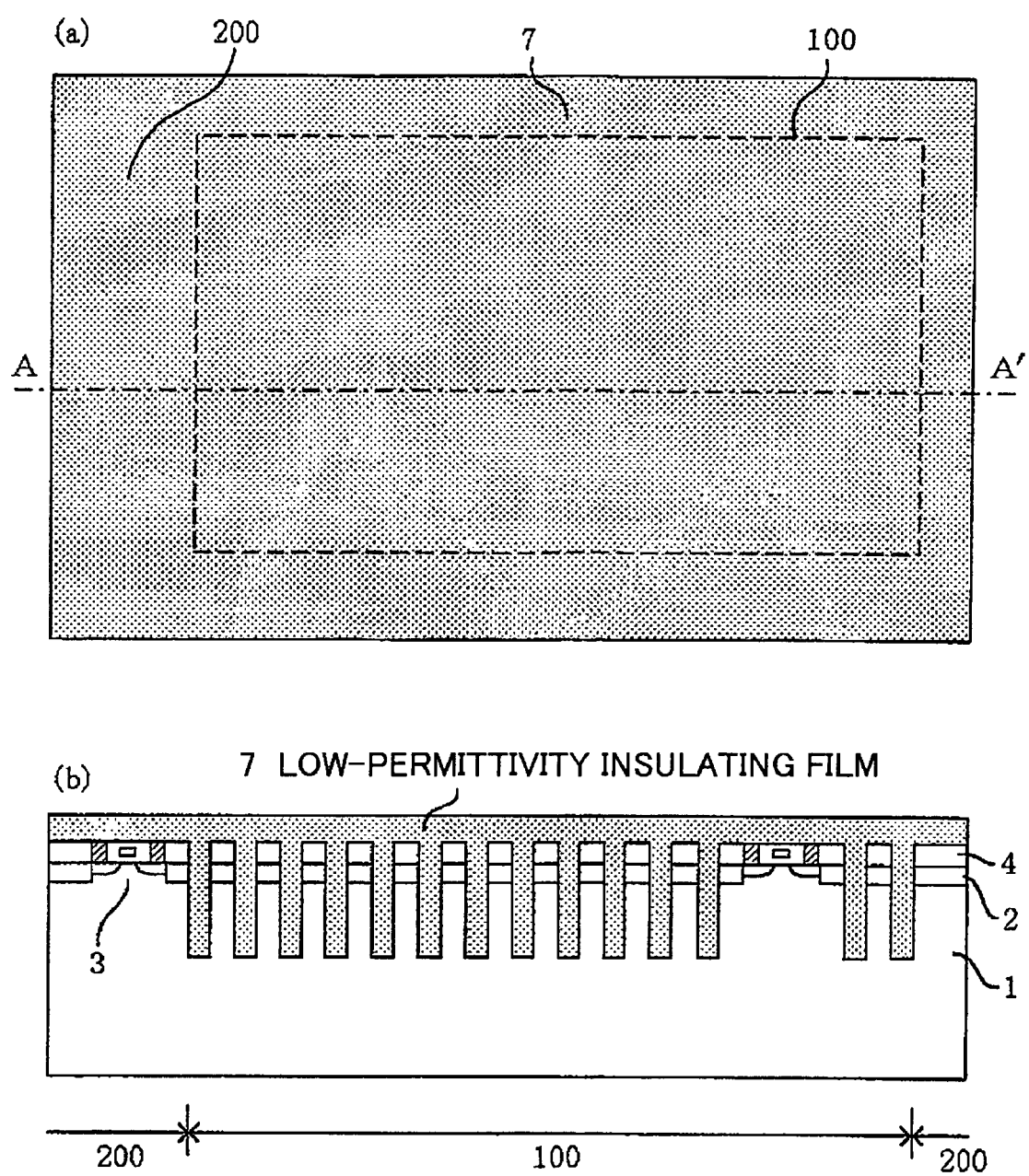

FIG. 12 includes a top plan view and a sectional view of the semiconductor device of the first example in a process step of a fabrication method thereof.

Figure 13:
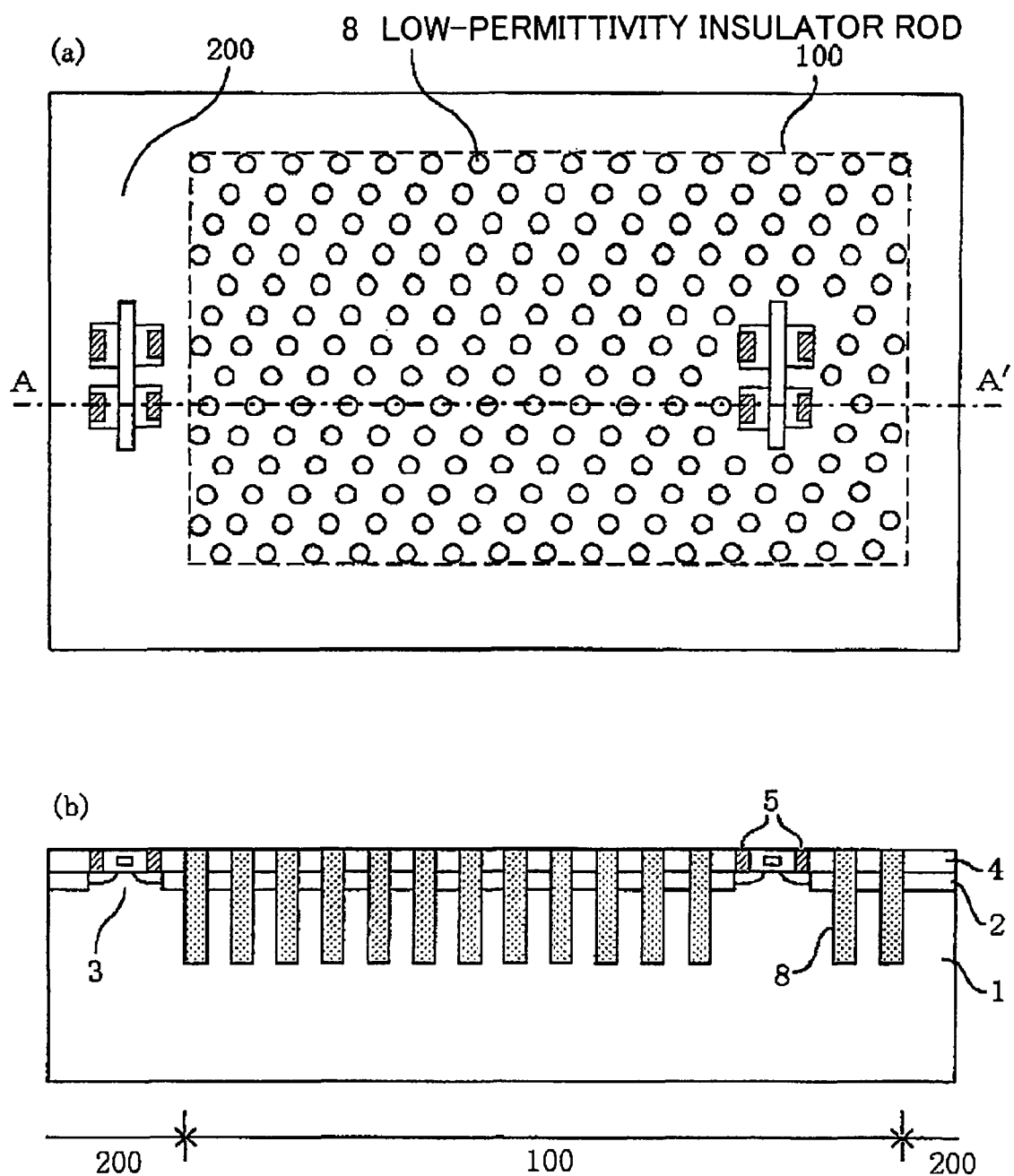

FIG. 13 includes a top plan view and a sectional view of the semiconductor device of the first example in a process step of a fabrication method thereof.

Figure 14:
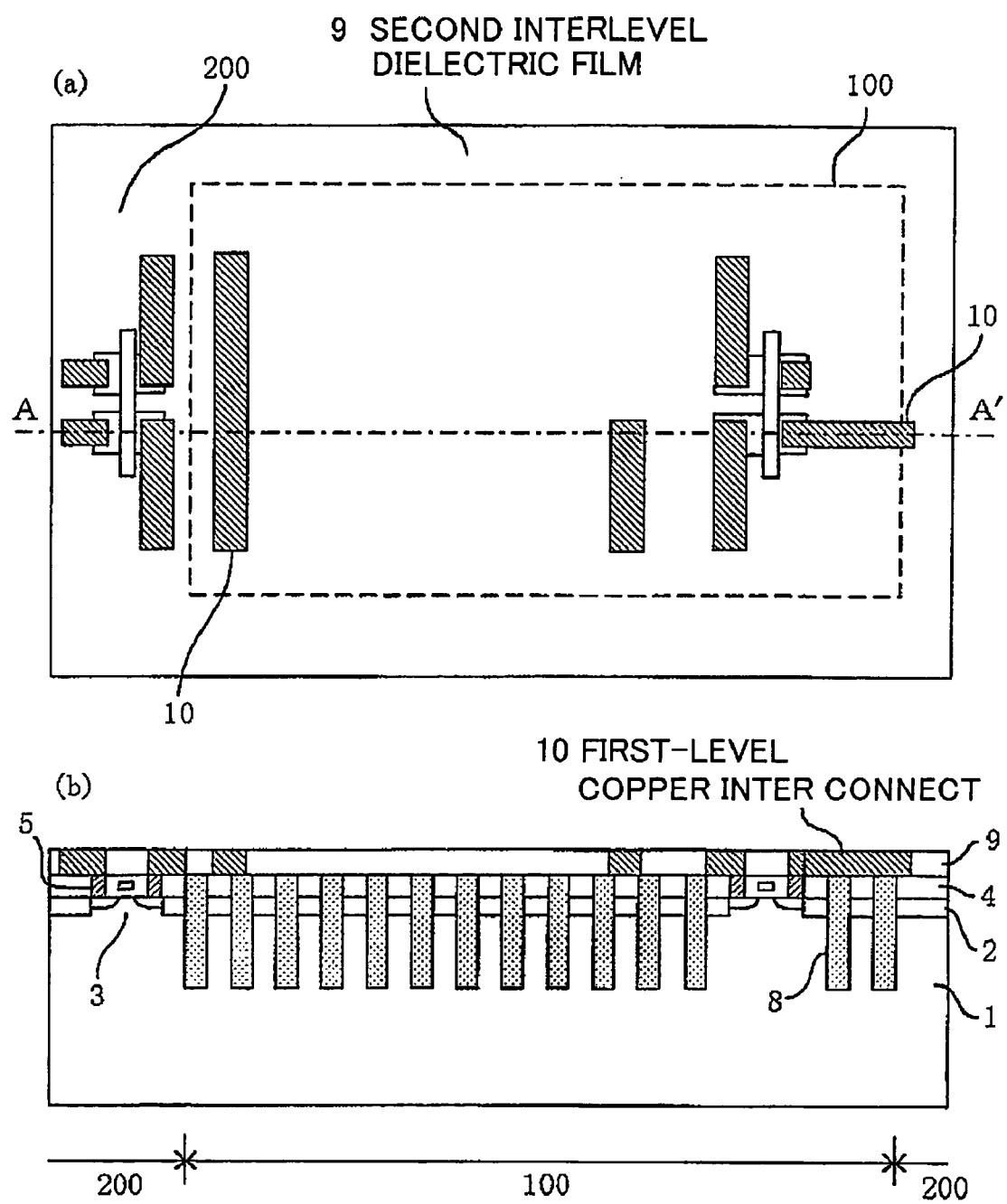

FIG. 14 includes a top plan view and a sectional view of the semiconductor device of the first example in a process step of a fabrication method thereof.

Figure 15:
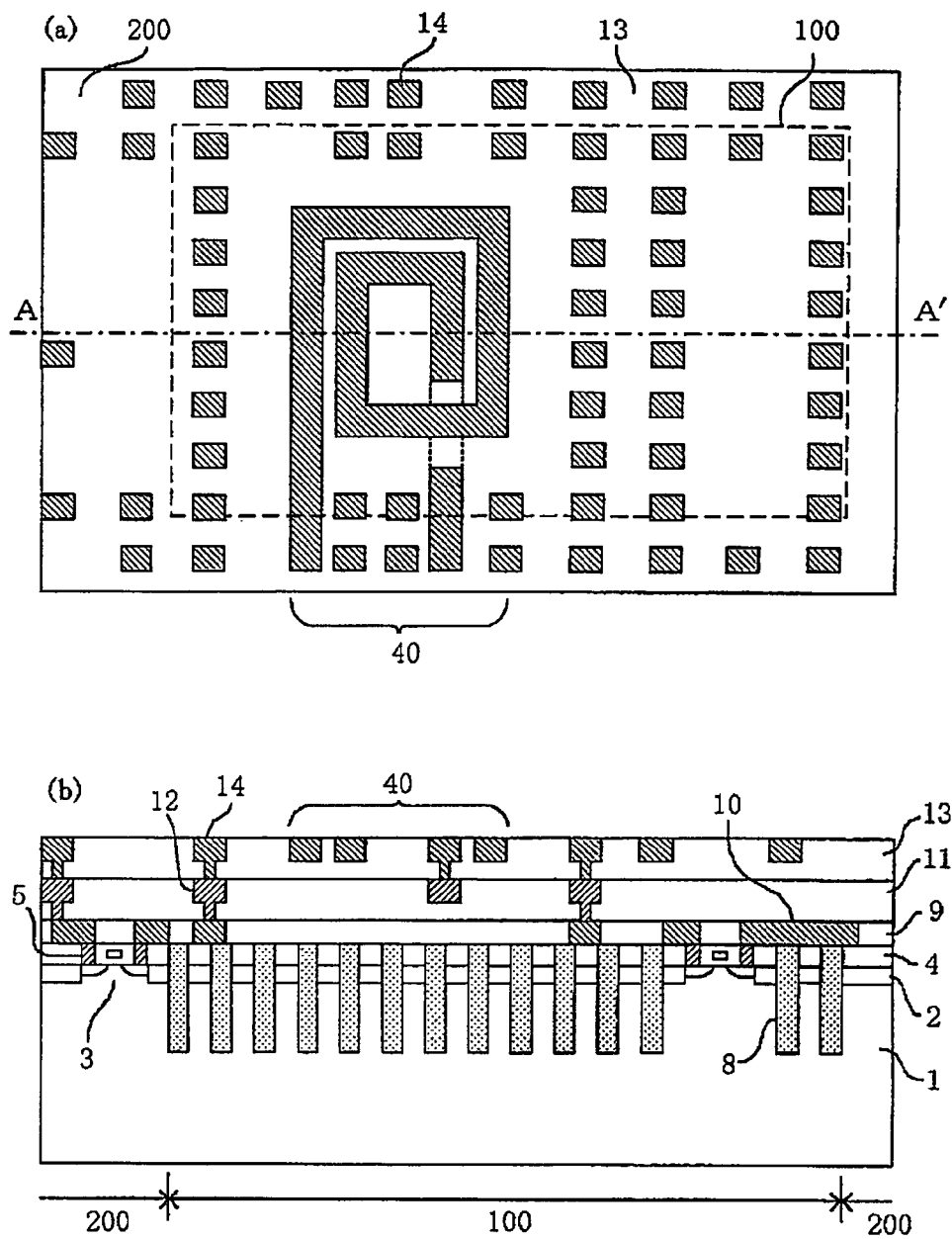

FIG. 15 includes a top plan view and a sectional view of the semiconductor device of the first example in a process step of a fabrication method thereof.

Figure 16:
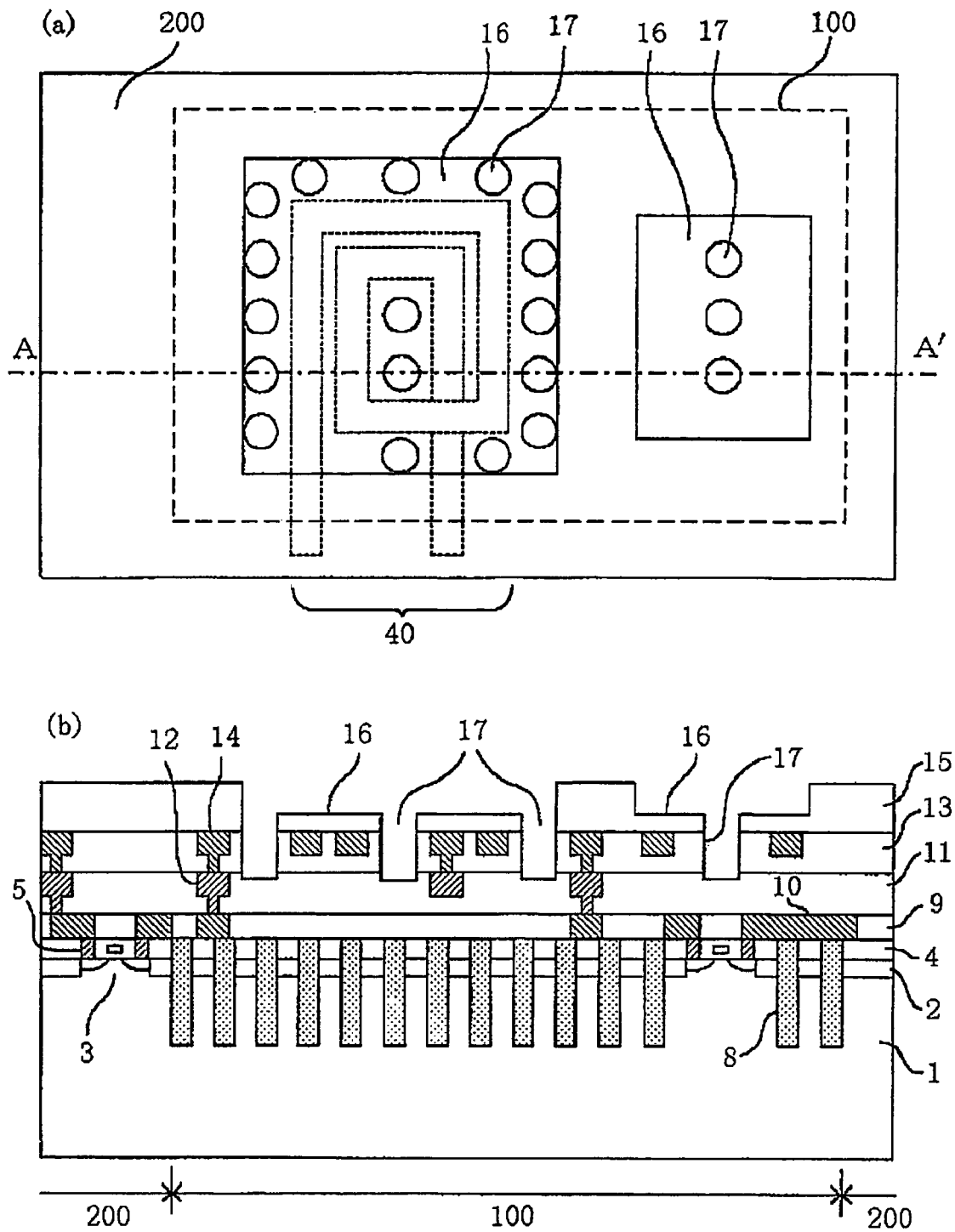

FIG. 16 includes a top plan view and a sectional view of the semiconductor device of the first example in a process step of a fabrication method thereof.

Figure 17:
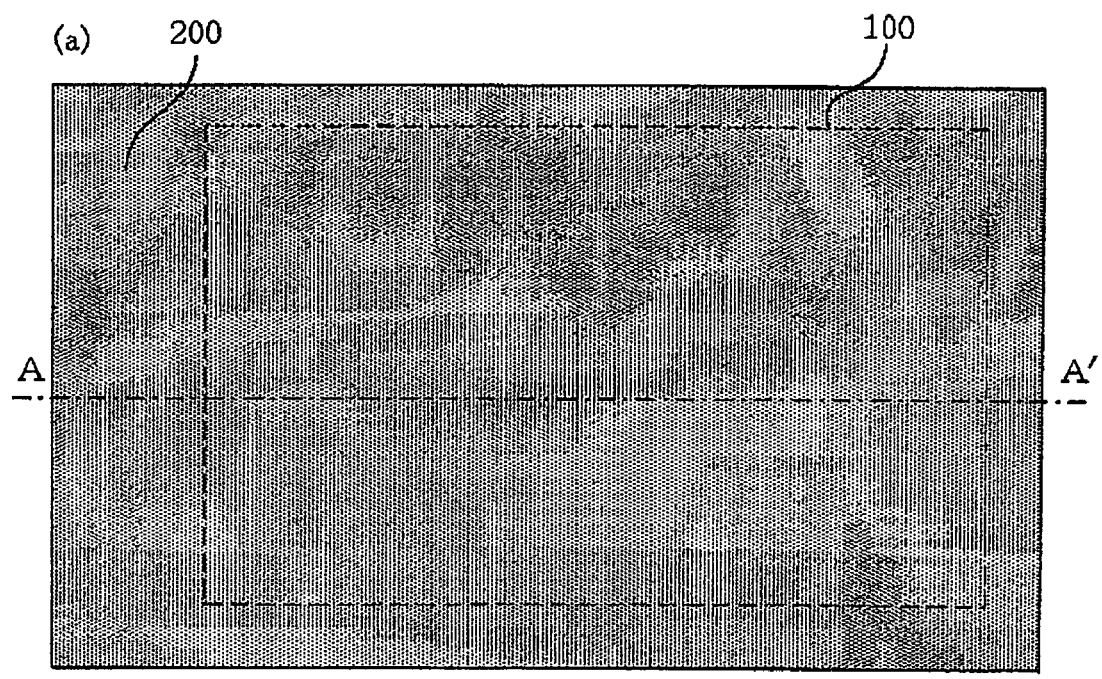
Figure 17:
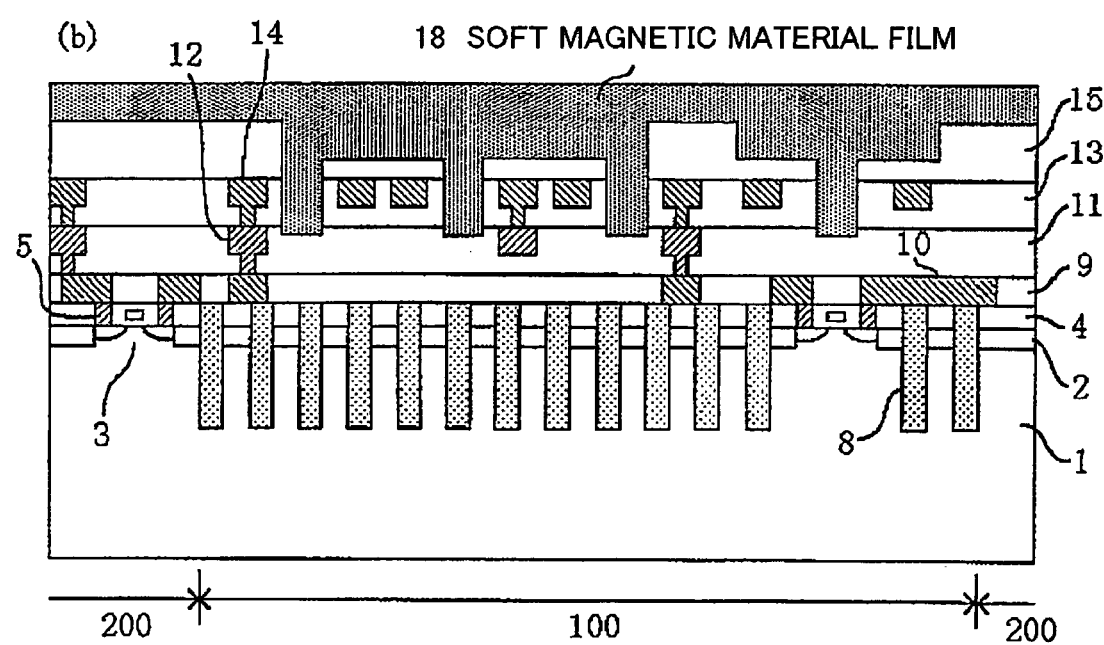

FIG. 17 includes a top plan view and a sectional view of the semiconductor device of the first example in a process step of a fabrication method thereof.

Figure 18:
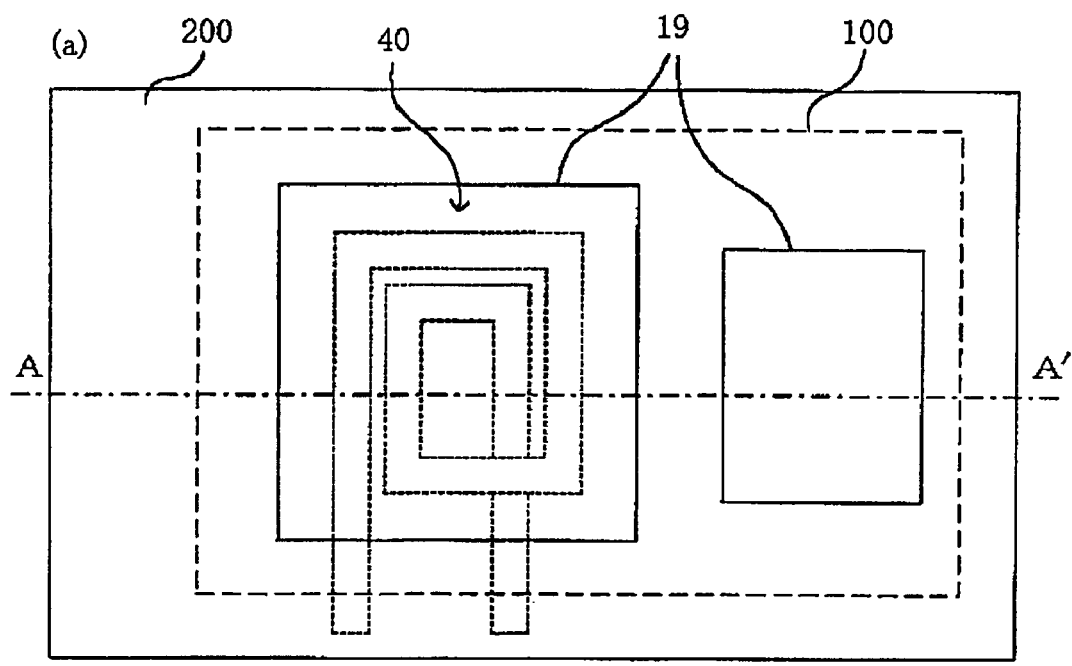
Figure 18:
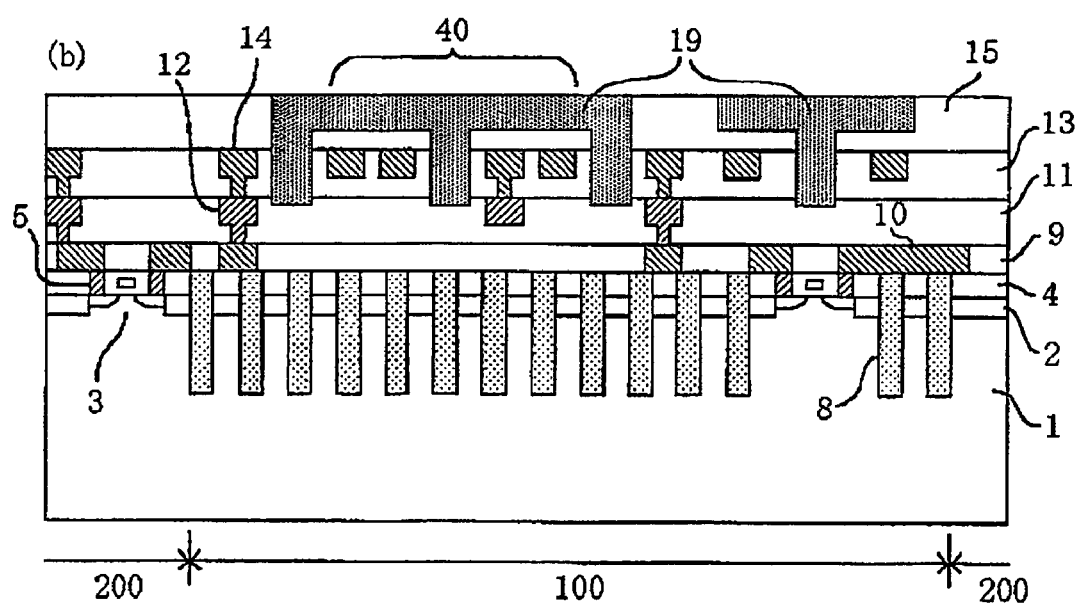

FIG. 18 includes a top plan view and a sectional view of the semiconductor device of the first example in a process step of a fabrication method thereof.

Figure 19:
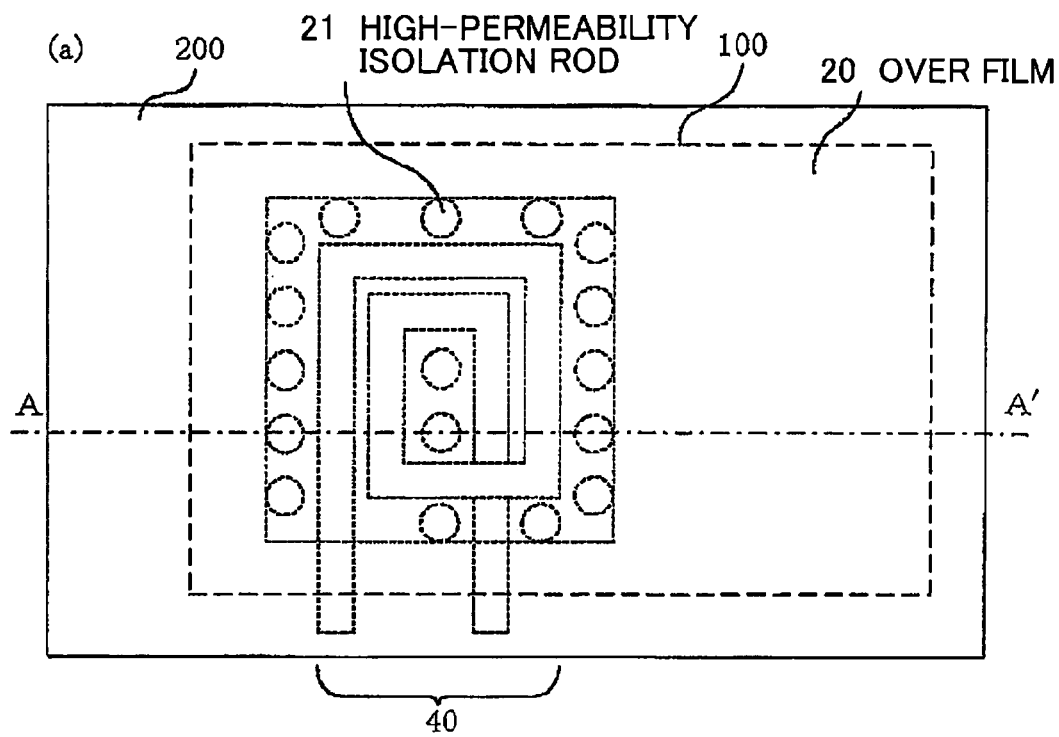
Figure 19:
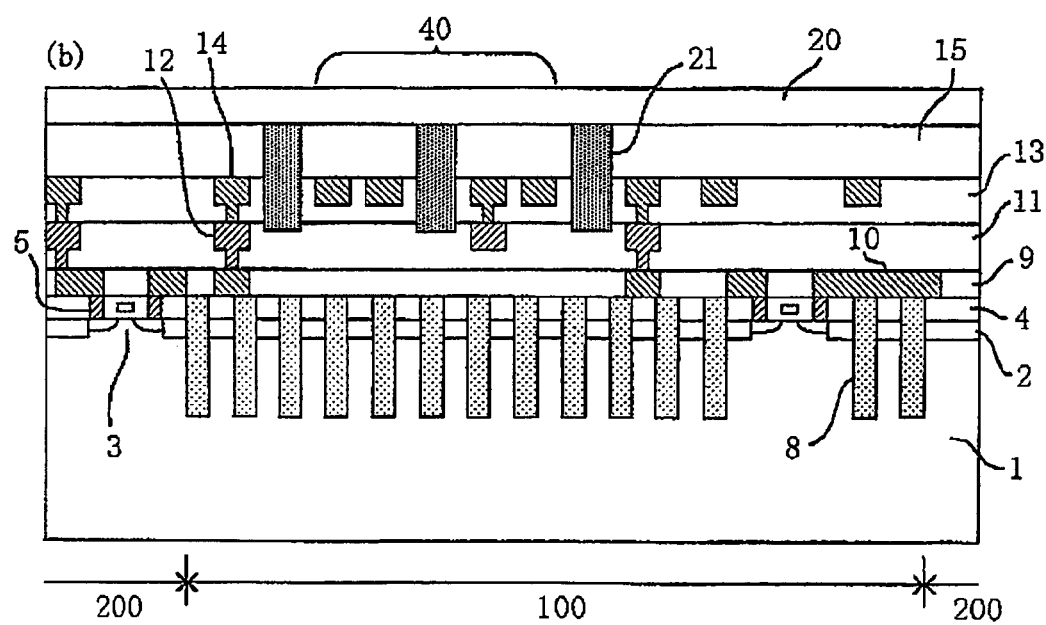

FIG. 19 includes a top plan view and a sectional view of a semiconductor device of a second example of the present invention.

Figure 20:
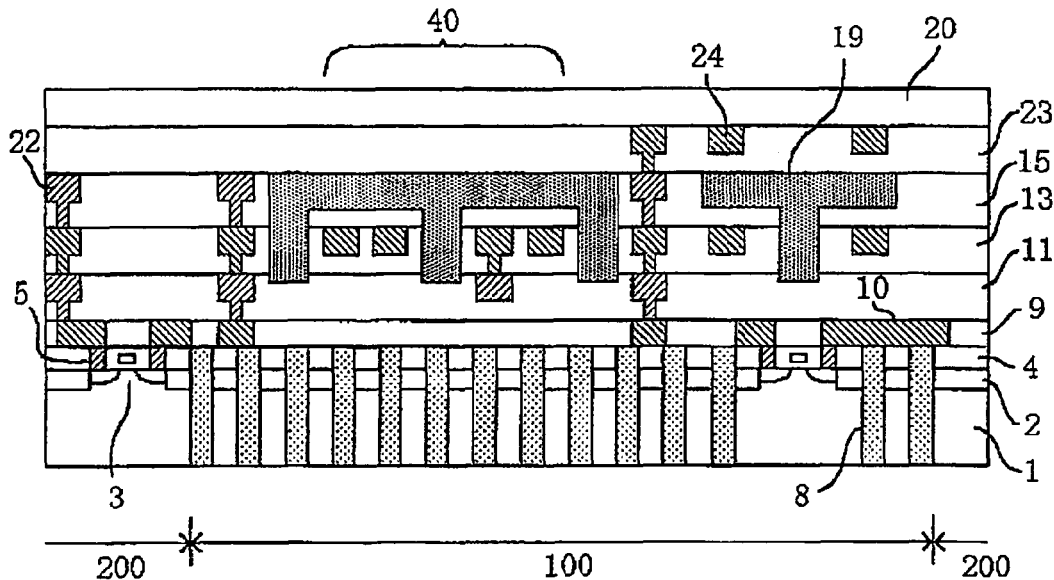

FIG. 20 includes a top plan view and a sectional view of a semiconductor device of a third example of the present invention.

Figure 21:
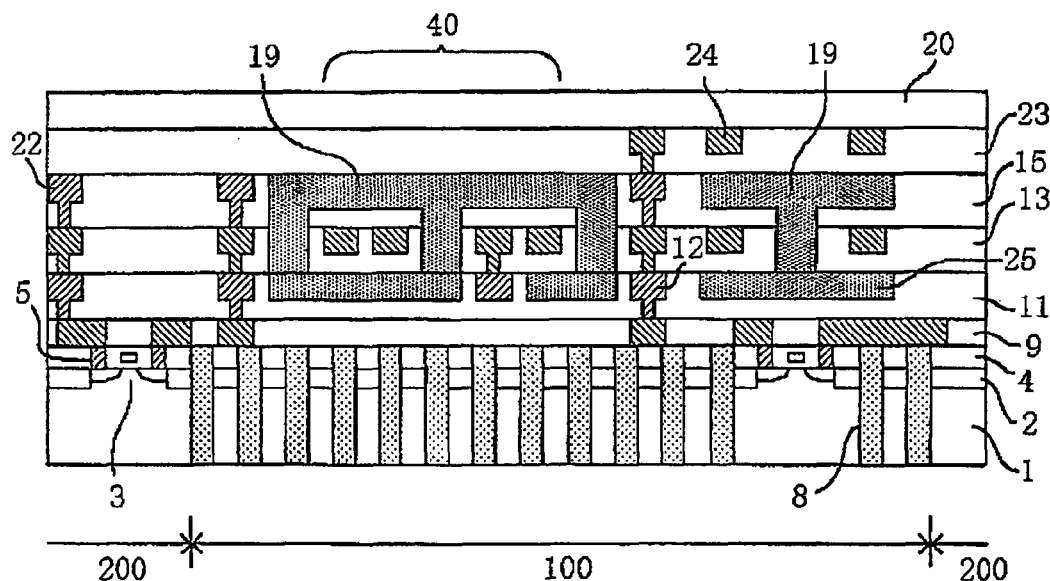

FIG. 21 includes a top plan view and a sectional view of a semiconductor device of a fourth example of the present invention.

Figure 22:
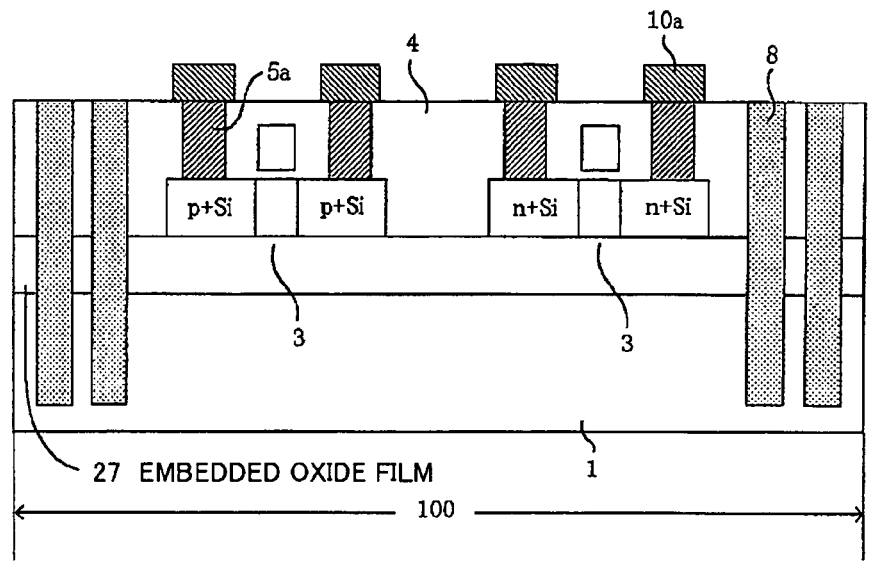

FIG. 22 includes a top plan view and a sectional view of a semiconductor device of a fifth example of the present invention.

Figure 23:
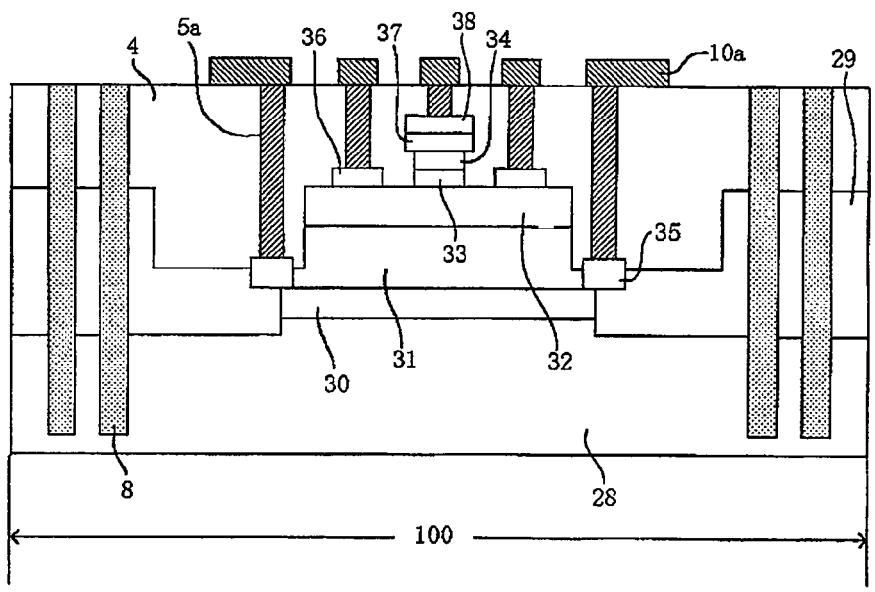

FIG. 23 includes a top plan view and a sectional view of a semiconductor device of a sixth example of the present invention.

Figure 24:
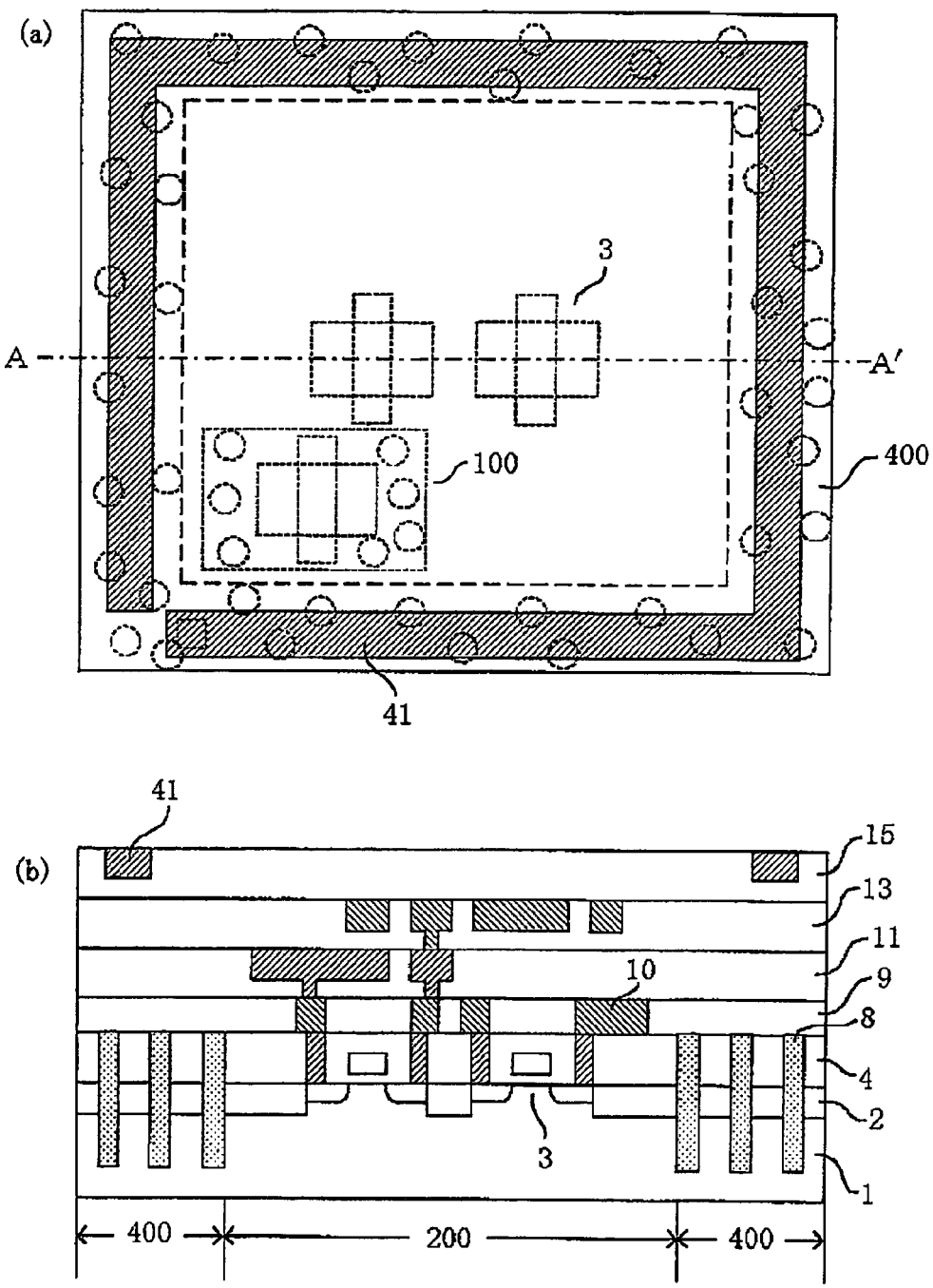

FIG. 24 includes a top plan view and a sectional view of a semiconductor device of a seventh example of the present invention.

Figure 25:
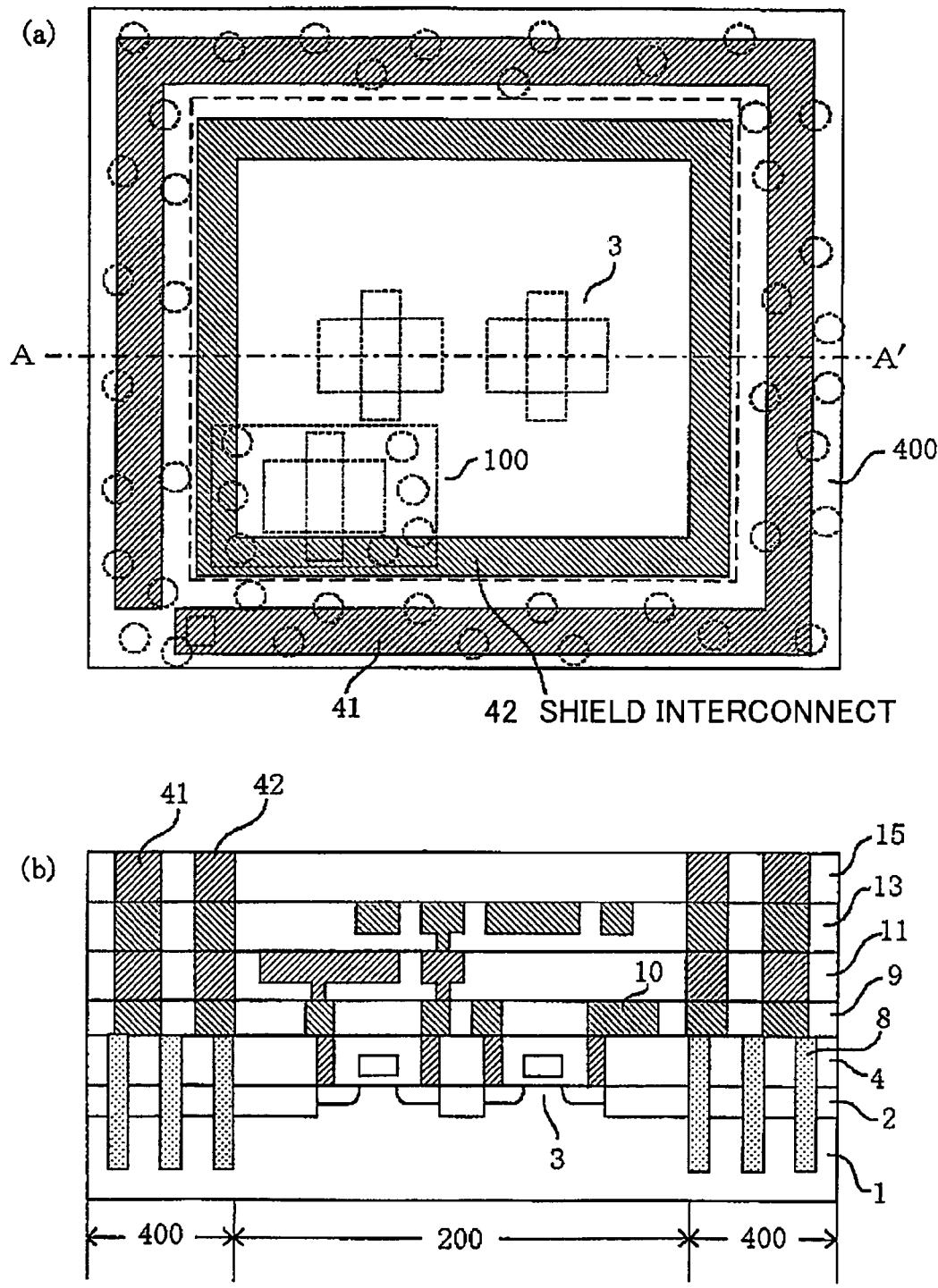

FIG. 25 includes a top plan view and a sectional view of a semiconductor device of an eighth example of the present invention.

Figure 26:
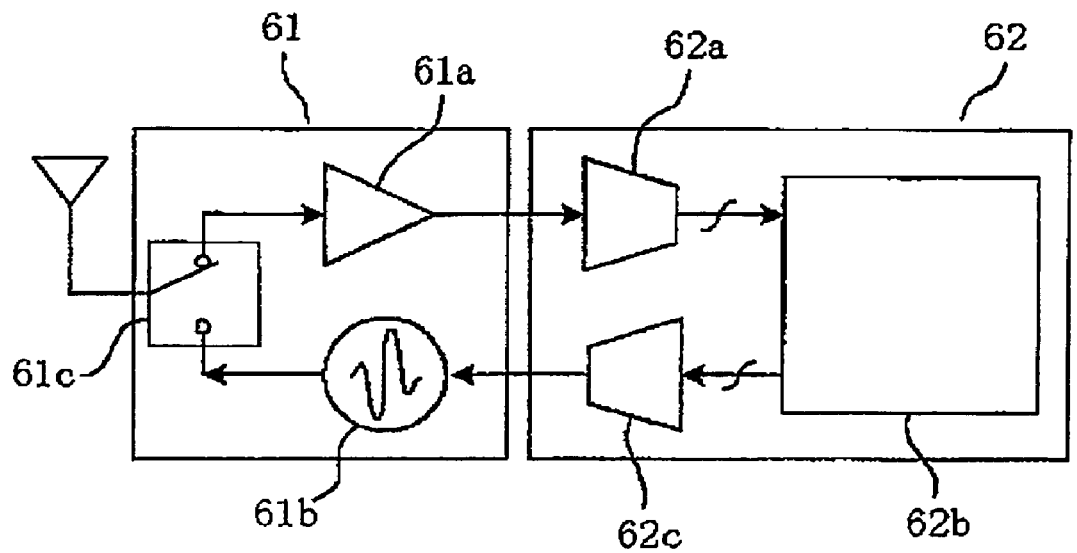

FIG. 26 is a block diagram of a typical semiconductor chip including a transmission/reception function.

Figure 27:
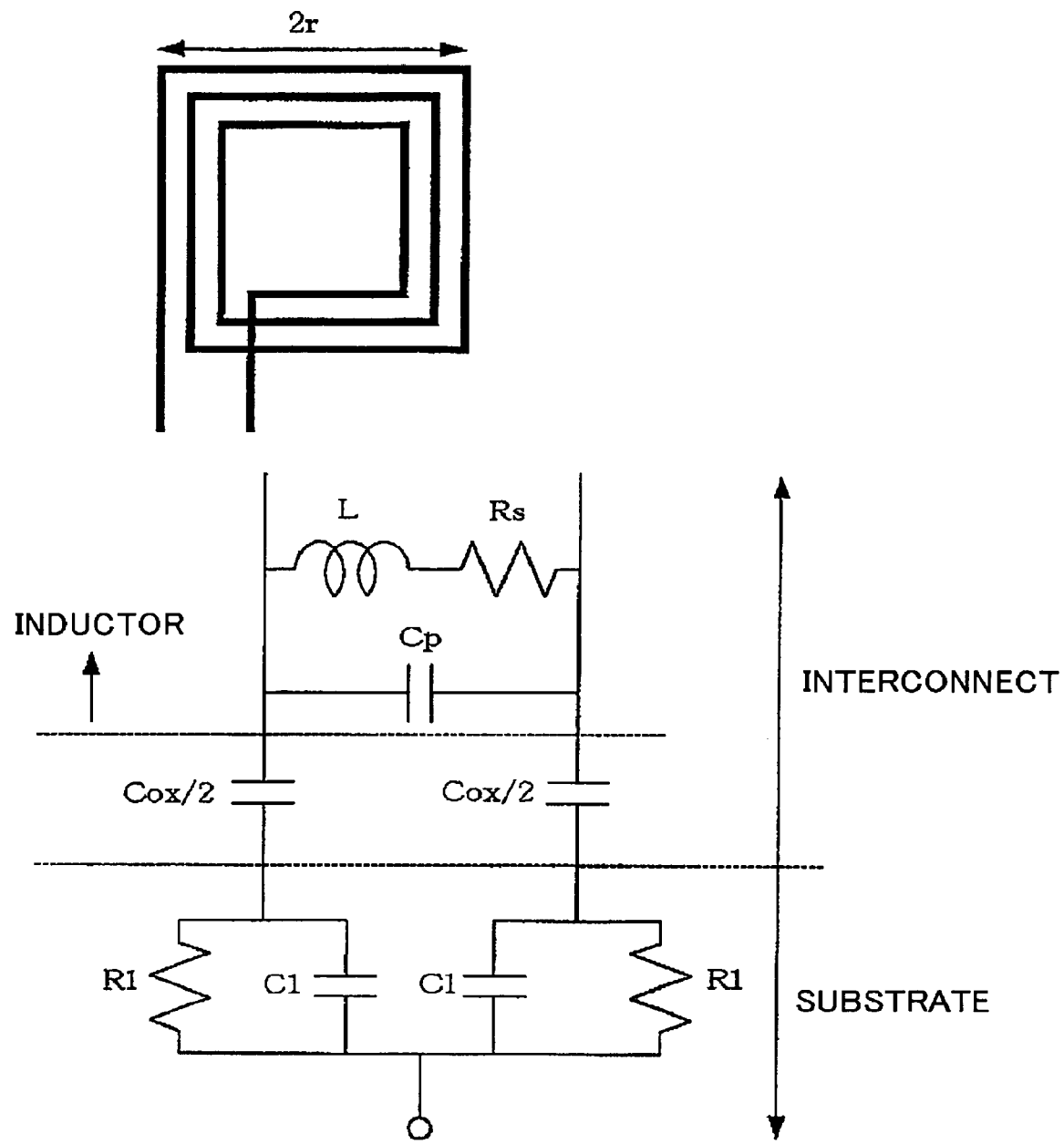

FIG. 27 includes a top plan view and an equivalent circuit diagram of an inductor formed on a semiconductor substrate.

Figure 28:
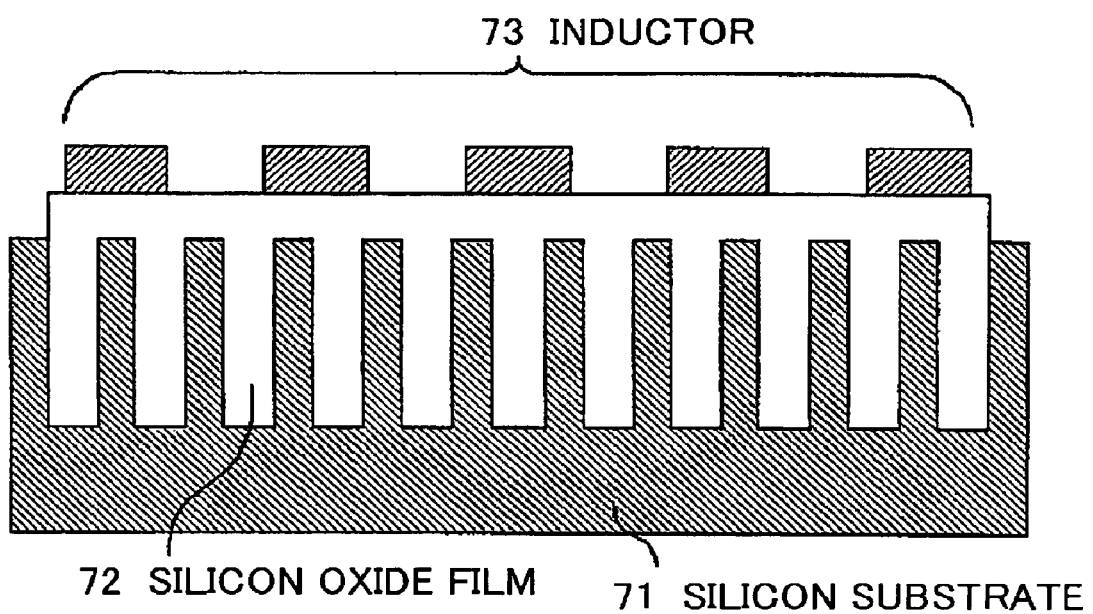

FIG. 28 is a sectional view of a first conventional technique.

Figure 29:
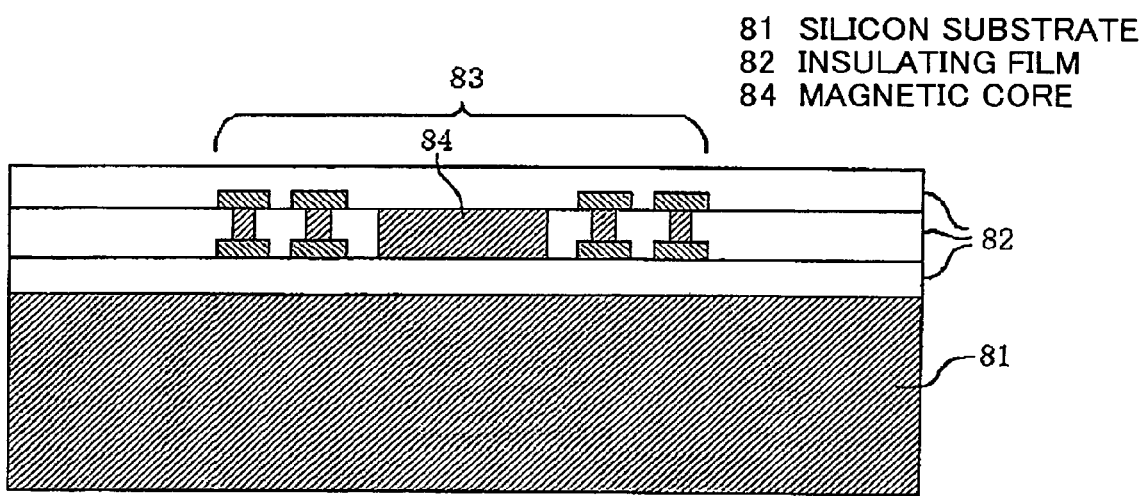

FIG. 29 is a sectional view of a second conventional technique.

Figure 30:
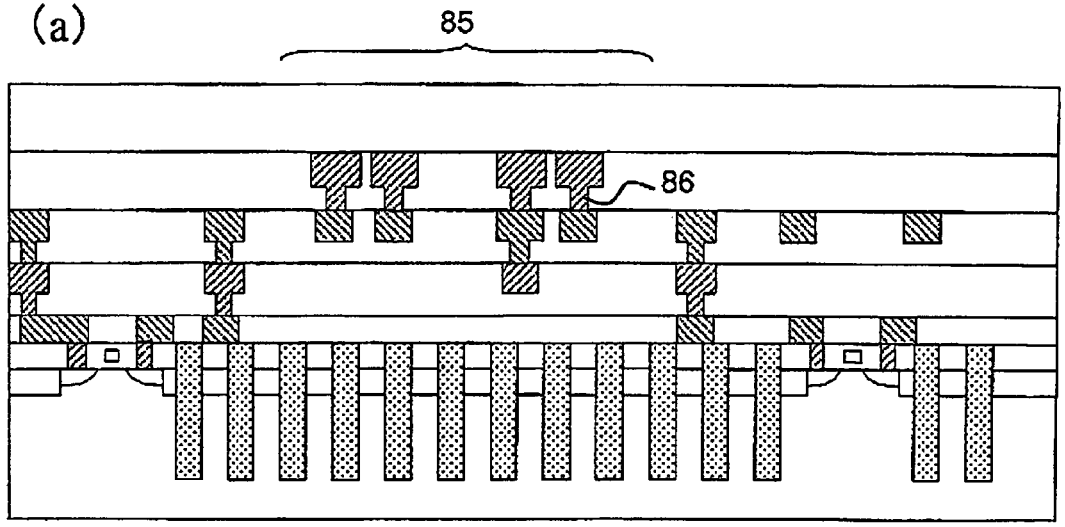
Figure 30:
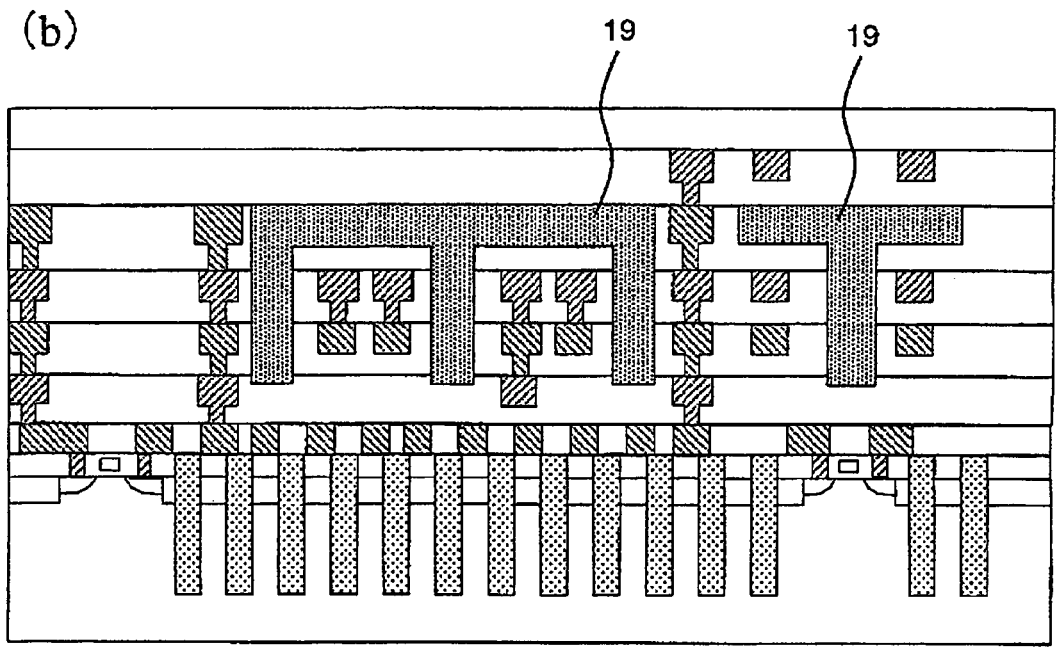

FIG. 30 is a sectional view showing a fifth embodiment of the present invention.

Figure 31:
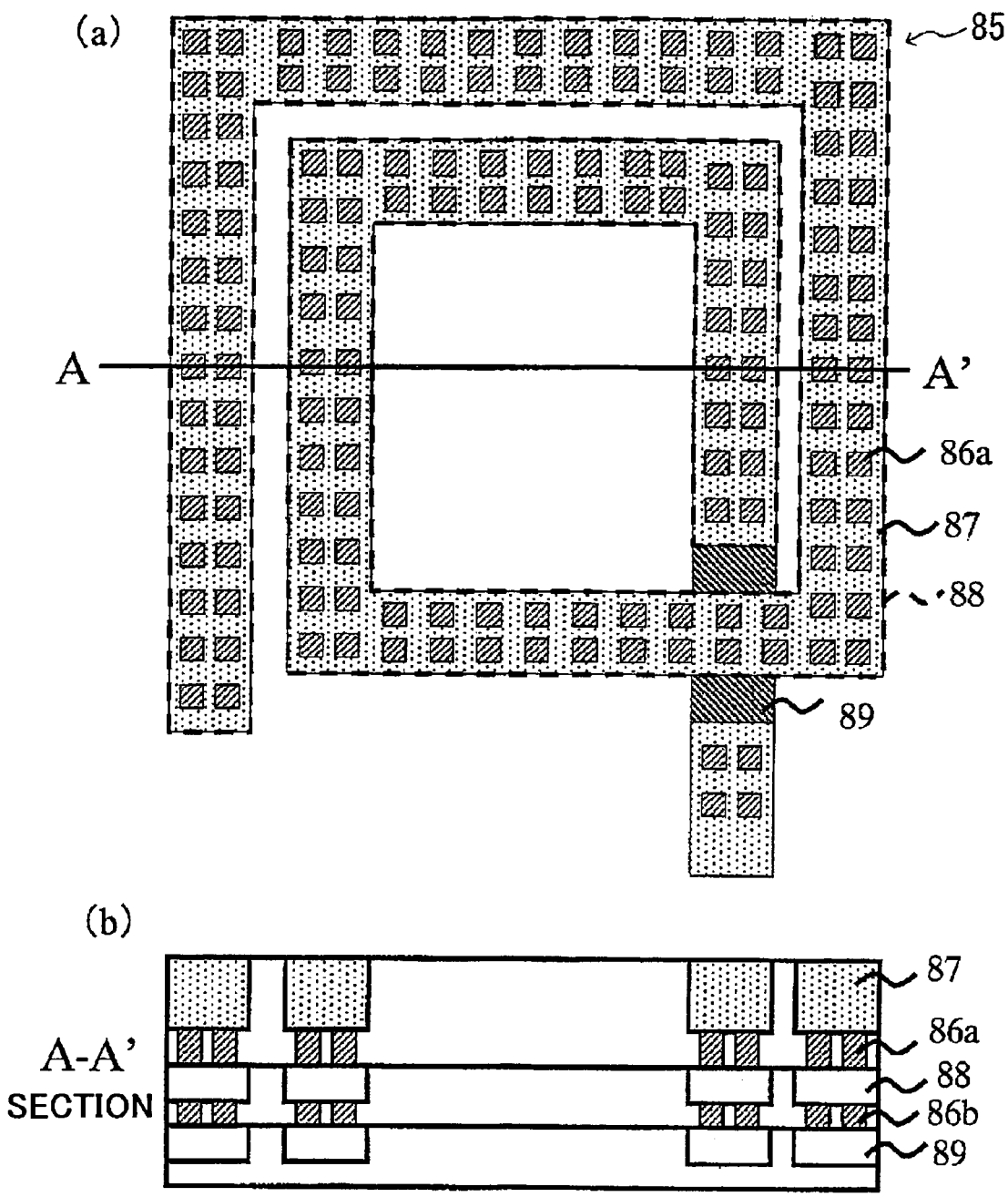

FIG. 31 is a top plan view showing that a plurality of interconnect layers are connected in parallel through via-plugs.

Figure 32:
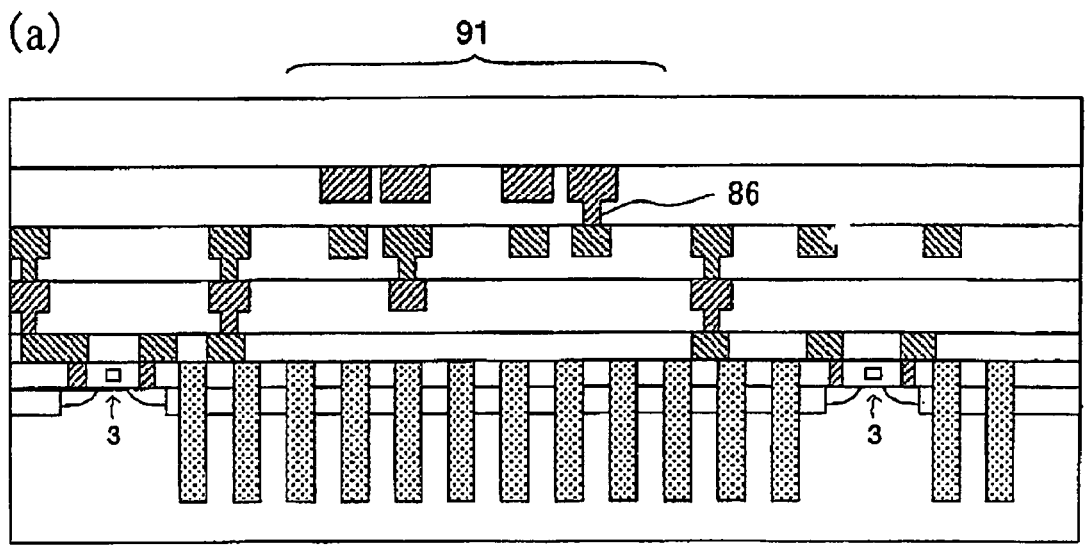
Figure 32:
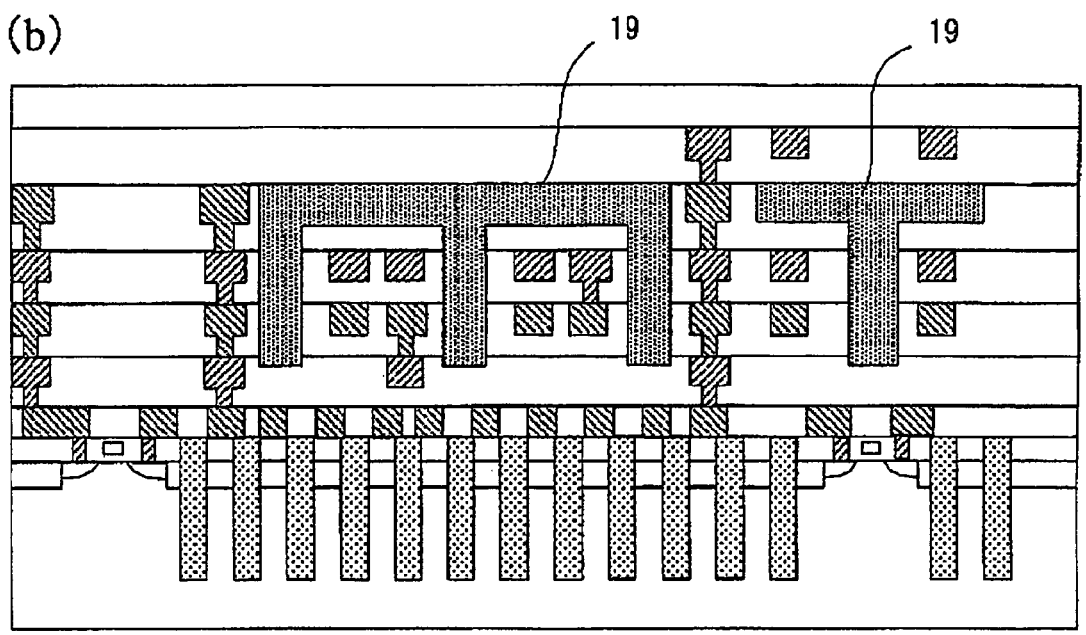

FIG. 32 is a sectional view showing a sixth embodiment of the present invention.

Figure 33:
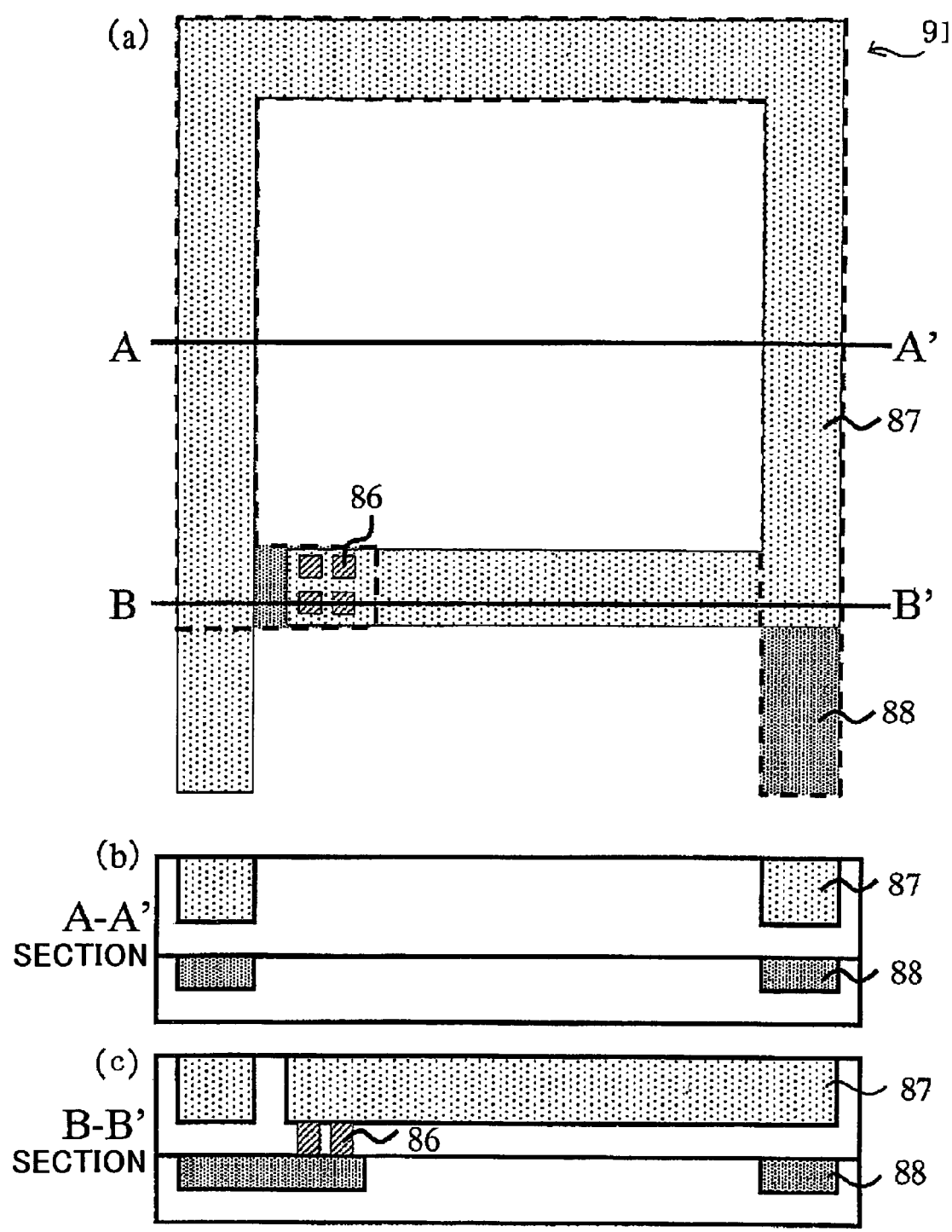

FIG. 33 is a top plan view showing that ends of a plurality of interconnect layers are connected electrically in series through via-plugs.

Figure 34:
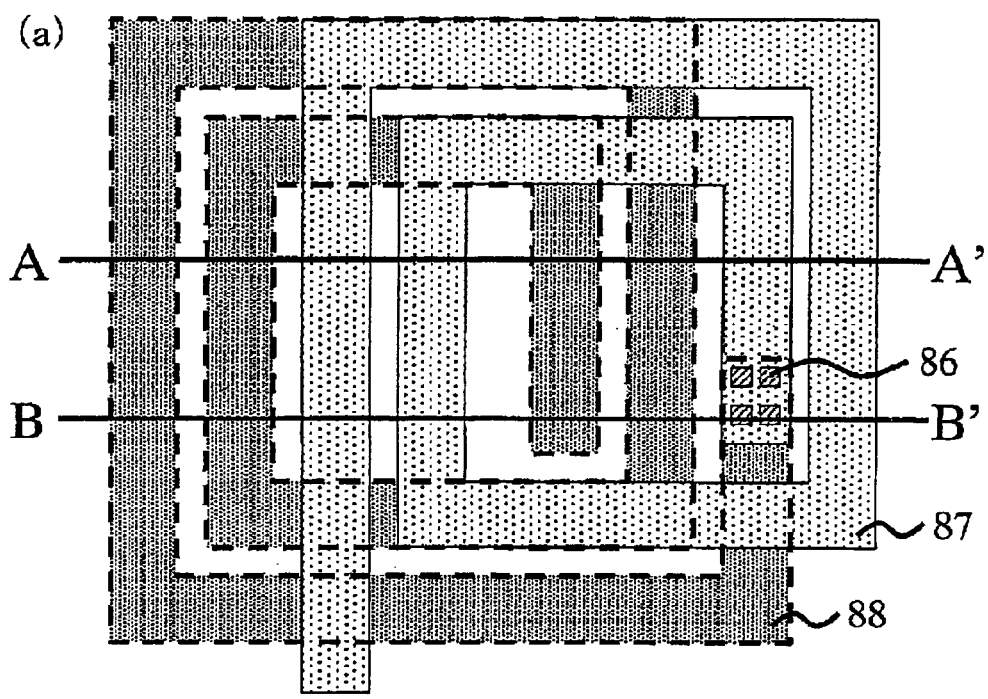
Figure 34:
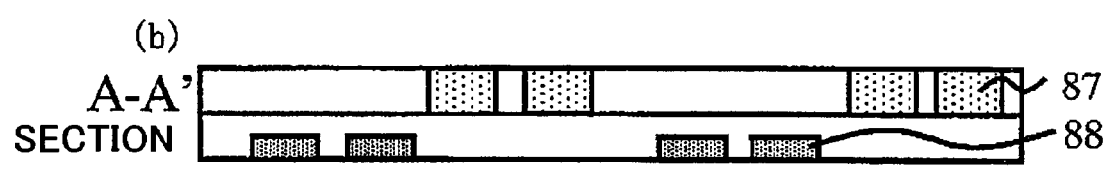
Figure 34:
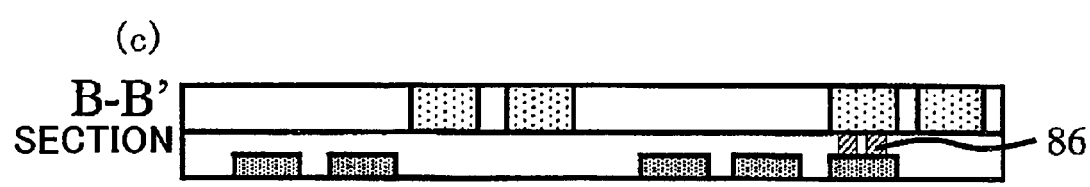

FIG. 34 is a top plan view showing that ends of a plurality of interconnect layers are connected electrically in series through via-plugs.

Figure 35:
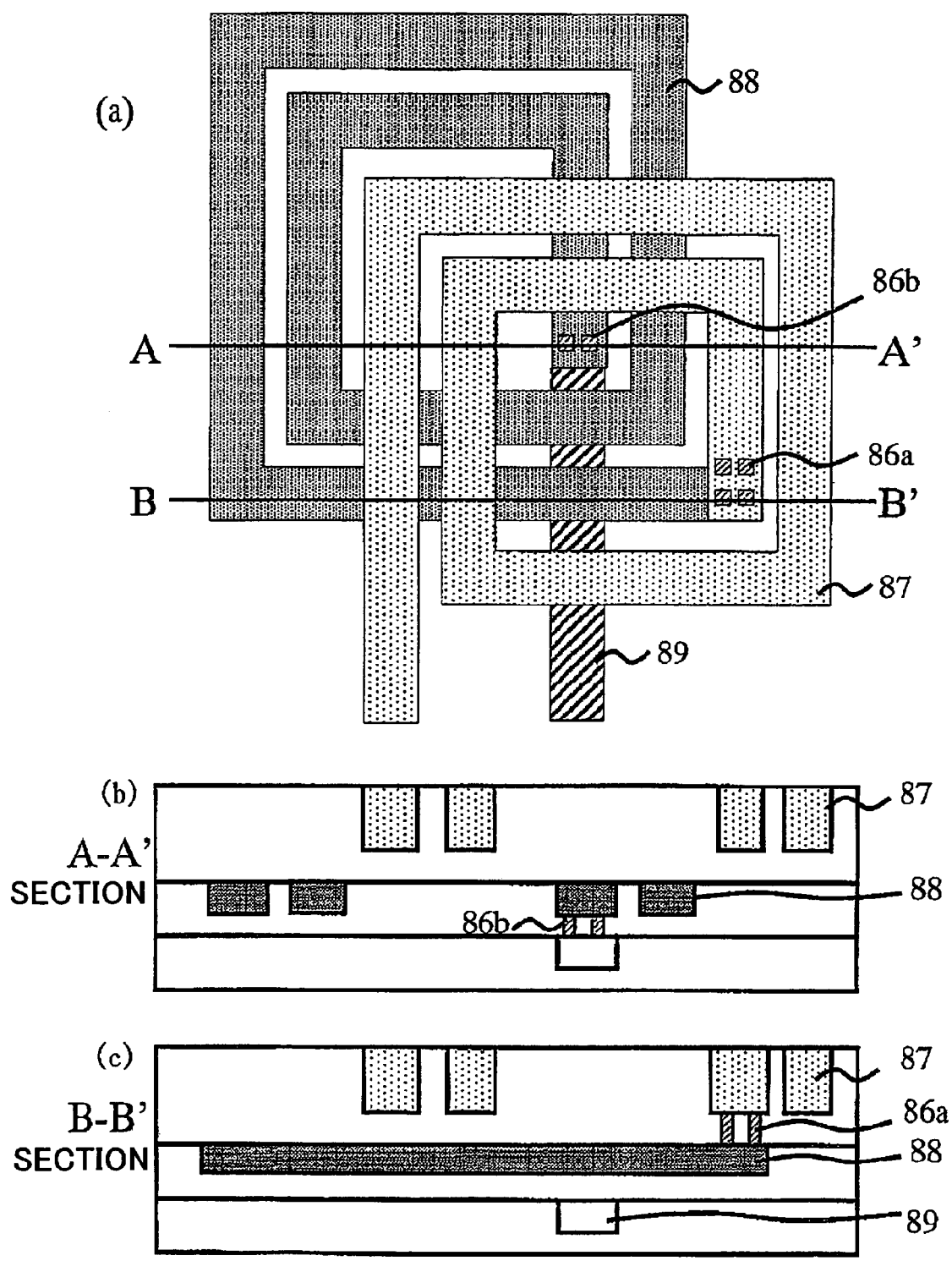

FIG. 35 includes a top plan view and a sectional view showing that ends of a plurality of interconnect layers are connected electrically in series through via-plugs.

Figure 36:
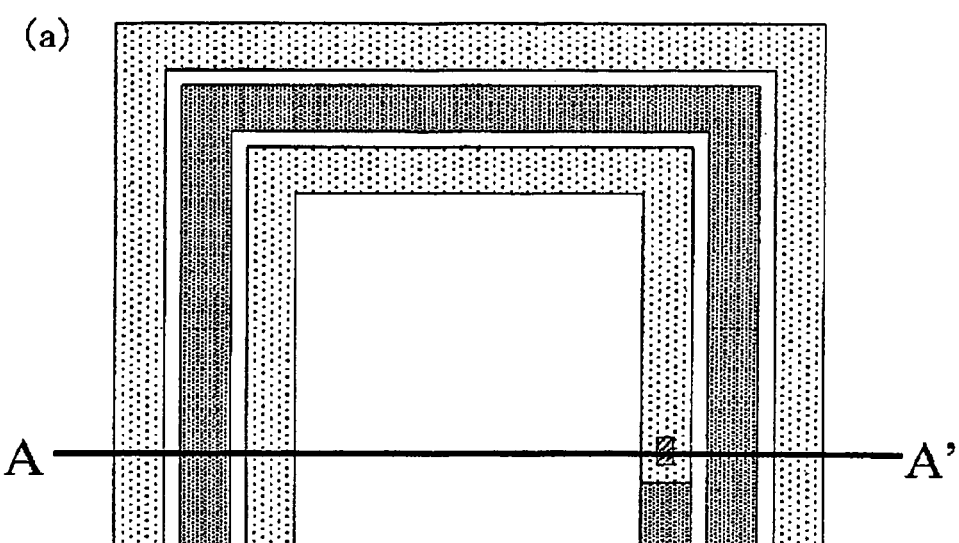
Figure 36:
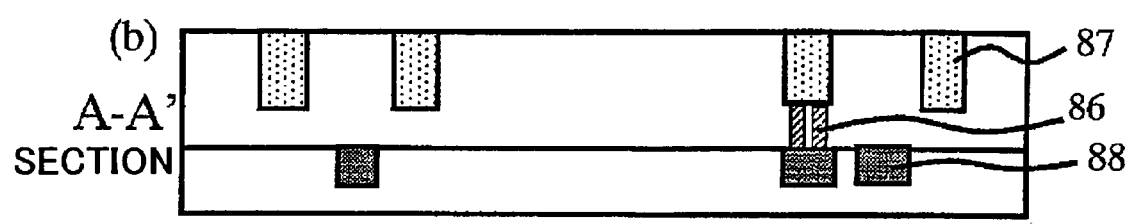

FIG. 36 includes a top plan view and a sectional view showing that ends of a plurality of interconnect layers are connected electrically in series through via-plugs.

Figure 37:
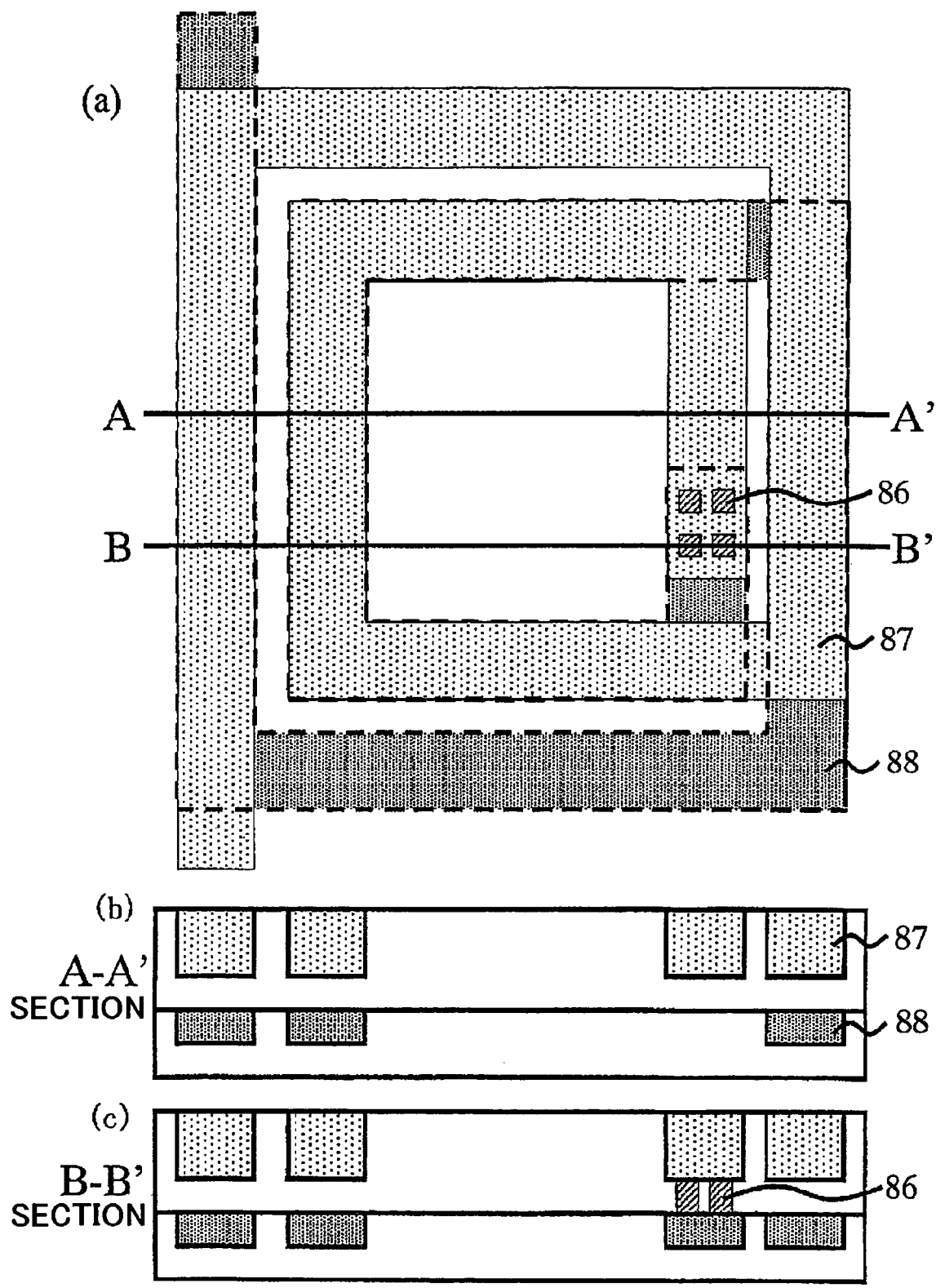

FIG. 37 includes a top plan view and a sectional view showing that ends of a plurality of interconnect layers are connected electrically in series through via-plugs.

Figure 38:
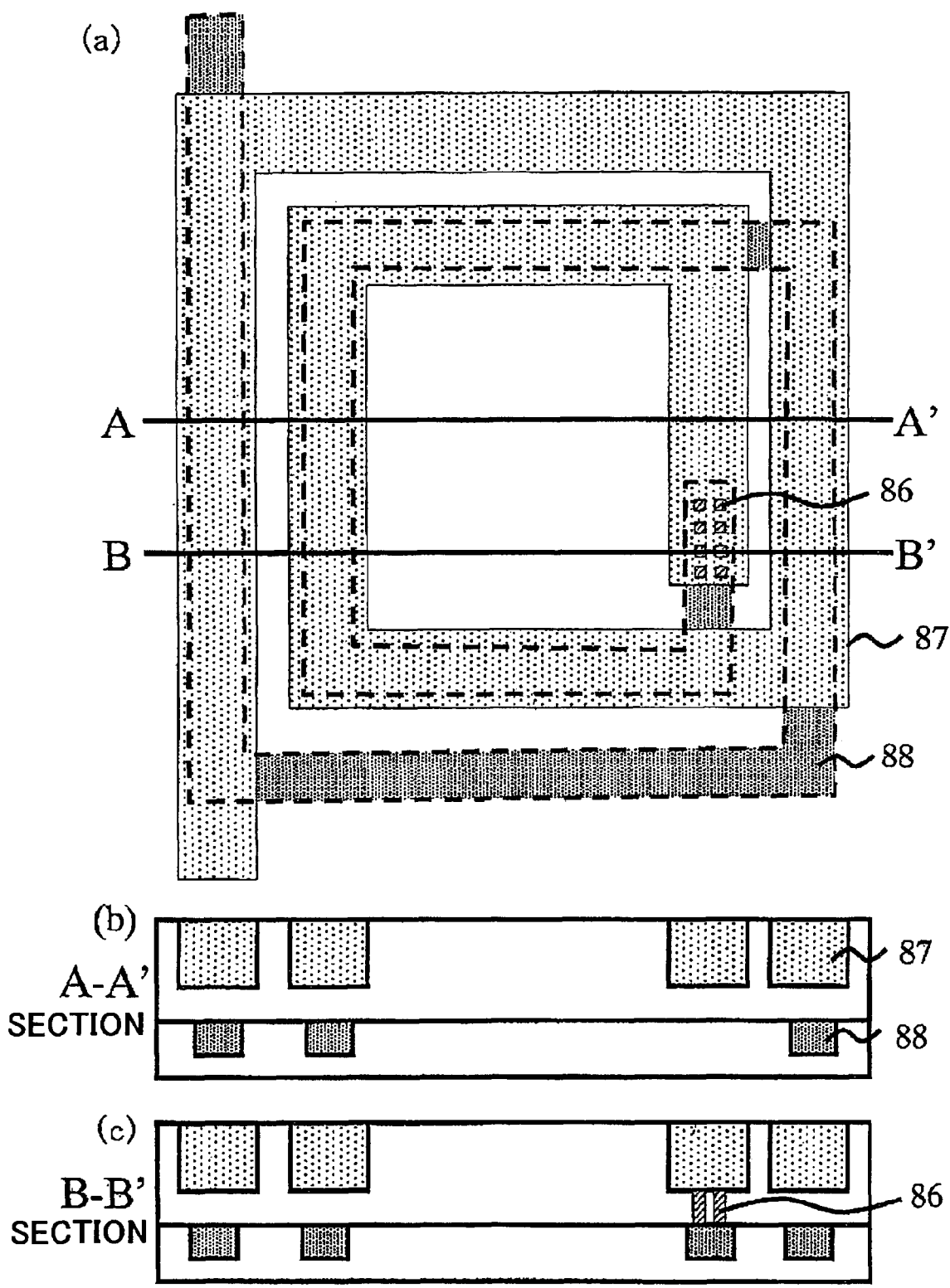

FIG. 38 includes a top plan view and a sectional view showing that ends of a plurality of interconnect layers are connected electrically in series through via-plugs.

Figure 39:
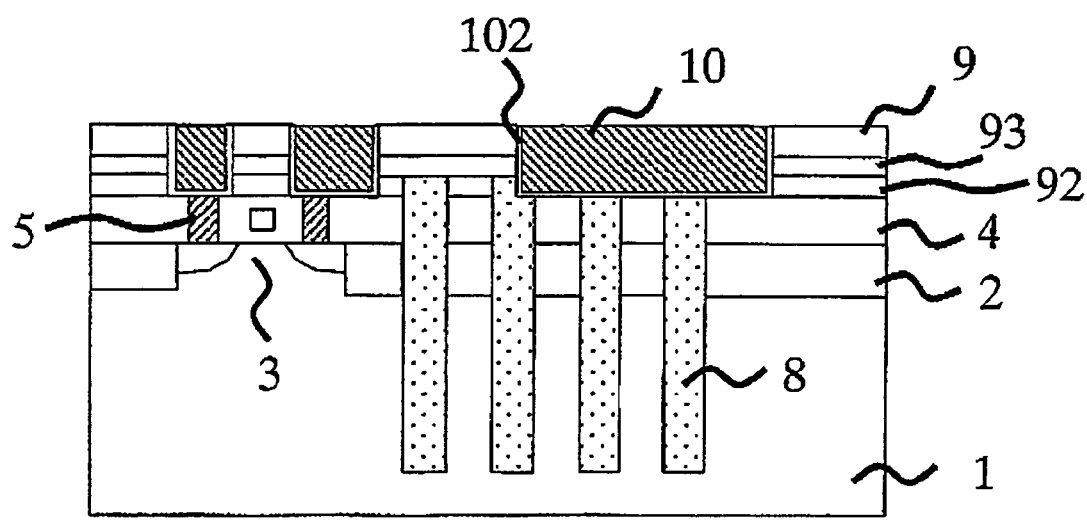

FIG. 39 is a sectional view according to a seventh embodiment of the present invention.

Figure 40:
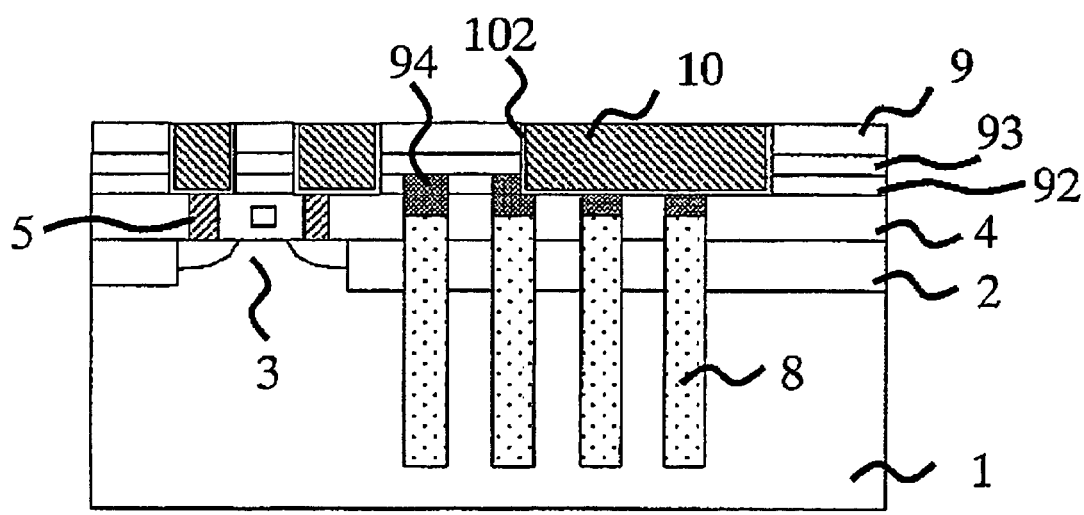

FIG. 40 is a sectional view according to an eighth seventh embodiment of the present invention.

Figure 41:
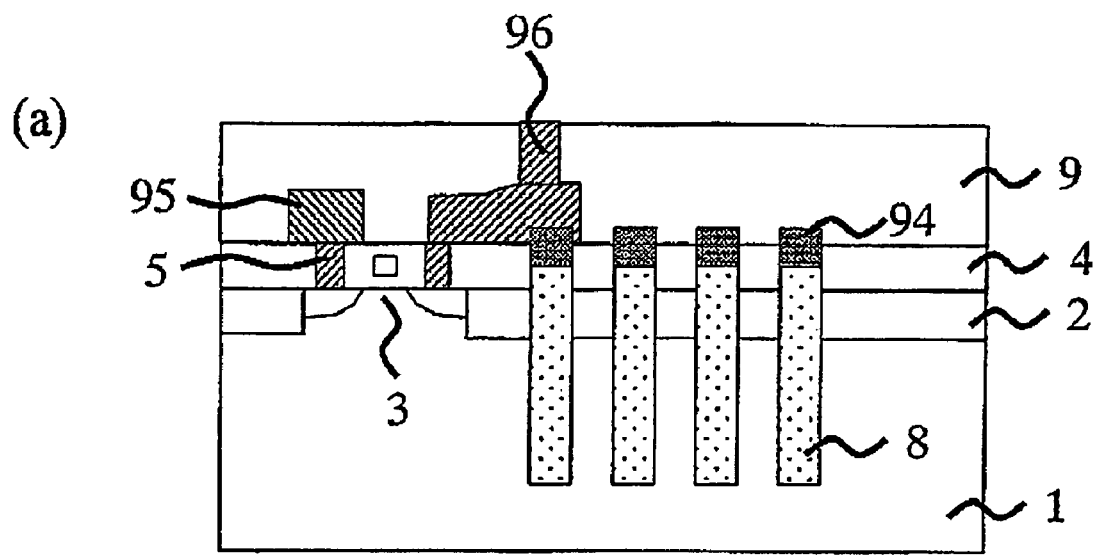
Figure 41:
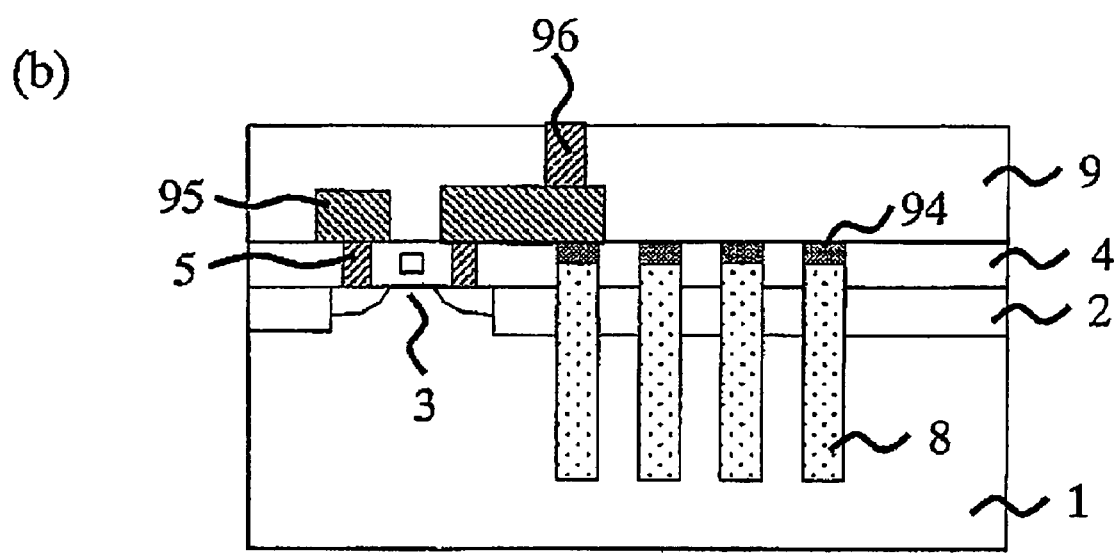

FIG. 41 is a sectional view according to a ninth embodiment of the present invention.

Figure 42:
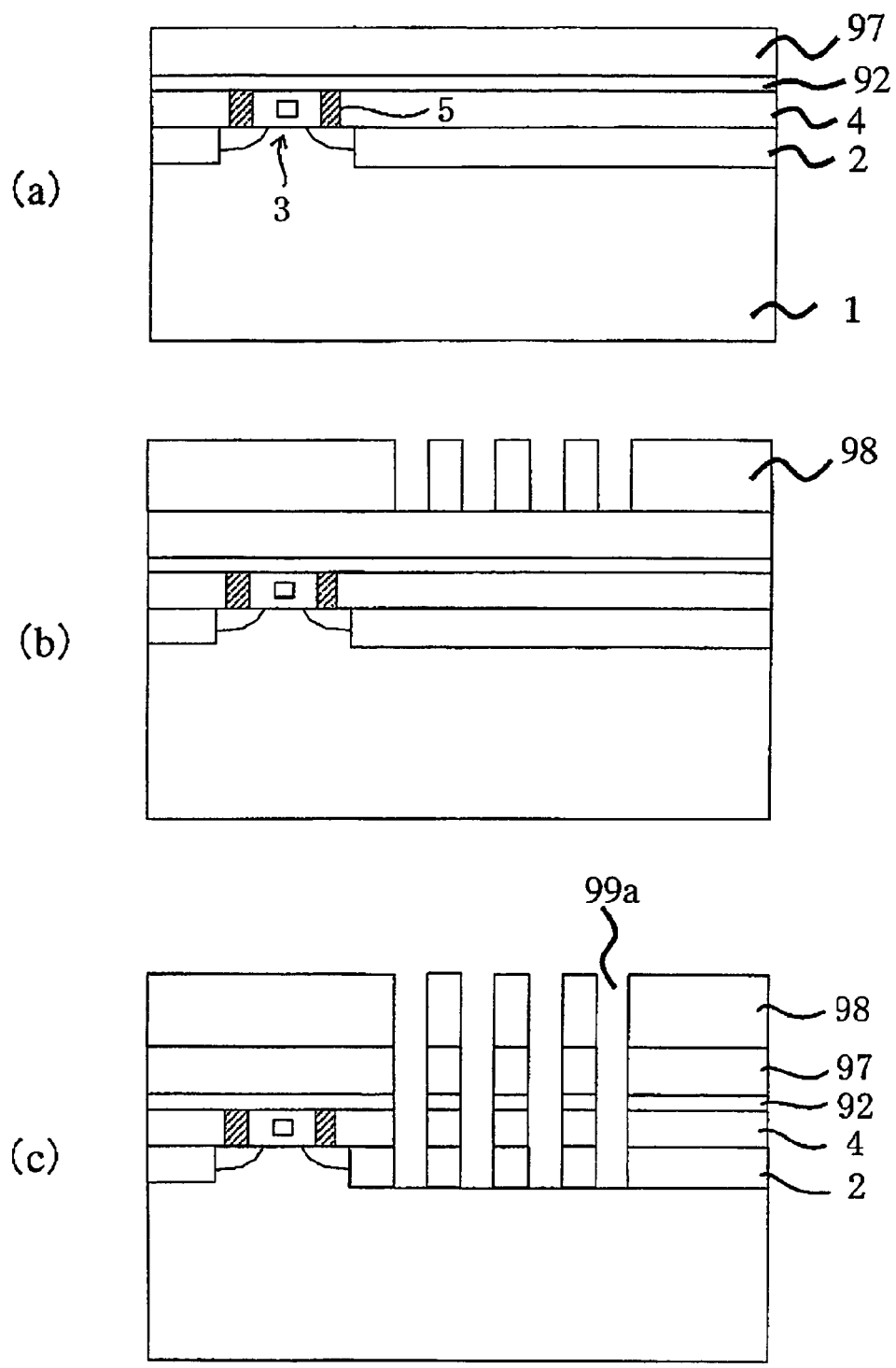

FIG. 42 is a sectional view of a fabrication step for the seventh embodiment of the present invention.

Figure 43:
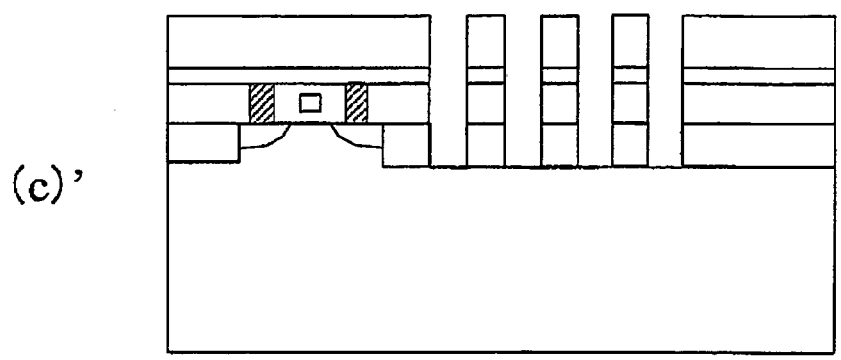
Figure 43:
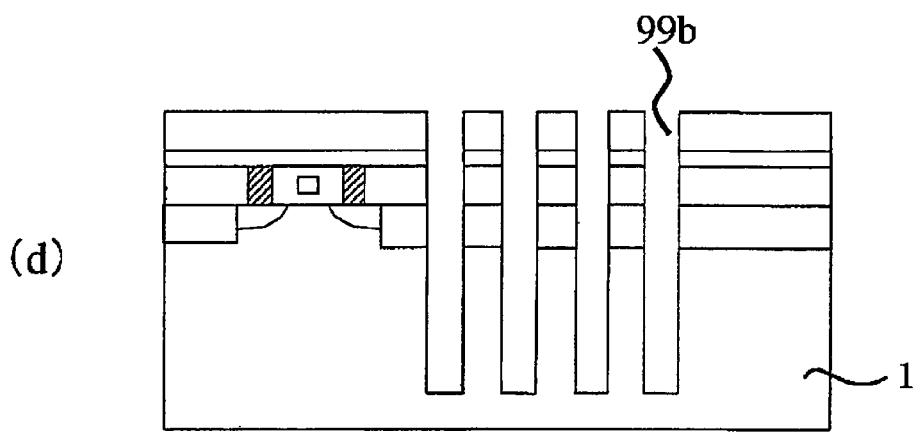
Figure 43:
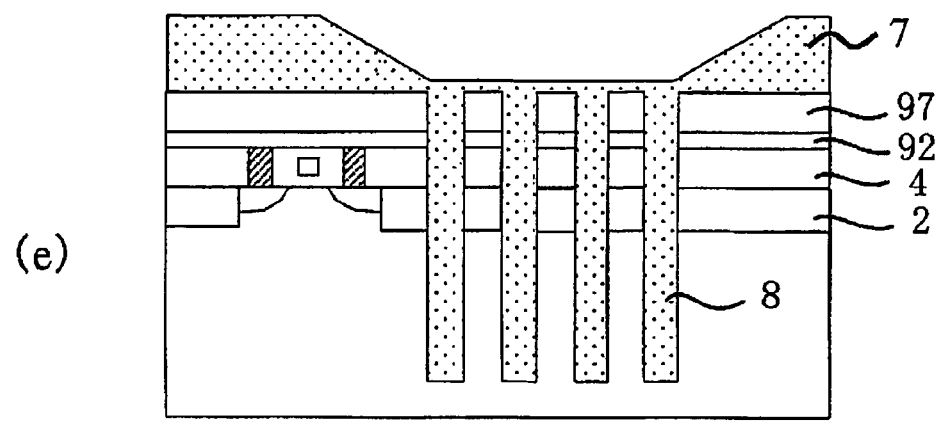

FIG. 43 is a sectional view of a fabrication step for the seventh embodiment of the present invention.

Figure 44:
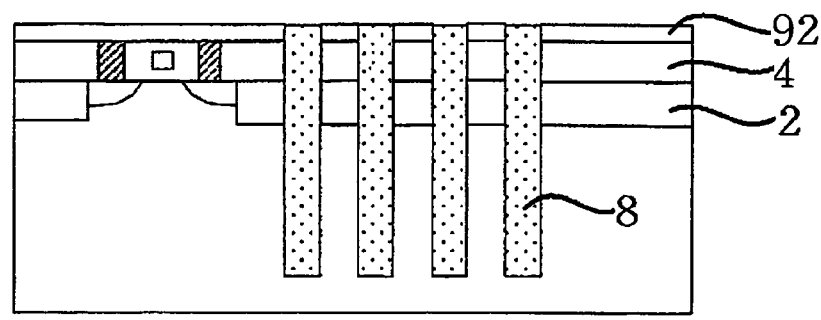
Figure 44:
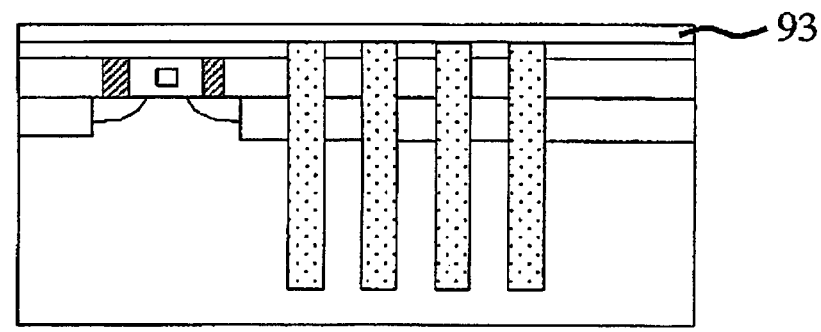
Figure 44:
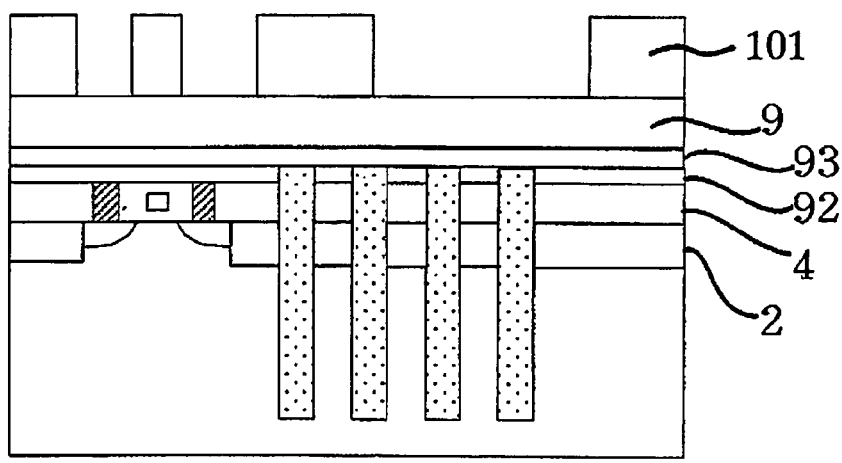

FIG. 44 is a sectional view of a fabrication step for the seventh embodiment of the present invention.

Figure 45:
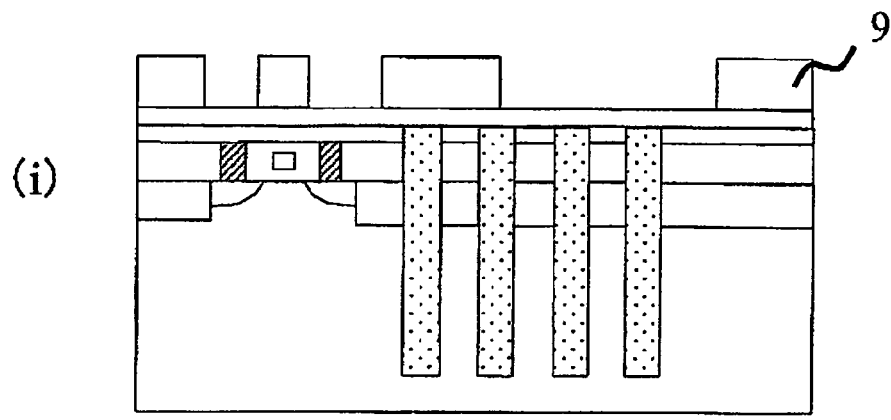
Figure 45:
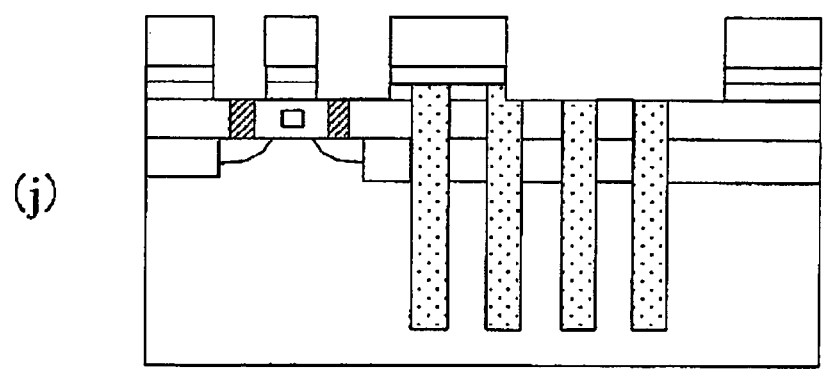
Figure 45:
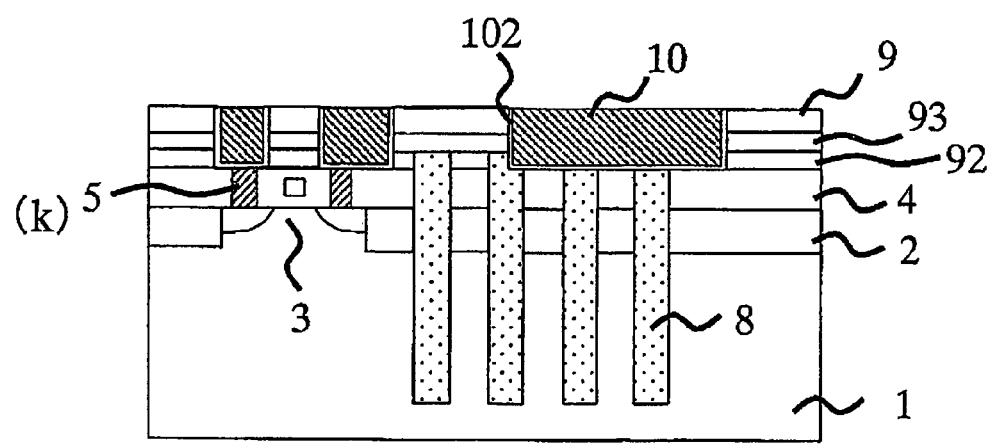

FIG. 45 is a sectional view of a fabrication step for the seventh embodiment of the present invention.

Figure 46:
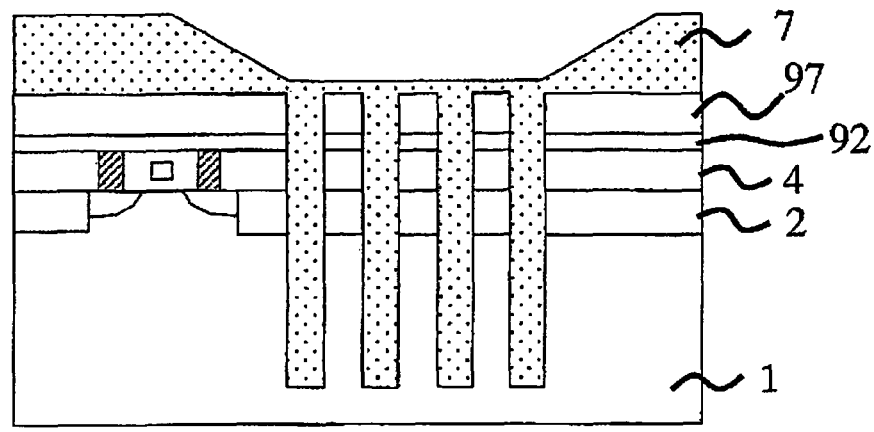
Figure 46:
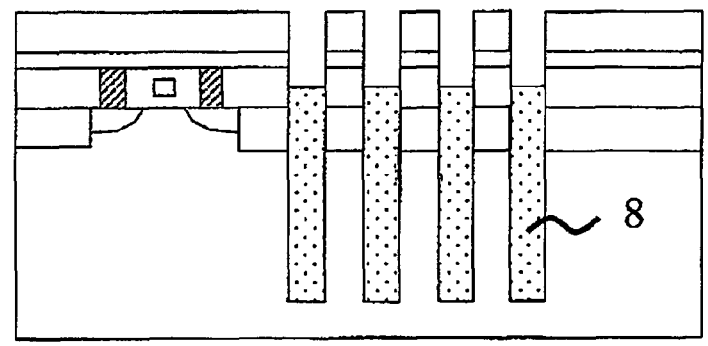
Figure 46:
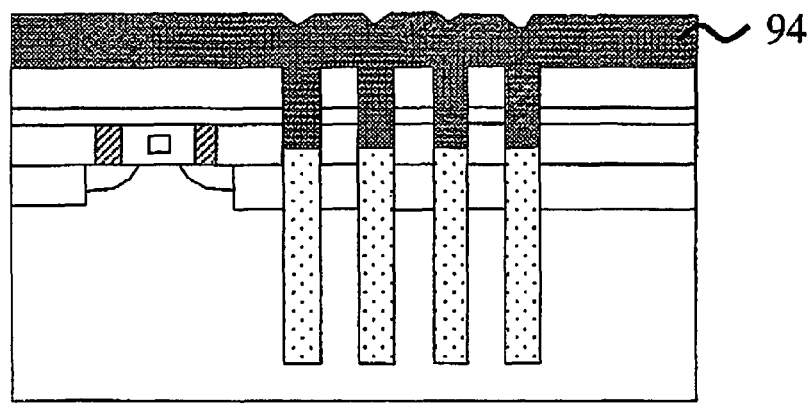

FIG. 46 is a sectional view of a fabrication step for the eighth embodiment of the present invention.

Figure 47:
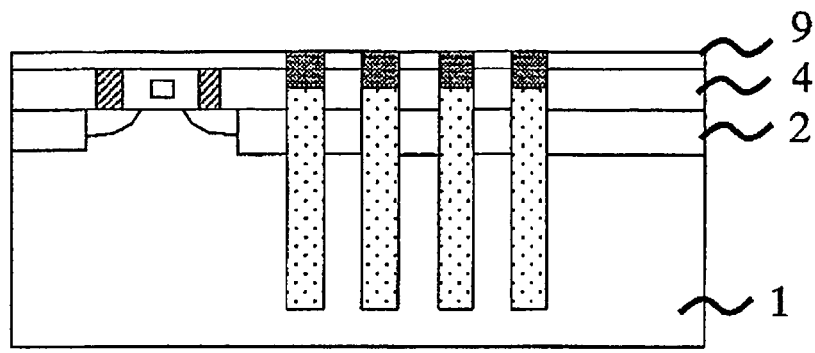
Figure 47:
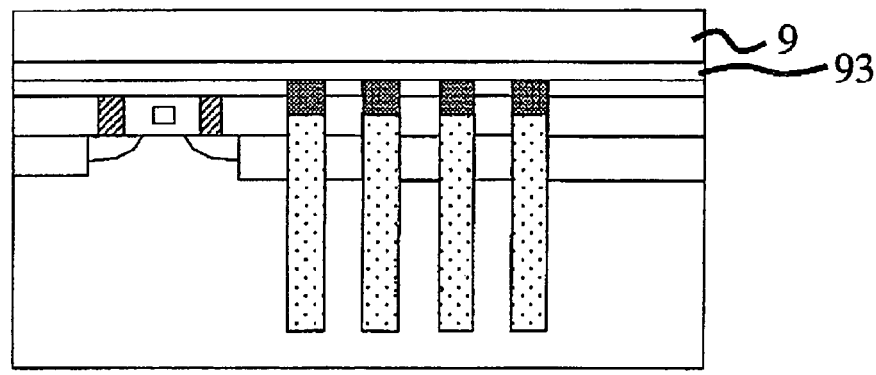
Figure 47:
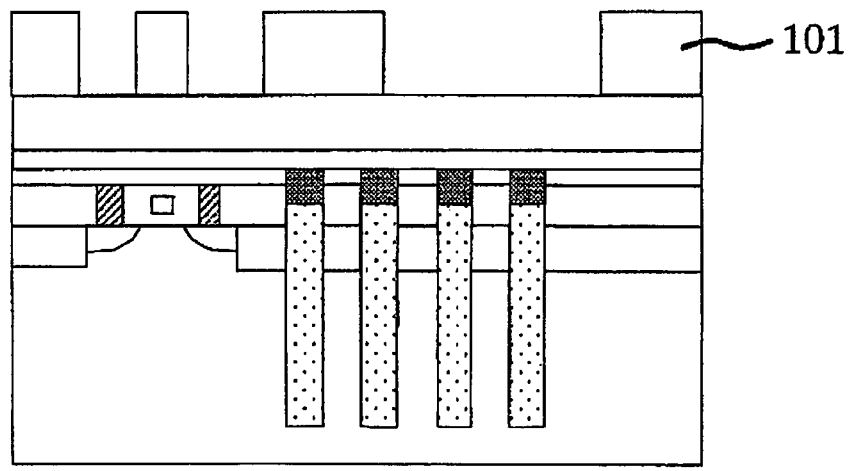

FIG. 47 is a sectional view of a fabrication step for the eighth embodiment of the present invention.

Figure 48:
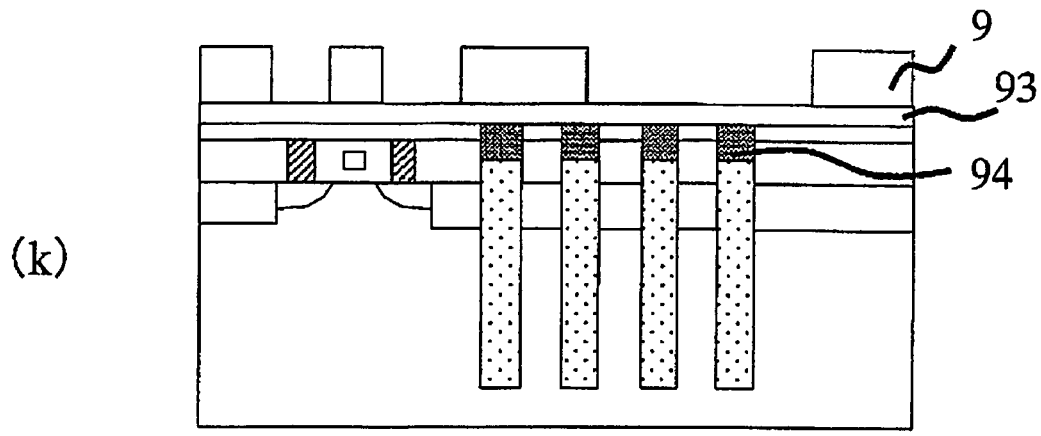
Figure 48:
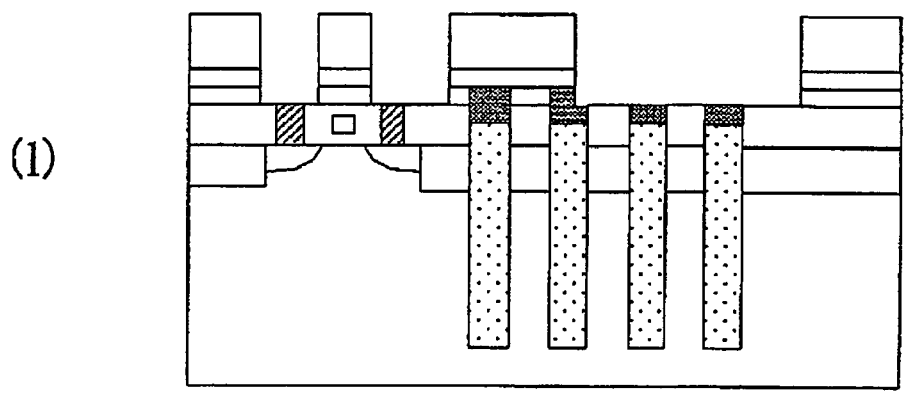
Figure 48:
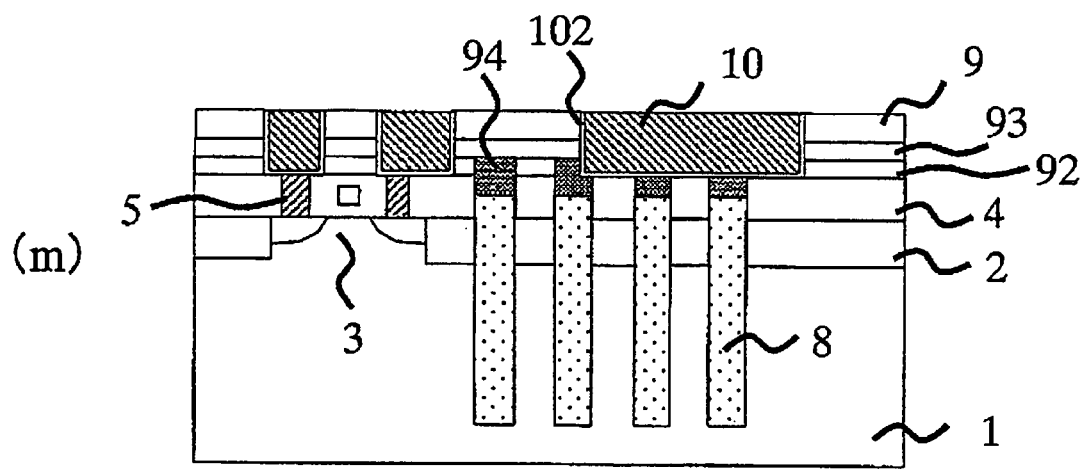

FIG. 48 is a sectional view of a fabrication step for the eighth embodiment of the present invention.

Figure 49:
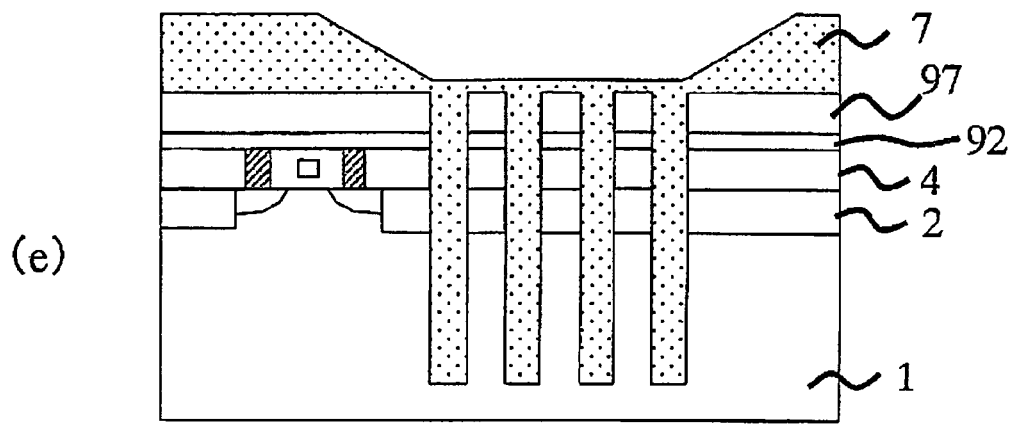
Figure 49:
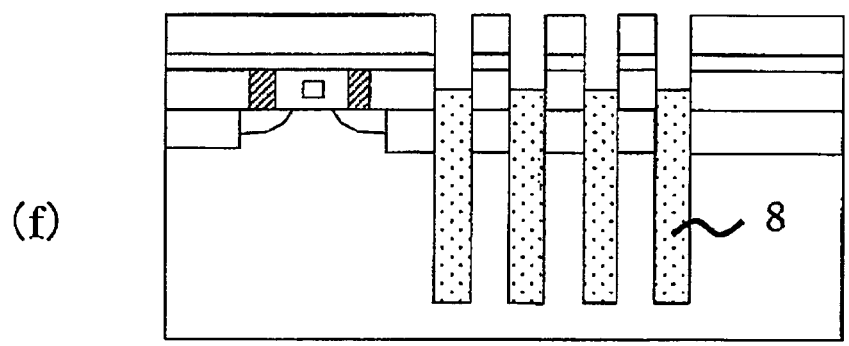
Figure 49:
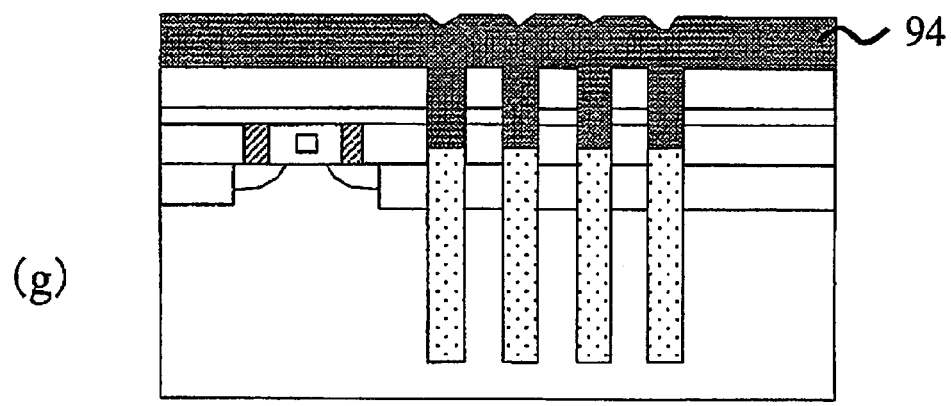

FIG. 49 is a sectional view of a fabrication step for the ninth embodiment of the present invention.

Figure 50:
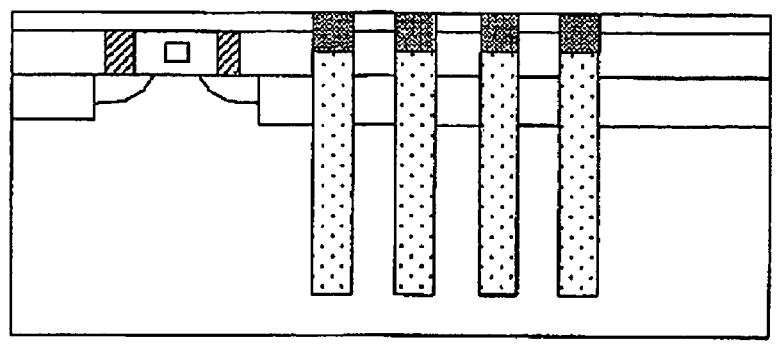
Figure 50:
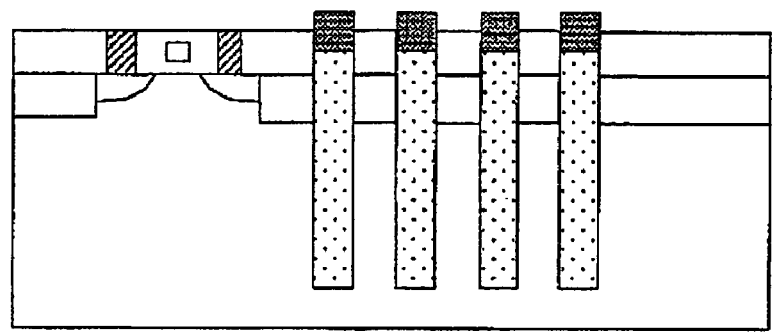
Figure 50:
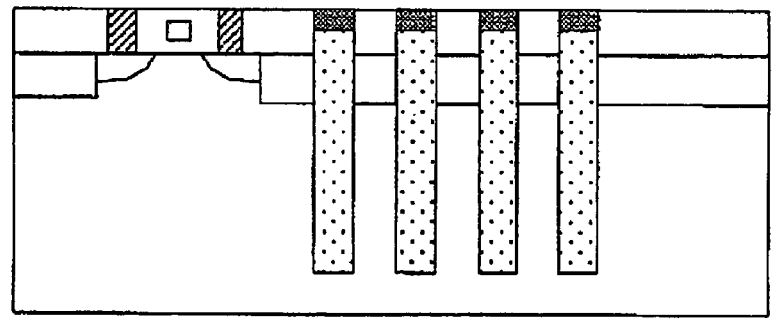

FIG. 50 is a sectional view of a fabrication step for the ninth embodiment of the present invention.

Figure 51:
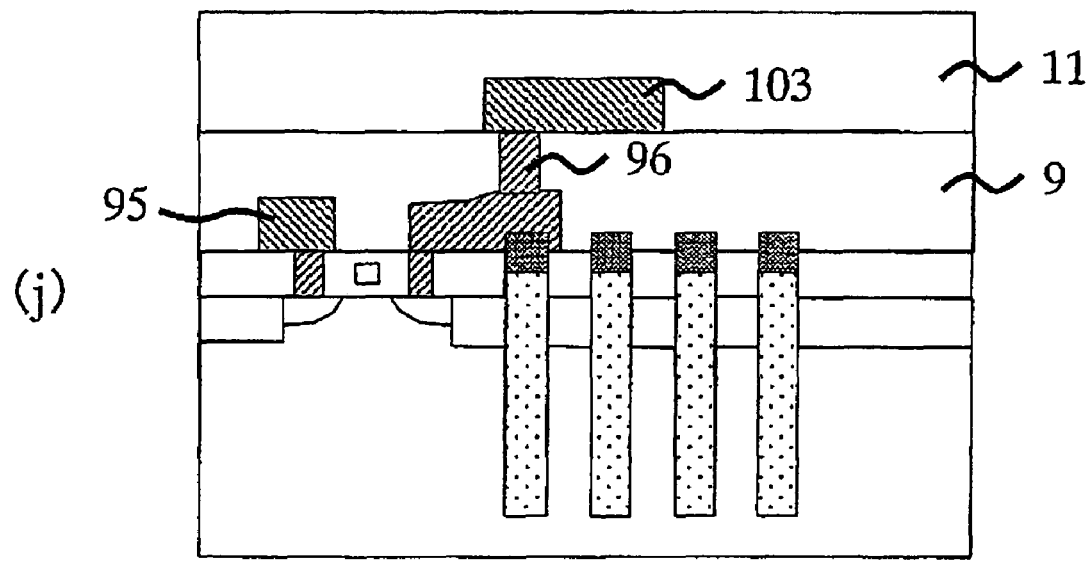
Figure 51:
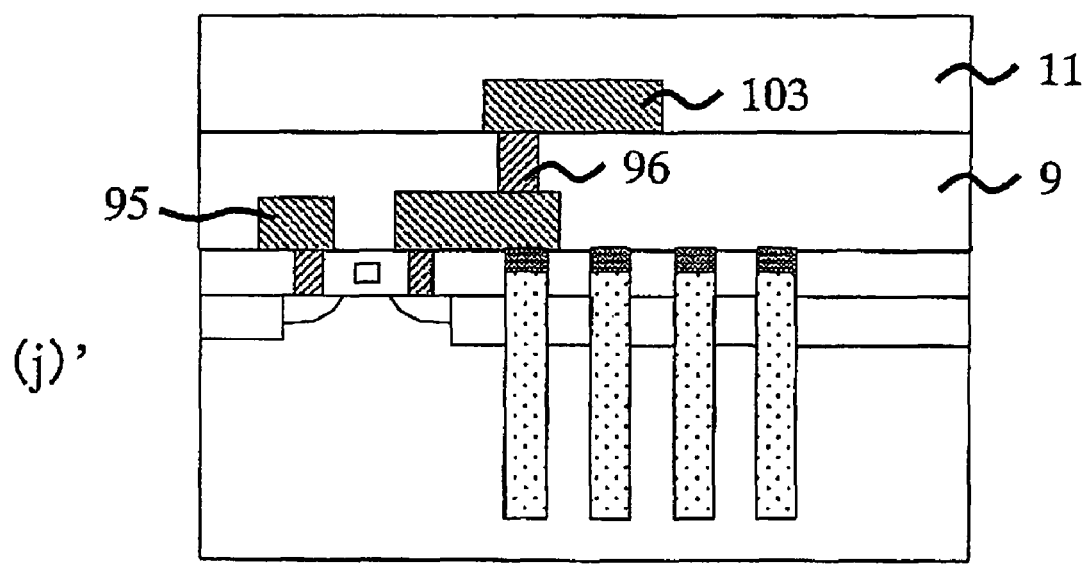

FIG. 51 is a sectional view of a fabrication step for the ninth embodiment of the present invention.

Figure 52:
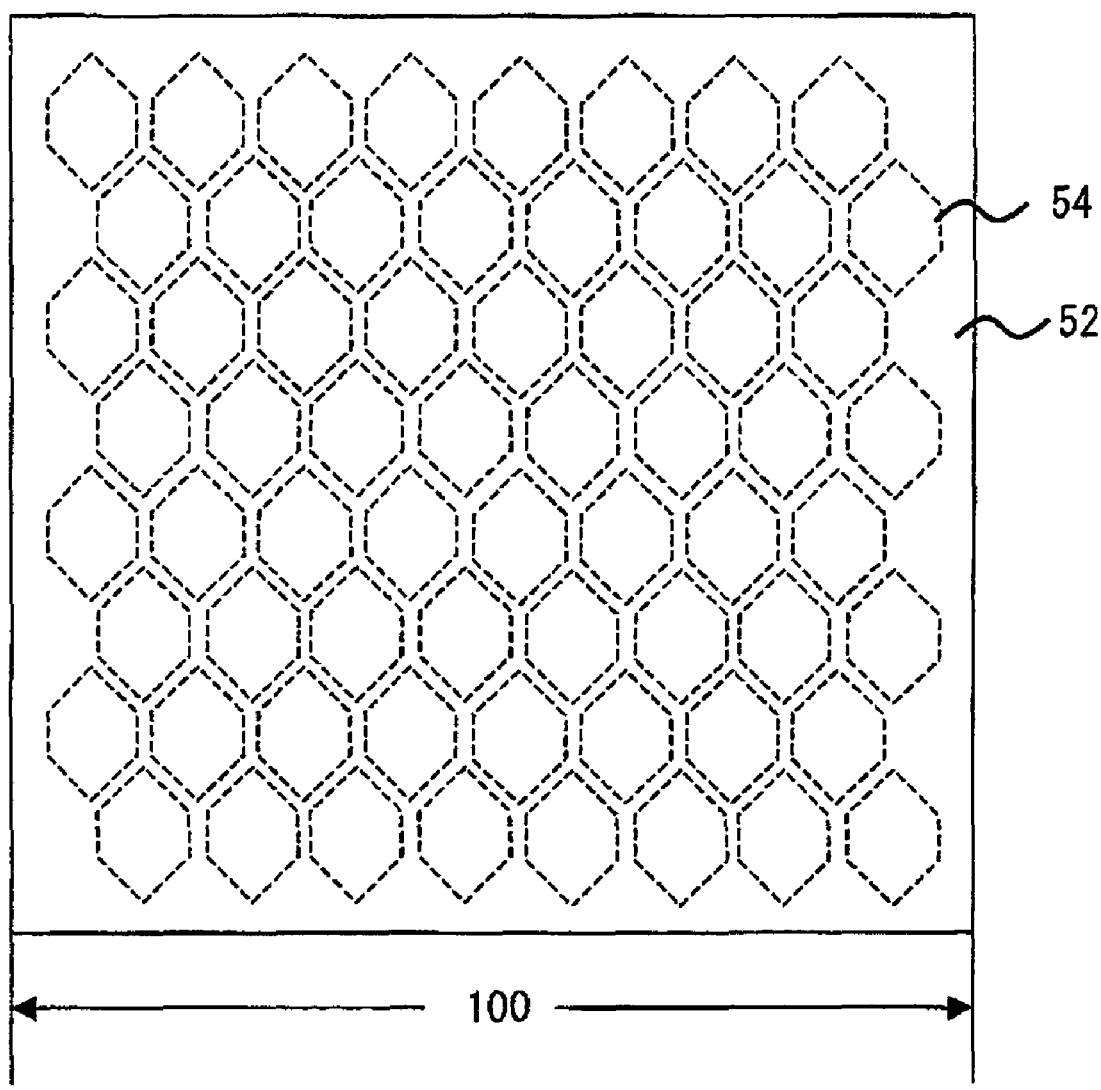

FIG. 52 is a top plan view showing a third example of the arrangement of openings in which a low-permittivity material is embedded.

Figure 53:
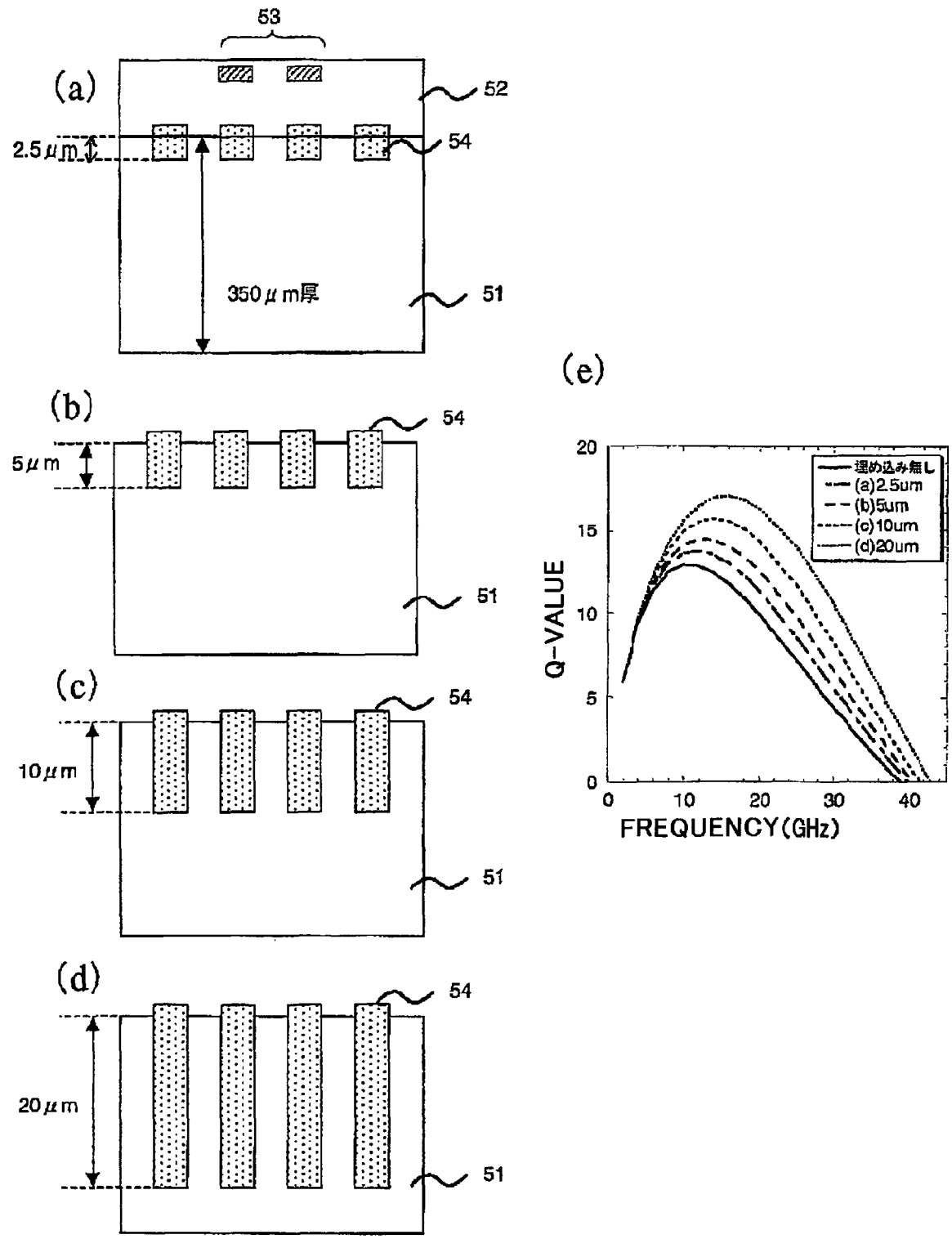

FIG. 53 is an explanatory diagram showing an embedded depth dependency of the low-permittivity filling member having a Q-value of the inductor in the first embodiment of the present invention.

Figure 54:
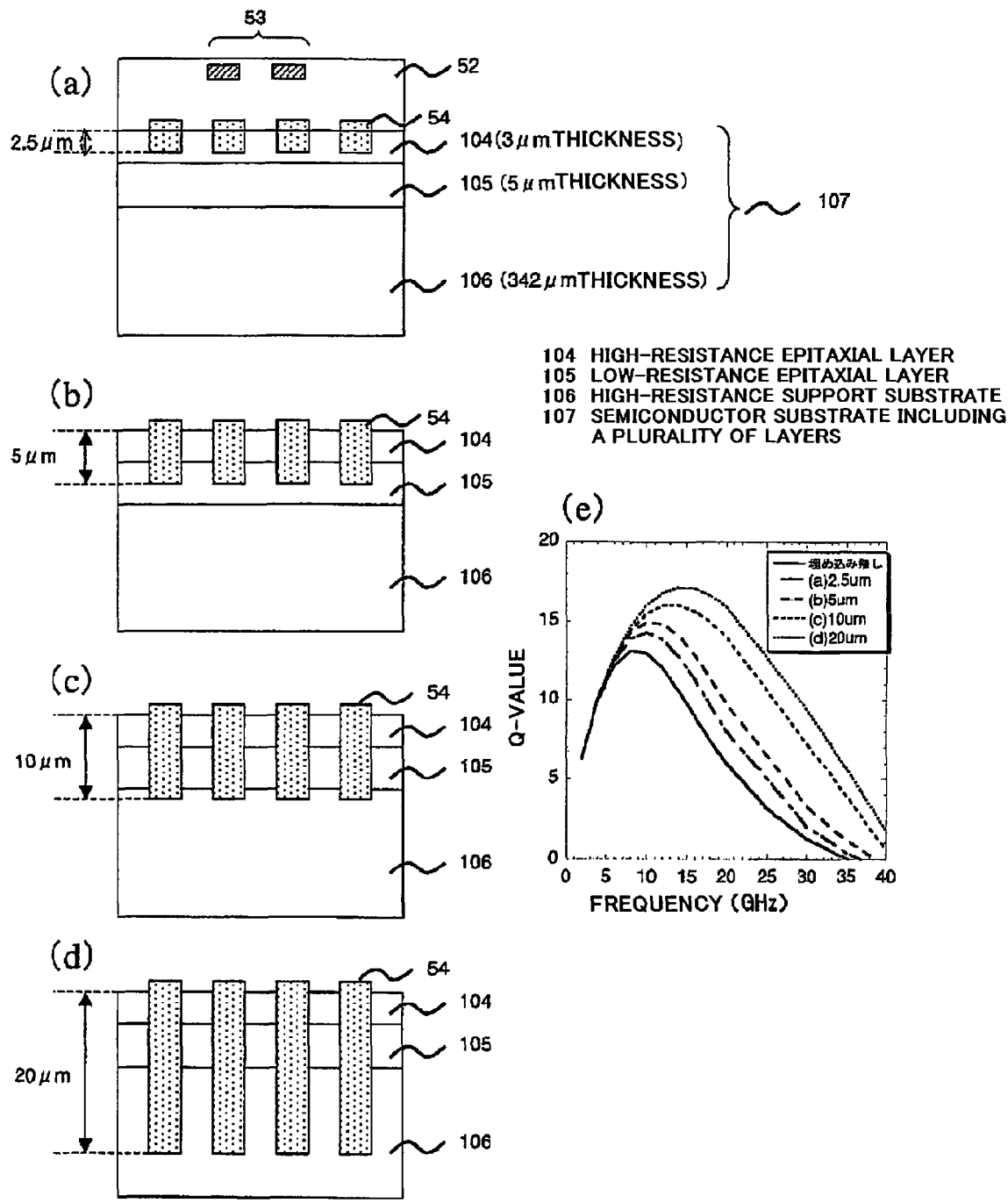

FIG. 54 is an explanatory diagram showing an embedded depth dependency of the low-permittivity filling member having a Q-value of the inductor in the first embodiment of the present invention.

EMBODIMENTS OF THE INVENTION

Hereinafter, the present invention will be described in detail with reference to the drawings based on the embodiments of the present invention. Similar constituent elements will be denoted by similar reference numerals throughout the drawings.

Figure 1:
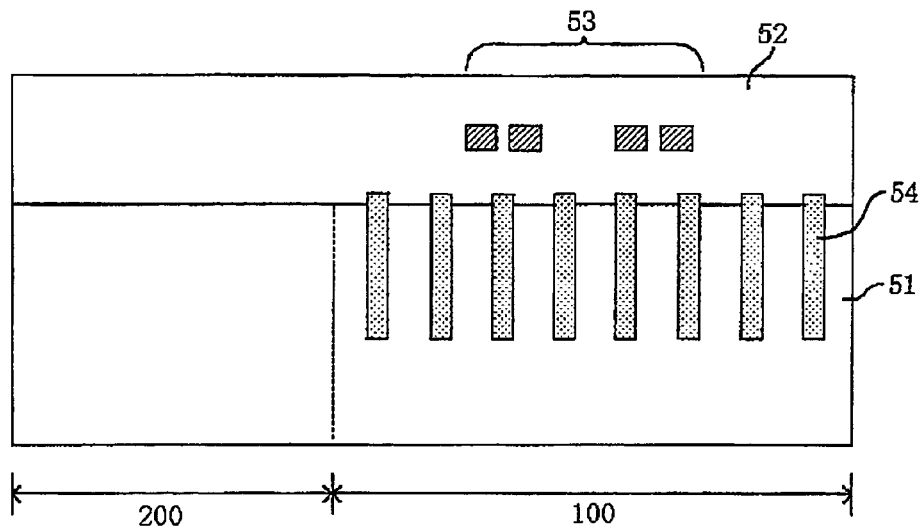
FIG. 1 is a sectional view of a semiconductor device according to a first embodiment of the present invention.

Referring to FIG. 1, a semiconductor chip according to a first embodiment of the present invention includes an RF circuit area 100 for processing high-frequency analog signals, and a digital circuit area 200 for processing digital signals. On a semiconductor substrate 51 is formed a layered insulating structure including a plurality of interlevel dielectric films. In the layered insulating structure 52 in the RF circuit area 100, there is provided an inductor 53 having, for example, a spiral structure while using multi-layered interconnects. In the RF circuit area 100 are provided openings which penetrate at least one interlevel dielectric film to reach the internal of the semiconductor substrate 51. Within the openings is embedded a low-permittivity filling member 54 having a relative permittivity lower than that of a silicon oxide film. The openings may be a circle or polygon such as quadrangle as viewed normal to the substrate. In an alternative, the openings may have a so-called honey-comb structure wherein hexagon openings are arranged so as to obtain a higher filling factor. In this case, the hexagons need not be regular hexagons, and for example, may have a shape of hexagon such as shown in FIG. 52, wherein a pair of opposing angles are each 90 degrees. The shape of hexagon shown in FIG. 52 is based on the restriction of a semiconductor device design, wherein the angle of an allowable line in the design is limited to 0, 45 or 90 degrees with respect to a reference line. Since shape of the openings manufactured in a practical case is affected by variations in the fabrication process such as exposure and etching steps, the angles of shape of the openings practically manufactured are not necessarily made exactly 90 degrees and may be between 80 degrees and 100 degrees, for example. The above structure wherein hexagon openings are arranged in a honey-comb structure can improve the filling factor of the openings relative to the substrate surface and maintain the mechanical strength, and thus is preferable. In addition, the openings may be groove-like openings. The groove-like openings, if employed, may be formed to intersect one another. The low-permittivity filling members 54 may be formed as an organic siloxane (MSQ) film obtained by partially replacing oxygen of silicon oxide by organic groups such as a methyl group, a porous insulating film wherein minute air gaps having a diameter of 5 nm or less are distributed in the organic siloxane film, and so on. The low-permittivity filling members 54 have a preferable relative permittivity of 3 or less.

There is no restriction on the embedded depth of the low-permittivity filling members 54 within the semiconductor substrate 51; however, the embedded depth should be as large as possible in the fabrication process in the view point of a higher effective resistance of the semiconductor substrate. If the filling depth of the low-permittivity members 54 is restricted due to the restriction by the practical fabrication process, such as the embedded capability of the low-permittivity members, the depth of the low-permittivity filling members 54 within the substrate is preferably 2 μm or above, and more preferably 5 μm or above. FIG. 53 shows schematic diagrams wherein the embedded depth of the low-permittivity filling members 54 is set at 2.5 μm in (a), 5 μm in (b), 10 μm in (c) and 20 μm in (d). FIG. 53(a) shows a layered insulating film 52 and an inductor 53. The layered insulating film 52 and inductor 53 are also formed in FIGS. 53(b), (c) and (d) similarly to FIG. 53(a), and thus not specifically depicted in those figures. In addition, the height of the low-permittivity filling members 54 measured toward the substrate surface in those figures, the location of the top thereof within the layered insulating film etc. are not described here with reference to FIG. 53, because those configurations are described in detail in the seventh, eighth and ninth embodiments of the present invention. In short, the description with reference to FIG. 53 is directed to the embedded depth of the above low-permittivity filling members 54 in the depthwise direction of the substrate. FIG. 53(e) shows a frequency dependency of the Q-value of the chip inductor 53 located on the top interconnect layer for the structures of (a), (b), (c) and (d). Compared to the structure having no embedded low-permittivity filling members, the structures shown in (a), (b), (c) and (d) have an improved Q-value. A larger embedded depth of the low-permittivity filling members 54 allows a higher improvement in the Q-value.

If a semiconductor substrate having a plurality layers with different specific resistances, such as described in "Proceedings of IEEE Radio and Wireless Conference, 1998. RAWCON 98" p. 305, is to be used as the semiconductor substrate 51, it is preferable that the low-permittivity members 54 exist from the semiconductor substrate surface down to around the intermediate position of a low-resistance epitaxial layer. In addition, it is more preferable that the low-permittivity members 54 reach the undermost end of the low-resistance epitaxial layer. It is further more preferable that the bottom end of the low-permittivity filling members 54 penetrate the low-resistance epitaxial layer to reach the support substrate configuring the undermost layer. Referring to FIG. 54, there is shown a schematic diagram depicting that the embedded depth of the low-permittivity filling members 54 within the semiconductor substrate 107 including high-resistance epitaxial layer 104, low-resistance epitaxial layer 105 and high-resistance support substrate 106 is set at 2.5 μm in (a), 5 μm in (b), 10 μm in (c) and 20 μm in (d) from the substrate surface. FIG. 54(a) shows a layered insulating film 52 and an inductor 53. The layered insulating film 52 and inductor 53 are also formed in FIGS. 54(b), (c) and (d), similarly to FIG. 54(a), and not specifically depicted in those figures. In addition, the height of the low-permittivity filling members 54 measured toward the substrate surface in those figures, the location of the top thereof within the layered insulating film etc. are not described here with reference to FIG. 54, because those configurations are described in detail in the seventh, eighth and ninth embodiments of the present invention. In short, the description with reference to FIG. 54 is directed to the embedded depth of the above low-permittivity filling members 54 in the depthwise direction of the substrate. FIG. 54(e) shows a frequency dependency of the Q-value of the chip inductor 53 located on the top interconnect layer for the structures of (a), (b), (c) and (d). Compared to the structure having no embedded low-permittivity filling members, the structures shown in (a), (b), (c) and (d) have an improved Q-value. A higher embedded depth of the low-permittivity filling members 54 allows a higher improvement in the Q-value. Further, setting of the embedded depth at 10 μm or above allows a higher improvement factor in the Q-value. This is probably because the eddy current within the low-resistance epitaxial layer is further reduced due to the configuration wherein the low-permittivity filling members penetrates the low-resistance epitaxial layer in the case of an embedded depth of the low-permittivity filling members being 10 μm or above. Thus, if the semiconductor substrate having a plurality of layers with different specific resistances is used, the embedded depth of the low-permittivity filling members 54 should be preferably larger than the depth at which the low-resistance epitaxial layer is penetrated.

Even if the depth of the low-permittivity filling members 54b does not reach the undermost end of the low-resistance epitaxial layer due to the restriction by the fabrication process, a higher effective resistance can be obtained for the substrate resistance, not to mention to the reduction in the substrate capacitance, and a physical separation by a large distance between the metal interconnects and the semiconductor substrate, which constitute the main paths of eddy current occurring in the semiconductor substrate, thereby achieving the advantages conforming to the object of the present invention.

The low-permittivity filling members 54 may be embedded, in particular, along the periphery of the semiconductor chip, on which an on-chip antenna interconnect may be formed. The on-chip antenna interconnect is formed as an I-character, L-character or U-character shape, or multiple loops, for example. After multi-layered interconnects including windings of the inductor 53 and on-chip antenna interconnect are formed, the bottom surface of the semiconductor substrate is ground so that the semiconductor substrate 51 has as small a thickness that is equal to or smaller than double the depth of the openings in which the filling members 54 are embedded. This achieves a higher resistance for the substrate to thereby reduce the substrate current.

Figure 2:
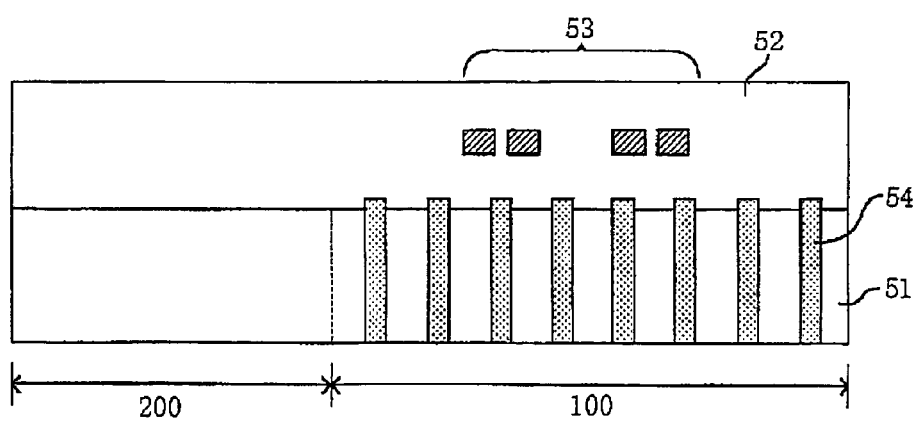
FIG. 2 is a sectional view of a semiconductor device according to a second embodiment of the present invention.

Referring to FIG. 2, a semiconductor device according to a second embodiment of the present invention is similar to the semiconductor device of the first embodiment except that the semiconductor substrate is ground to the extent wherein the bottom surface of the openings, in which the low-permittivity filling members 54 are embedded, is exposed in the present embodiment.

Figure 3:
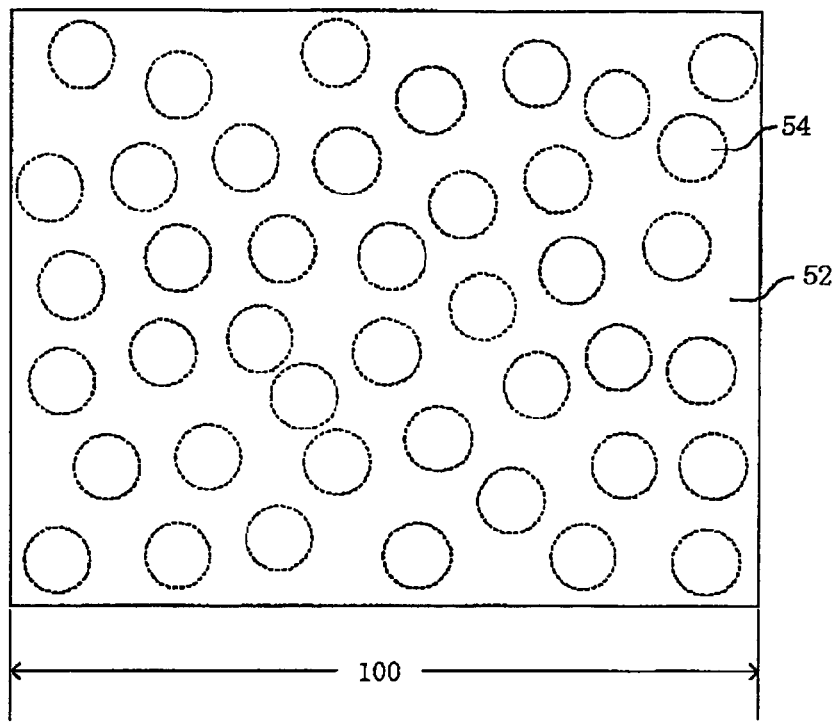
FIG. 3 is a top plan view of a first example of the arrangement of openings in which a low-permittivity material is embedded.
Figure 4:
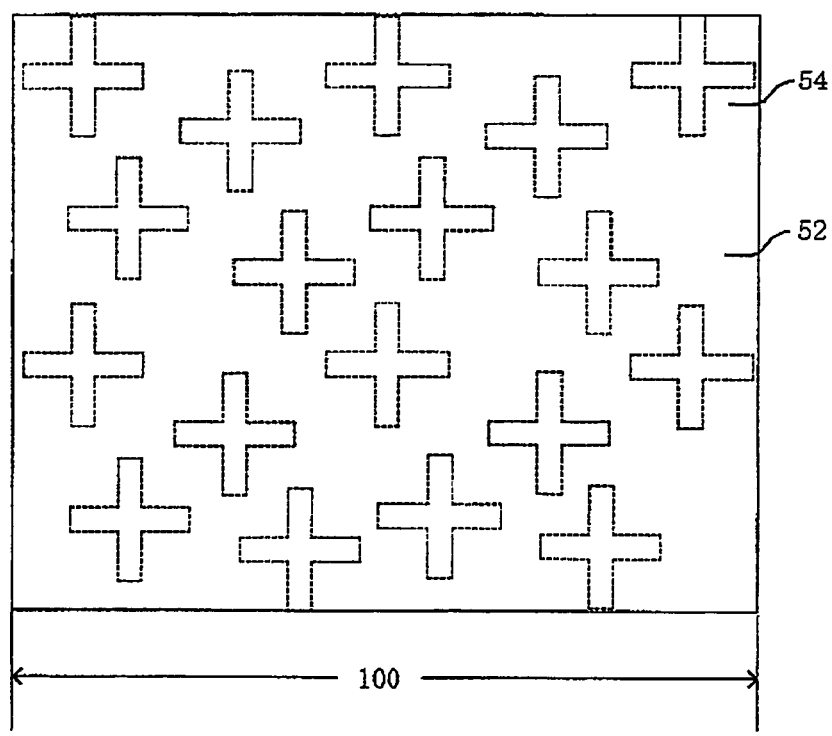
FIG. 4 is a top plan view of a second example of the arrangement openings in which a low permittivity material is embedded.

The planar arrangement of the low-permittivity filling members 54 may be a regular arrangement such as square lattice arrangement or oblique direction arrangement (refer to FIG. 11(a)). In an alternative, it may be an irregular arrangement such as shown in FIG. 3. The random arrangement of the low-permittivity filling members 54 reduces the probability of formation of a linear current path in the RF circuit area as viewed from the top, thereby increasing the effective substrate resistance R1. Moreover, as shown in FIG. 4, formation of a linear current path which extends across all the width or length of the RF circuit area may be prevented while regularly arranging the low-permittivity filling members 54. Furthermore, a so-called honey-comb structure may be used wherein hexagon openings are arranged so as to achieve a higher filling factor.

The low-permittivity filling members 54 may be embedded within lattice-like trenches, to completely suppress the formation of the current path in the RF circuit area. However, this structure of dividing the substrate weakens the mechanical strength of the substrate and should be avoided if the substrate thickness is small.

Figure 5:
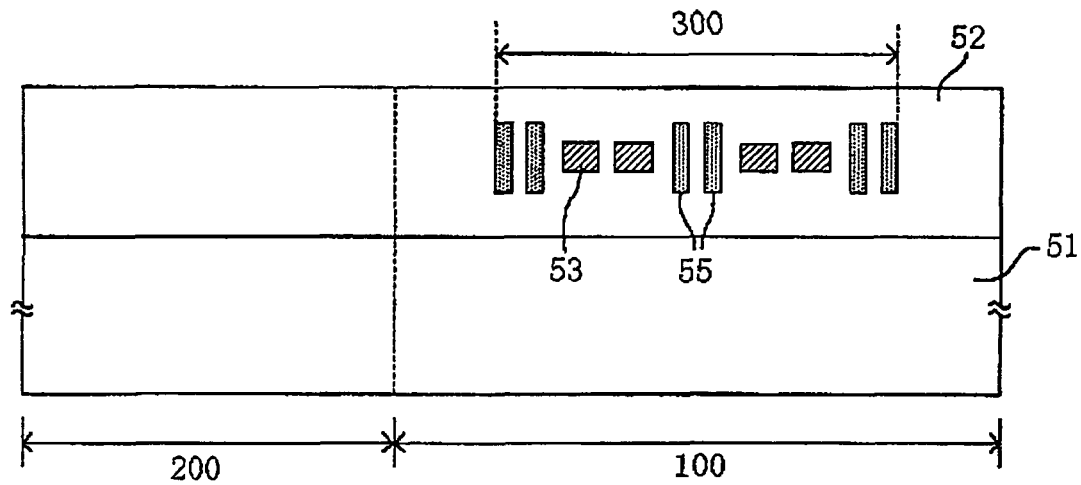
FIG. 5 is a sectional view of a semiconductor device according to a third embodiment of the present invention.

Referring to FIG. 5, in a third embodiment of the present invention, a high-permeability area 300 is provided on the RF circuit area 100. In the high-permeability area 300, openings penetrating an interlevel dielectric film to reach another interlevel dielectric film are provided in the central area of the windings of an inductor 53 and the periphery thereof in a layered insulating structure 52 including a plurality of interlevel dielectric films, and a high-permeability magnetic material is embedded in the openings to form high-permeability members 55. In this structure, if the high-permeability magnetic material embedded has a conductive bulk state, the openings should meet the condition that the aspect ratio (depth/diameter or length of a side) thereof is "1" or above for reducing the induced current. If the high-permeability magnetic material embedded is an insulating material or a mixture wherein a micronized soft magnetic material is mixed with an insulating material (preferably low-permittivity insulating material) as described below, such a condition is unnecessary.

Furthermore, for reducing the parasitic capacitance between the windings of the inductor 53, the openings may be filled with a low-permittivity insulating material together with a high-permeability magnetic material. In this case, the high-permeability members 55 should be such that a micronized high-permeability magnetic material is distributed in a low-permittivity insulating material and embedded in the openings. Examples of the preferable insulating material include organic siloxane film as described above and a porous insulating film wherein minute air gaps are distributed in the organic siloxane film.

Instead of using the technique wherein the openings are filled with a low-permittivity insulating material in which a micronized high-permeability magnetic material is distributed, the high-permeability magnetic members 55 may be such that the wall surface of the openings is coated with high-permeability material film by using a sputtering, CVD or plating technique, and the remaining space of the openings are filled with the low-permittivity material.

If the high-permeability magnetic members 55 are configured by a conductive bulk material, large-size openings may be formed in the area in which the high-permeability magnetic members are formed, and the openings may be filled with a low-permittivity insulating material. In this case, openings for embedding therein a high-permeability magnetic material are formed in the low-permittivity insulating film, and the openings are filled with a soft magnetic material as by using a sputtering or electrolytic plating technique. The high-permeability magnetic members 55 may be provided in an area other than the inductor-forming area. In this case, the high-permeability magnetic members 55 act for a magnetic shield function.

Figure 6:
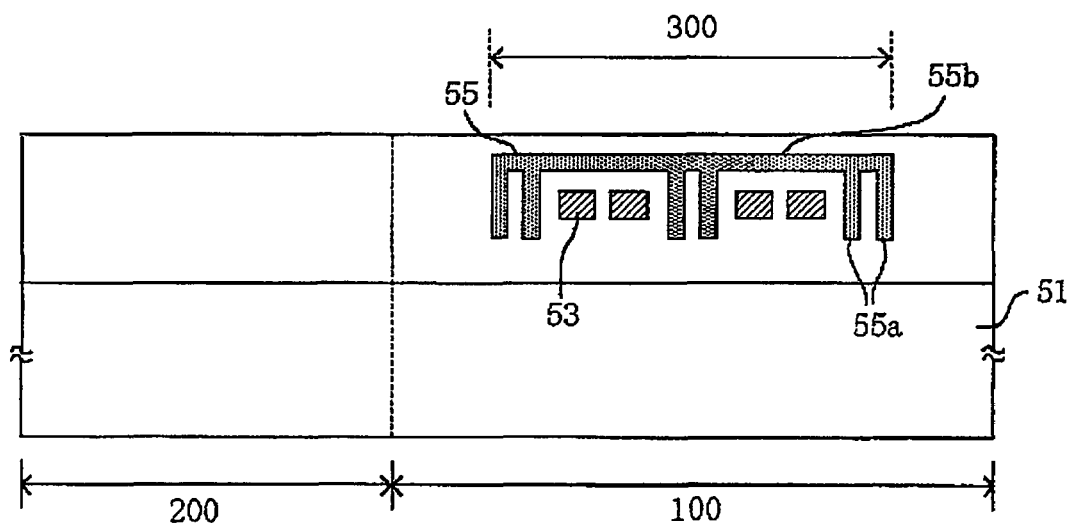
FIG. 6 is a sectional view of a semiconductor device according to a fourth embodiment of the present invention.

Referring to FIG. 6, a fourth embodiment of the present invention is similar to the third embodiment except that a high-permeability member 55 is provided with, in addition to the rod members 55a of the high-permeability member 55, which extend normal to the substrate surface, and a plane member 55b for covering top of the rod members 55a and coupling together the rod members 55a in the present embodiment. The plane member 55b provided for the high-permeability magnetic members 55 increases the permeability in the periphery of the windings of the inductor 53, to further increase the inductance or further reduce the size of the inductor 53, and also reduces the induced current of other interconnects.

In the depicted example, the plane member 55b of the high-permeability member 55 is provided on top of the rod members 55a; however, it may be provided on the bottom portion of the rod member 55a. In an alternative, both the top and bottom of the rod members 55b may be provided with the plane members.

In the semiconductor devices of the first through fourth embodiments, the inductor can be reduced in size thereof and has a higher performance, and in addition, the passive element thus reduced in size and having a higher performance can be mounted on a single mixed-circuit chip on which active elements such as a CMOS circuit are provided. Thus, according to the semiconductor device of the present invention, a mixed-circuit chip can be achieved including an RF circuit having a reduced loss as well as reduced noise propagation and a digital circuit (including a memory section such as SRAM).

In a mixed-circuit chip mounting thereon a RF communication function, signal transfer between the chips can be achieved using radio USB, radio WLAN or UWB communication. When configuring a system including a plurality of digital logic chips in the conventional technique, a plurality of chips are mounted on a printed circuit board, wherein a long time as well as a large amount of work is needed for solving the problems of signal delay or signal coupling.

Figure 7:
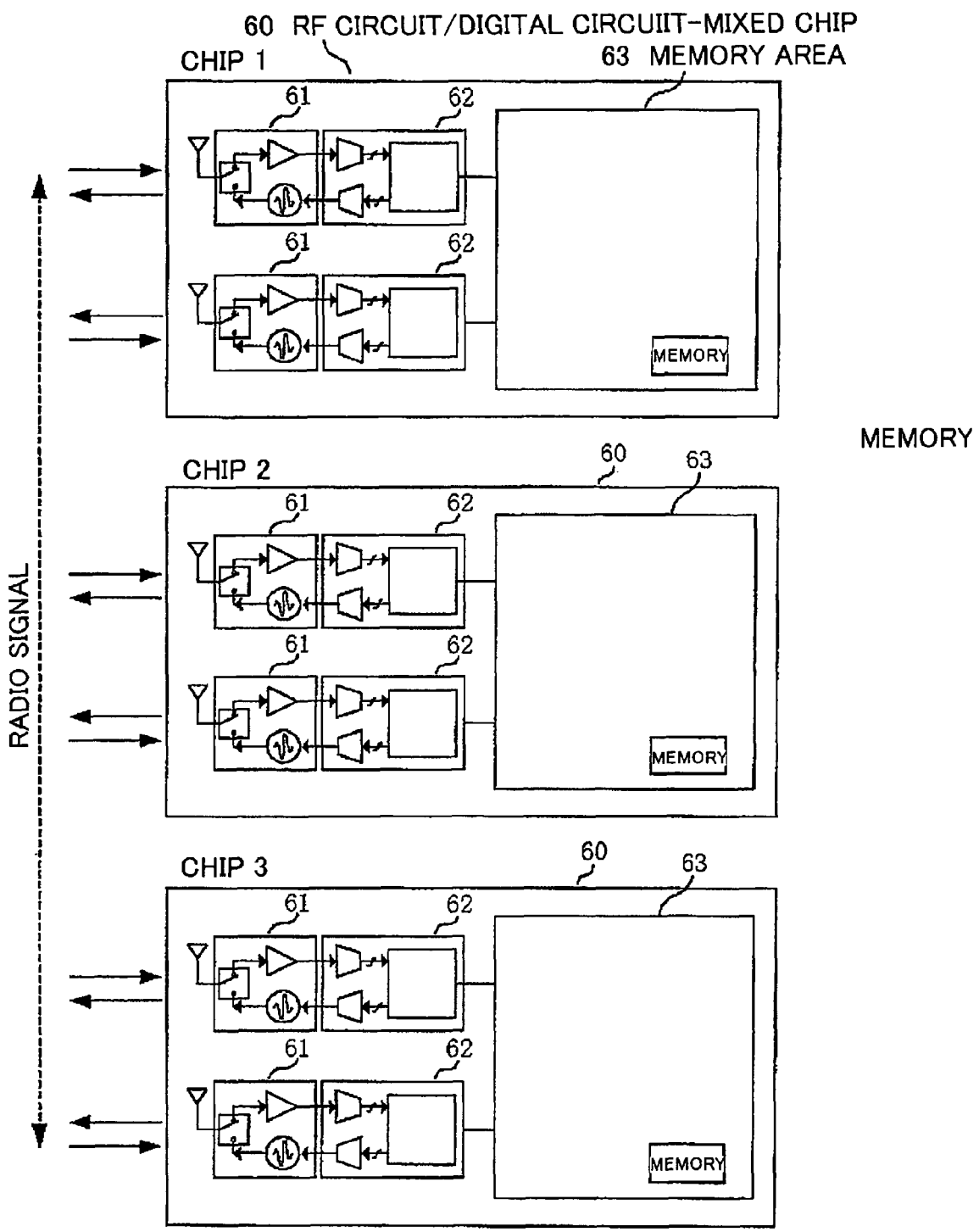
FIG. 7 is a block diagram exemplifying the state of use of the device on which a plurality of semiconductor devices according to the present invention are mounted.

According to the semiconductor device of the present invention, as shown in FIG. 7, by preparing a plurality of RF circuit/digital circuit-mixed chips each mounting thereon a plurality of RF communication circuit areas 61, a plurality of digital baseband areas 62 and a memory area 63, the signal transfer between these chips can be achieved without wires. Thus, the printed circuit board can be specialized solely for a low-noise power supply, thereby reducing the amount of design work. In addition, the restriction on the chip arrangement can be significantly reduced.

FIG. 30 is a structural drawing showing a fifth embodiment of the present invention. According to the fifth embodiment of the present invention, a plurality of interconnect layers 85 including at least two layers are formed on the above low-capacitance substrate, a plurality of via-plugs 86 are formed all over the area of the interconnect layers, and the plurality of interconnect layers are electrically connected in parallel to form an inductor. Numeral 19 denotes a high-permeability isolation region formed in an area including the core of the inductor and the periphery thereof.

FIG. 31 shows the top plan view of the inductor interconnect and a sectional view thereof. Via-plugs 86a, 86b connecting together a plurality of interconnect layers are shown therein. In this explanatory view of FIG. 31, a spiral type is shown as the planar shape of the inductor 85; however, known circular shape or octagon shape may be used as the planar shape of the inductor 85. In general, the number of via-plugs is limited based on the restriction as to the shape, size, arrangement, allowable number of arrangement depending on the semiconductor device manufacturing process or design. For reducing the resistance of the interconnect layers connected together in parallel, it is preferable to connect together the plurality of interconnect layers by using the via-plugs in number as large as that allowed in the design. The number of via-plugs 86a, 86b shown in the explanatory drawing of FIG. 31 is obviously smaller than the number of via-plugs allowable in the restriction by the semiconductor device manufacturing process generally used and the design. The reason is that the object of the drawing is to show the principle of the present invention in the conceptual figure, and thus the present invention is not restricted to any of the arrangement, shape, number etc. of the via-plugs shown in FIG. 31.

The connection of a plurality of interconnect layers together in parallel corresponds to an increase in the thickness of the interconnect layer, in the view point of the electric circuit theory, as compared to the case of using a single interconnect layer to form an inductor, whereby the resistance loss of the inductor line can be reduced. Use of the plurality of interconnect layers generally reduces the distance between the interconnect layers and the substrate as compared to the case of using the single topmost interconnect layer, whereby the capacitance between the interconnect layers and the substrate is increased. However, according to the present embodiment, a low-capacitance substrate region is formed in the substrate, to thereby suppress the influence by the increase in the capacitance. Thus, an inductor element is obtained wherein the connection of the plurality of interconnect layers together in parallel reduces the resistance loss and yet suppresses the increase in the capacitance.

FIG. 32 is a structural drawing showing a sixth embodiment of the present invention. According to the sixth embodiment of the present invention, an inductance 91 is formed wherein ends of at least two layers out of a plurality of interconnect layers are connected together in series by using a plurality of via-plugs. FIG. 33 shows the top plan view of an inductor line. In this explanatory view of FIG. 33, a spiral type is shown as the planar shape of the inductor 91; however, a known circular shape or octagon shape may be used as the planar shape of the inductor. Connection of a plurality of interconnect layers 87, 88 together in series corresponds to an increase in the line length of the inductor line, whereby an inductor element having the same inductance can be formed in a reduced occupied area as compared to the case of using the single interconnect layer to form an inductor. Use of the plurality of interconnect layers generally reduces the distance between the interconnect layers and the substrate as compared to the case of using the single topmost interconnect layer, whereby the capacitance between the interconnect layers and the substrate is increased. However, according to the present embodiment, a low-capacitance substrate region is formed in the substrate, to thereby suppress the influence by the increase in the capacitance. Thus, an inductor element is obtained having a reduced occupied area and suppressing the increase in the capacitance.

In the present embodiment, if the plurality of interconnect layers are disposed to overlap together in the vertical direction, there arises a parasitic capacitance therebetween. More specifically, the parasitic capacitance corresponds to an inter-line capacitance Cp shown in the equivalent circuit of FIG. 27. For reducing this parasitic capacitance, different line widths are employed for the interconnect layers 87, 88 overlapping together in the vertical direction, thereby allowing the parasitic capacitance between the interconnects to be reduced. Moreover, the interconnects overlapping together in the vertical direction out of the plurality of interconnect layers configuring a single inductor element by a serial connection thereof should preferably have the directions of the currents which do not oppose each other, for prevention of a negative mutual inductance from occurring therebetween. FIGS. 33 to 38 exemplarily show the arrangement of the plurality of interconnect layers for achieving such an object.

In general, the number of via-plugs 86 is limited based on the restriction as to the shape, size, arrangement, allowable number of arrangement depending on the semiconductor device manufacturing process or design. For reducing the resistance of the connection using via-plugs, it is preferable to connect together the plurality of interconnect layers by using the via-plugs in number as large as that allowed in the design. The number of via-plugs shown in the explanatory drawings of FIGS. 33 to 38 is obviously smaller than the number of via-plugs allowable in the restriction by the semiconductor device manufacturing process generally used and the design. The reason is that the object of the drawings is to show the principle of the present invention in the conceptual figure, and thus the present invention is not restricted to any of the arrangement, shape, number etc. of the via-plugs shown in FIGS. 33 to 39.

A seventh embodiment of the present invention shown in FIG. 39 is applied to a semiconductor device wherein metallic interconnects containing copper as the main component thereof are formed using a damascene technique on a semiconductor substrate having a low-capacitance substrate region. On a first interlevel dielectric film 4 are formed a first stopper insulating film 92 and a second stopper insulating film 93 each including at least silicon and at least one element other than the elements included in the first interlevel dielectric film 4. Here, a metallic interconnect 10 formed in the second interlevel dielectric film 9, first stopper insulating film 92 and second stopper insulating film 93 overlying the low-capacitance substrate region has a flat bottom surface.

In the present embodiment, copper or an alloy containing copper as the main component thereof, if used as the main component of the multi-layered interconnects, affords the advantages of the embodiment. The interconnection structure made of copper or containing copper as the main component thereof is generally formed by a so-called damascene technique. The damascene technique, if used for forming the multi-layered interconnects in the seventh embodiment, provides the advantage of the present embodiment. Since only the structure of the low-capacitance substrate region formed in the semiconductor substrate is different from those in the embodiments up to the sixth embodiment, the structure of this specified region will be extracted and described. In addition, the interconnect materials including copper as the main component thereof and fabrication method thereof are assumed as the current mainstream materials and method. The detail of the method for forming the interconnects containing copper as the main component will not be specifically described because the material, structure and fabrication method of the interconnect containing copper as the main component in the present embodiment do not have an influence on the present invention. The seventh embodiment of the present invention will be described hereinafter with reference to the drawings.

In FIG. 39, on the first interlevel dielectric film 4 are formed the first stopper insulating film 92 and second stopper insulating film 93 each including at least silicon and at least one element other then the elements in the first interlevel dielectric film 4. The stopper insulating films are preferably made of a material including at least silicon and providing a sufficient selectivity ratio during a CMP treatment of the low-permittivity film 7 configuring the low-permittivity insulator rods 8 and during a plasma-enhanced etching treatment for the second interlevel dielectric film 9. More specifically, if a material having a lower permittivity than a silicon oxide film, such as $SiO_2$, a material wherein $SiO_2$ is doped with element such as boron or phosphorous, a material wherein oxygen of silicon oxide film is replaced by hydrogen or methyl group, silica (SiOC) or SiOCH added with carbon is to be used, the stopper insulating films 92, 93 are preferably made of a material including at least silicon and nitrogen, such as SiN, SiON or SiCN. If a material having a lower permittivity than a silicon oxide film, such as a material wherein oxygen of silicon oxide film is replaced by hydrogen or methyl group, or silica (SiOC) or SiOCH added with carbon is to be used, the stopper insulating films 92, 93 is preferably made of a material including silicon and nitrogen, such as SiN, SiON and SiCN. The stopper insulating films 92, 93 may have the same constituent elements and the same composition, and thus may be made of the same insulating material. In this case, the interface between the first stopper insulating film 92 and the second stopper insulating film 93 shown in FIG. 37 may not be clearly observed as such even if a scanning electron microscope or transmission electron microscope is used. The present embodiment features that the first metallic interconnect 10 formed in the first stopper insulating film 92, second stopper insulating film 93 and second interlevel dielectric film 9 overlying the low-capacitance substrate region has a flat bottom surface, and the top surface of a low-permittivity insulator rod just underlying the metallic interconnect 10 and the top surface of another low-permittivity insulator rod not underlying the metallic interconnect 10 are not flush with each other.

The seventh embodiment can be applied to all the first through sixth embodiments so long as copper or an alloy including copper as the main component is used for the material of the multi-layered interconnects.

An eighth embodiment of the present invention is applied to a semiconductor device wherein a metallic interconnect containing copper as the main component thereof is formed using a damascene technique on a semiconductor substrate including therein a low-capacitance substrate region. On the first interlevel dielectric film 4 are formed a first stopper insulating film 92 and a second stopper insulating film 93 each including at least silicon and at least one element other than the elements in the first interlevel dielectric film 4. The metallic interconnect 10 formed in the second interlevel dielectric film 9, first stopper insulating film 92 and second stopper insulating film 93 overlying the low-capacitance substrate region has a flat bottom surface, and cap insulating films 94 having a higher permittivity and a higher mechanical strength than the low-permittivity insulator rods 8 are formed on the top end of the respective low-permittivity insulator rods in the top portion of the openings for the low-permittivity insulator rods 8 located in the low-capacitance substrate region.

The present embodiment, if copper or an alloy containing copper as the main component thereof is used therein for the material of the multi-layered interconnects, achieves the advantage thereof. The interconnection structure including copper or an alloy containing copper as the main component thereof is generally formed using the damascene technique. The damascene technique, if used for forming the multi-layered interconnects in the eighth embodiment, provides the advantage of the present embodiment. Since only the structure of the low-capacitance substrate region formed in the semiconductor substrate is different from those in the embodiments up to the sixth embodiment, the structure of this specified region will be extracted and described. In addition, the interconnect materials including copper as the main component thereof and fabrication method thereof are assumed as the current mainstream materials and method. The detail of the method for forming the interconnects containing copper as the main component will not be specifically described because the material, structure and fabrication method of the interconnect containing copper as the main component in the present embodiment do not have an influence on the present invention. The eighth embodiment of the present invention will be described hereinafter with reference to the drawings.

FIG. 40 is a structural drawing showing the eighth embodiment of the present invention. In the present embodiment, on the first interlevel dielectric film 4 are formed a first stopper insulting film 92 and a second stopper insulating film 93 each including at least silicon and at least one element other than the elements in the first interlevel dielectric film 4. The stopper insulating films are preferably made of a material including at least silicon and providing a sufficient selectivity ratio during a plasma-enhanced etching of the low-permittivity film 7 configuring the low-permittivity insulator rods 8 and the second interlevel dielectric film 9. More specifically, if a material having a lower permittivity than a silicon oxide film, such as $SiO_2$, a material wherein $SiO_2$ is doped with element such as boron or phosphorous, a material wherein oxygen of silicon oxide film is replaced by hydrogen or methyl group, silica (SiOC) or SiOCH added with carbon is to be used, the stopper insulating films 92, 93 are preferably made of a material including at least silicon and nitrogen, such as SiN, SiON or SiCN. If a material having a lower permittivity than a silicon oxide film, such as a material wherein oxygen of silicon oxide film is replaced by hydrogen or methyl group, or silica (SiOC) or SiOCH added with carbon is to be used, the stopper insulating films 92, 93 is preferably made of a material including silicon and nitrogen, such as SiN, SiON and SiCN. The stopper insulating films 92, 93 may have the same constituent elements and the same composition, and thus may be made of the same insulating material. In this case, the interface between the first stopper insulating film 92 and the second stopper insulating film 93 shown in FIG. 40 may not be clearly observed as such even if a scanning electron microscope or transmission electron microscope is used.

In the present embodiment, cap insulating films 94 having a higher permittivity and a higher mechanical strength than the low-permittivity insulator rods 8 are formed on the top end of the respective low-permittivity insulator rods in the top portion of the openings for the low-permittivity insulator rods 8.

The present embodiment features that the first metallic interconnect 10 formed in the first stopper insulating film 92, second stopper insulating film 93 and second interlevel dielectric film 9 overlying the low-capacitance substrate region has a flat bottom surface, and the top surface of the cap insulating film formed on a low-permittivity insulator rod just underlying the metallic interconnect 10 and the top surface of the cap insulating film formed on another low-permittivity insulating film not underlying the metallic interconnect 10 are not flush with each other.

The eighth embodiment can be applied to all the first through sixth embodiments so long as copper or an alloy including copper as the main component thereof is used for the material of the multi-layered interconnects.

A ninth embodiment of the present invention provides the advantages of the present invention, if aluminum or aluminum including a minute amount of silicon or a minute amount of copper, now used as the mainstream material, is used for the material of the multi-layered interconnects. Since only the structure of the low-capacitance substrate region formed in the semiconductor substrate is different from those in the embodiments up to the sixth embodiment, the structure of this specified region will be extracted and described. In addition, the interconnect materials including aluminum as the main component thereof and fabrication method thereof are assumed as those now used as the mainstream materials and method. Since the material, structure and fabrication method of the interconnect containing copper as the main component in the present embodiment do not have an influence on the present invention, the detail thereof will not be specifically described. The ninth embodiment of the present invention will be described hereinafter with reference to the drawings.

FIGS. 41(*a*) and (*b*) are structural drawings showing the ninth embodiment of the present invention. The present embodiment features that the top surface of the low-permittivity insulator rods 8 is located on the lower position than the top surface of the W contact plugs 5. Cap insulating films 94 are formed on the top end of the low-permittivity insulator rods in the top portion of the openings for the low-permittivity insulator rods 8 configuring the low-capacitance substrate regions. In formation of the aluminum interconnects generally used, after a metal compound including titanium etc. and a main material including at least aluminum are deposited using a sputtering technique etc., patterning is conducted using the photoresist, and a desired shape for the interconnects is obtained using plasma-enhanced etching. If the exposed top surface of the low-permittivity insulator rods 8 is subjected to metallic sputtering thereon or exposed to etching plasma, there may arise property modification wherein the sputtered metal is distributed into the low-permittivity rods, or some elements of the low-permittivity material configuring the low-permittivity rods are detached therefrom due to the etching plasma whereby the relative permittivity of the low-permittivity material increases. The advantage of the present embodiment is such that the top surface of the low-permittivity insulator rods 8 is protected by the cap insulating films 94 against the sputtering and etching plasma to thereby prevent the above property modification. The ninth embodiment can be applied to the first through sixth embodiments of the present invention wherein aluminum or a metallic compound containing aluminum as the main components thereof is used as the material for the multi-layered interconnects.

EXAMPLES

Preferable examples of the present invention will be described in detail with reference to the drawings.

First Example

FIG. 8(*a*) is a top plan view showing the first example of the present invention, and FIG. 8(*b*) is a sectional view taken along line A-A' in FIG. 8(*a*). On a silicon semiconductor substrate are provided an RF circuit area (high-frequency signal processing circuit area) 100 and a digital circuit area 200. MOSFETs 3 are formed in the regions isolated by shallow-trench-isolation film 2 on the silicon substrate 1, to configure CMOS circuits. In the silicon substrate of the RF circuit area 100 are located a plurality of low-permittivity insulator rods 8 in which low-permittivity insulator is embedded. In the present example, the low-permittivity insulator rods 8 penetrate the first interlevel dielectric film isolating the CMOS transistors and multi-layered interconnects to reach the internal of the silicon substrate. More specifically, the low-permittivity insulator rods are formed after all the CMOS transistor forming steps are finished; in other words, after all the high-temperature heat treatment steps necessary for forming the MOS transistors are finished. Thus, an insulating film having a lower permittivity than the silicon oxide film can be embedded.

After all the device forming steps are finished, the silicon substrate 1 is ground to be thin until the bottom surface of the low-permittivity insulator rods are exposed. The thin substrate structure increases the effective resistance of the silicon substrate, and the arrangement of the low-permittivity insulator rods obtains the low-capacitance substrate region, thereby reducing the noise propagating through the substrate and also reducing the loss.

The source/drain regions of the MOSFETs 3 are connected to first-level copper interconnects 10 embedded within a second interlevel dielectric film 9 via tungsten (W) contact plugs 5 formed within the first interlevel dielectric film 4. A third interlevel dielectric film 11 and a fourth interlevel dielectric film 13 are formed thereon which respectively embed therein a second-level copper interconnects 12 and a third-level copper interconnects 14. In the low-capacitance substrate region wherein low-permittivity insulator rods 8 are arranged, an inductor 40 is formed using the third-level copper interconnects 14 and second-level copper interconnects 12. The arrangement of the inductor in the low-capacitance substrate region reduces the coupling capacitance (Cox/2) between the inductor and the substrate, thereby reducing loss of the inductor.

On the fourth interlevel dielectric film 13 is formed a fifth interlevel dielectric film 15, on the fifth interlevel dielectric film 15 in the RF circuit area 100 is formed a depression, and openings are formed to penetrate the fifth interlevel dielectric film 15 and fourth interlevel dielectric film 13. A soft magnetic substance including a NiFe alloy as the main body is embedded within the depression and openings to form high-permeability isolation regions 19. The high-permeability isolation regions 19 are formed in an area including the core of the inductor 40 and the periphery thereof. This reduces the size of the inductor. The size reduction of the inductor affords reduction of the inductor line length to thereby reduce Rs and Cox/2. In other words, the size reduction of the inductor not only reduces the occupied area factor thereof, but also improves the performance thereof. The high-permeability isolation regions may be formed in an area other than the inductor forming area, and in such a case, they act for a function of magnetic shielding for the RF circuit elements. The fifth interlevel dielectric film 15 is covered by a cover film 20.

Next, a method for manufacturing the semiconductor device of the first example will be described with reference to FIGS. 9 to 18. In each of FIGS. 9 to 18, (a) represents a top plan view and (b) represents a sectional view taken along line A-A' therein.

As shown in FIG. 9, a shallow opening having a depth of 300 nm to 500 nm is formed on the silicon substrate 1 except for element-forming areas 1A, and a silicon oxide film is embedded within the opening to thereby form a shallow-trench element isolation film 2. Subsequently, as shown in FIG. 10, p- and n-wells (not shown) are formed in the element-forming areas 1A, followed by growing gate insulating films, forming gate electrodes, forming diffused regions and silicifying the same, thereby forming MOSFETs 3 configuring CMOS digital circuits and CMOS RF circuits. Thereafter, a silicon oxide film is deposited and planarized using a CMP technique to form the first interlevel dielectric film 4, followed by forming via-holes reaching the gate electrodes and diffused regions, and filling the same with tungsten to form W contact plugs 5. A multi-oxide technique may be used for the gate insulating film for the CMOS digital circuits and CMOS RF circuits. It is important to complete all the high-temperature heat treatment steps at temperatures equal to or above 700 degrees C. in this transistor forming process.

Thereafter, a silicon oxide film (not shown) having a thickness of around 50 nm is formed, if needed, followed by forming openings 6 penetrating the first interlevel dielectric film 4 and element isolation film 2 in the RF circuit area 100 to reach the internal of the silicon substrate 1. Although there is no restriction on the shape and depth of the openings 6, the openings may have a diameter of 1 to 3 μm and a depth of 5 to 30 μm, for example. Although three is no restriction on the arrangement of the openings, the openings may be arranged in an oblique direction, for example. The openings may include groove-like ones. Moreover, the openings may have a honey-comb structure wherein hexagon openings are arranged to obtain a higher filling factor.

Thereafter, as shown in FIG. 12, a low-permittivity insulating film 7 is formed so as to fill the openings 6. Although there is no restriction on the material for the low-permittivity insulating film, it is necessary that the low-permittivity insulating film have a lower permittivity than at least the silicon oxide film. For example, a coating insulating film, such as made of ladder oxide wherein oxygen of a silicon oxide film is replaced by hydrogen, or MSQ wherein such oxygen is replaced by methyl, can be used. Moreover, a plasma-enhanced CVD film, such as made of silica (SiOC) or SiOCH added with carbon, may be also used. Furthermore, a porous film wherein air gaps having a diameter of 10 nm or less is dispersed in an insulating film may also be used. Instead of filling the entire openings 6 with the low-permittivity insulating film, a thin silicon oxide film or silicon nitride film may be grown using a thermal CVD technique, ozone-oxidizing CVD technique or plasma-enhanced CVD technique on the wall of the openings, followed by embedding a low-permittivity insulating film therein.

Thereafter, as shown in FIG. 13, the low-permittivity insulating film on the interlevel dielectric film is removed by a CMP technique to thereby form in the silicon substrate the low-permittivity insulator rods 8, wherein the low-permittivity insulating film is embedded within the openings. Although the entire portion of the low-permittivity insulating film 7 on the first interlevel dielectric film 4 is removed by the CMP technique in the embodiment, part of them may be left as an element isolation film between the multi-layered interconnects.

Thereafter, the second interlevel dielectric film 9 is grown, and an interconnection trench exposing therethrough top of the W contact plugs 5 is formed therein. A barrier metal, such as Ta/TaN or TiW, having a thickness of around 25 nm and a seed copper film having a thickness of around 100 nm are grown in the interconnection trench, followed by growing thereon a copper film by an electrolytic plating technique using the seed copper film as an electrode. By selectively removing the copper film and barrier metal film by using a CMP technique, the first-level copper interconnects 10 having a damascene structure are formed within the second interlevel dielectric film 9. There is no restriction on the material for the second interlevel dielectric film 9, and a silicon oxide film, ladder oxide, MSQ, SiOCH or porous film may be used for this purpose. On top of the damascene copper interconnects is formed a cap film such as made of SiCN or SiC for prevention of copper diffusion.

Thereafter, by iteratively growing an insulating film, forming interconnection trench and via-holes and filling the via-holes with a copper film, as shown in FIG. 15, a multi-layered interconnection structure is formed including the third interlevel dielectric film 11 embedding therein the second-level copper interconnects 12, and the fourth interlevel dielectric film 13 embedding therein the third-level copper interconnects 14. In the present example, the inductor 40 is formed using the third-level interconnects 14 and the second-level interconnects 12. Although there is no restriction on the number of interconnect layers for configuring the inductor, it is necessary to allow the same to overlie the low-permittivity substrate region, wherein at least the low-permittivity insulator rods 8 embedded in the silicon substrate are arranged. This arrangement of the inductor reduces the coupling capacitance (Cox/2) between the inductor and the substrate and thus reduces the loss.

Thereafter, as shown in FIG. 16, the fifth interlevel dielectric film 15 is grown on the interconnect layers configuring the inductor. Depressions 16 are then formed on the surface of the fifth interlevel dielectric film 15 in the RF circuit area 100, followed by forming openings 17 penetrating the fifth interlevel dielectric film 15 and fourth interlevel dielectric film 13 to reach the third interlevel dielectric film 11. It should be noted that the surface of the fifth interlevel dielectric film 15 may be covered with a silicon oxynitride film.

Thereafter, as shown in FIG. 17, a soft magnetic material film 18 filling the depressions 16 and openings 17 is formed so as to cover the fifth interlevel dielectric film 15. As the soft magnetic material film 18, a FeNi film is grown using an electrolytic plating technique on a Ta/TiW barrier metal (TiW is the underlying film), which has been deposited by sputtering. A buffer metal, such as Ru or Ir, having a thickness of around 1 nm to 10 nm may be interposed between the barrier metal and FeNi. The soft magnetic material film may be formed using a coating film wherein minute particles of soft magnetic metal such as NiFe or soft magnetic ferrite such as (Ni, Zn)FeO are distributed within a low-permittivity insulating film. In this case, the particle diameter of the soft magnetic minute particles is preferably equal to or below around 500 nm. By removing a portion of the soft magnetic material film on the fifth interlevel dielectric film 15 by using a CMP technique, high-permeability isolation regions 19 each including a flat planar member and a rod member which is normal to the substrate surface are formed (FIG. 18). Formation of the high-permeability isolation regions 19 in the core region of the inductor allows even the small-sized inductor to have an increased inductance (L). For example, in case of NiFe having a relative permeability of 10 to 100, a size reduction of the inductor in terms of area ratio of 1/5 can be obtained for the same inductance.

Thereafter, a cover film 20 is formed covering the fifth interlevel dielectric film 15 in which the high-permeability isolation regions 19 are formed, followed by grinding the bottom surface of the silicon substrate to expose the bottom of the low-permittivity insulator rods 8, whereby the semiconductor device of the present example shown in FIG. 8 can be obtained.

Second Example

Referring to FIG. 19(*a*), the second example of the present invention is similar to the first example shown in FIG. 8 except that high-permeability isolation rods 21 without including a planar member are formed in the core of the inductor and the periphery thereof instead of the high-permeability isolation regions (19) each including a planar member and a rod and that the bottom surface of the low-permittivity insulating rods 8 is not exposed from the bottom surface of the substrate.

The fabrication method of the present example is similar to that of the first example in the steps up to the step shown in FIG. 15. Thereafter, the fifth interlevel dielectric film 15 is grown on the interconnect layers configuring the inductor 40, followed by forming openings penetrating the fifth interlevel dielectric film 15 and the fourth interlevel dielectric film 13 to reach the third interlevel dielectric film 11. The diameter of the openings is generally 1 μm to 2 μm, but not limited thereto. It is important here that the depth of the openings is large with respect to the diameter thereof, i.e., the aspect ratio is equal to or higher than 1. It should be noted that the fifth interlevel dielectric film may be covered with a silicon oxynitride film.

Thereafter, barrier metal and NiFe soft magnetic metal are grown, and the metallic films on the fifth interlevel dielectric film is removed by CMP, whereby high-permeability isolation rods 21 penetrating the fifth interlevel dielectric film 15 and fourth interlevel dielectric film 13 to reach the third interlevel dielectric film are formed. In an alternative, a coating material wherein minute particles of a soft magnetic material such as (Ni, Zn)Fe$_2$O$_4$ are dispersed in the low-permittivity insulating film may be applied thereon, and the coating film is removed by a CMP technique to form the high-permeability isolation rods 21. Thereafter, the cover film 20 is deposited and the bottom surface of the silicon substrate is ground, whereby the semiconductor device of the present embodiment can be obtained. The grinding should preferably be performed so that the silicon substrate has as small a thickness as two-fold or smaller than the length of the low-permittivity insulating rods within the substrate. For example, assuming that the low-permittivity insulating rods obtained by embedding MSQ having a relative permittivity of 2.5 in the openings having a 3 μm diameter and a 20 μm depth are arranged in an oblique direction at a 6 μm pitch, grinding the silicon substrate down to as small a thickness as 40 μm reduces the coupling capacitance between the inductor and the substrate by 50%.

Third Example

Referring to FIG. 20, the third example of the present invention is similar to the first example shown in FIG. 8 except that fourth-level copper interconnects are formed in the fifth interlevel dielectric film 15 overlying the windings of the inductor 40, a sixth interlevel dielectric film 23 is formed thereon and fifth-level copper interconnects are formed therein.

The fabrication method of the present example is similar to that of the first example in the steps up to forming the fifth interlevel dielectric film 15. After depositing the fifth interlevel dielectric film 15, interconnection trenches and via-holes are formed in the fifth interlevel dielectric film 15, followed by forming a copper film and performing CMP thereof to form the fourth-level copper interconnects 22. Thereafter, high-permeability isolation regions 19 are formed using a method similar to that of the first example. Further, the sixth interlevel dielectric film 23 and fifth-level copper interconnects 24 are formed, and a cover film 20 is formed thereon. Grinding the bottom surface of the substrate achieves the semiconductor device of the present example.

Fourth Example

Referring to FIG. 21, the fourth example of the present invention is similar to the third example except that high-permeability isolation planes 25 connected to the high-permeability isolation regions 19 are embedded within the depressions formed on the surface of the third interlevel dielectric film 11.

The fabrication method of the present example is similar to that of the third example in the steps up to forming the third interlevel dielectric film 11. After depositing the third interlevel dielectric film 11, interconnection trenches and via-holes are formed in the third interlevel dielectric film 11, followed by forming a copper film and performing CMP thereof to form the second-level copper interconnects 12. Thereafter, depressions are formed in the third interlevel dielectric film 11, barrier metal and NiFe soft magnetic metal are grown and a portion of the metallic films on the third interlevel dielectric film 11 is removed by CMP, thereby forming high-permeability isolation planes 25. The subsequent steps are similar to those in the third example.

Fifth Example

Referring to FIG. 22, the fifth example of the present invention is configured as a semiconductor device including CMOS transistors formed on a SOI (silicon on chip) substrate. On the SOI substrate are disposed an RF circuit area 100 and a digital circuit area (not shown). As understood from FIG. 22, n-channel or p-channel MOSFETs 3 configured as thin-film transistors are formed on the silicon substrate 1 with an intervention of an embedded oxide film 27. The MOSFETs 3 are covered by a first interlevel dielectric film 4, on which a first-level interconnects 10*a* connected to source/drain regions of the MOSFETs 3 via contact plugs 5*a* are formed.

The periphery of the MOSFETs 3 is provided with openings penetrating the first interlevel dielectric film 4 and embedded oxide film 27 to reach the internal of the silicon substrate 1. A low-permittivity insulating material is embedded in the openings to form low-permittivity insulating rods 8. Although not depicted in the figure, one or a plurality of interlevel dielectric films are formed on the first interlevel dielectric film in the present example, similarly to the first through fourth examples. An inductor and high-permeability isolation regions are formed in the interlevel dielectric films in the RF circuit area.

Sixth Example

Referring to FIG. 23, the sixth example of the present invention is such that the present invention is applied to a compound semiconductor device. As shown in FIG. 23, on a semi-insulating GaAs substrate 20 are formed an $n^+$-GaAs layer 30 and an $n^-$-GaAs layer 31 configuring collector regions in an area encircled by $H^+$-doped high-resistance areas configuring isolation regions, and a $p^+$-GaAs layer 32 configuring base regions is formed thereon. An n-AlGaAs layer configuring the emitter regions and an n-InGaAs layer configuring the contact layer are formed thereon. On the $n^+$-GaAs layer 30 is formed a Au/Ni/AuGe layer 35 configuring the collector electrodes, and on the p+-GaAs layer 32 is formed a Au/Pt/Ti layer 36. On the n-InGaAs layer 34 are formed a WSi layer configuring the emitter electrodes and a Au/Pt/Ti layer 38.

$H^+$-doped high-resistance regions 29 and transistors are covered by the first interlevel dielectric film 4, on which a first-level interconnects 10a connected to electrodes of the transistors via contact plugs 5a are formed.

The periphery of the transistors is provided with openings penetrating the first interlevel dielectric film 4 and $H^+$-doped high-resistance regions to reach the internal of the semi-insulating GaAs substrate 28. The openings are filled with a low-permittivity insulating material to form low-permittivity insulating rods 8. Although not depicted in the figure, one or a plurality of interlevel dielectric films are formed on the first interlevel dielectric film 1 in the present example, similarly to the first through fourth examples. An inductor and high-permeability regions are formed in the interlevel dielectric films in the RF circuit area 100.

Seventh Example

FIG. 24(a) is a top plan view showing the seventh example of the present invention, and FIG. 24(b) is a sectional view taken along line A-A' in FIG. 24(a). In the present example, the present invention is applied to a semiconductor device including an on-chip antenna. In FIG. 24, the parts equivalent to the parts of the first example are denoted by similar reference numerals, and thus will be omitted for a duplicated description. In the present example, a peripheral high-resistance area 400 is provided on the periphery of the semiconductor chip, and the inner side of the semiconductor chip is provided with a RF circuit area 100 and a digital circuit area 200. In the peripheral high-resistance area 400 are formed low-permittivity insulating rods 8 penetrating the first interlevel dielectric film 4 and shallow-trench isolation film 2 to reach the internal of the silicon substrate 1. The on-chip antennal interconnect 41 is formed on the peripheral high-resistance area 400 by using the fourth-level copper interconnects within the fifth interlevel dielectric film 15.

The on-chip antenna interconnect 41 is connected to MOS-FETs formed in the RF circuit area 100 via the multi-layered interconnects.

An antenna for receiving radio waves is dispensable to the semiconductor chip having a wireless function. There is a technique wherein a chip having the antenna formed on an insulating film such as alumina ceramics is separately manufactured in advance, and externally attached to another semiconductor chip having an RF circuit. In this technique, however, there are technical problems that the inter-chip connections incur a loss and noise entering therethrough, and that a size reduction is difficult to achieve. Compared thereto, the antenna formed on the chip solves those problems. In the conventional technique, however, even if the antenna is provided on the silicon semiconductor chip for example, a higher-efficiency antenna cannot be formed due to the radio shielding by the low resistance of the silicon substrate.

In the seventh example, as shown in FIG. 24, the peripheral high-resistance area 400 having a high resistance and a low permittivity is formed, wherein the low-permittivity insulating rods 8 are embedded in the periphery of the chip, and the antenna is configured by the topmost interconnect layer. The arrangement in the peripheral area is to improve the transmitting/receiving efficiency by increasing the length of the antenna. It is to be noted that although the antenna having a loop shape is formed in the peripheral area of the chip, the shape of the antenna is not limited thereto. The antenna may have an I-shape wherein it is located in the vicinity of a single side of the chip, an L-shape wherein it is located in the vicinity of two sides, a U-shape wherein it is located in the vicinity of three sides, or a multiple-loop structure.

Eighth Example

FIG. 25(a) is a top plan view showing the eighth example of the present invention, and FIG. 25(b) is a sectional view taken along line A-A' in FIG. 25(a). The present example is similar to the seventh example shown in FIG. 24 except that the antenna interconnect has a multi-layered structure and that a grounded shield interconnect 42 is additionally provided in the radially-inward position of the on-chip antenna having the multi-layered structure. The multi-layered antenna interconnect is such that a multiple of antenna interconnect layers embedded in the slit-like openings, which turn around the periphery of the chip and penetrate the interlevel dielectric films, are layered one on another. More specifically, it has a structure wherein a wall of the antenna interconnect is formed from the topmost interconnect layer to the undermost interconnect layer in the peripheral area of the chip. It is to be noted that the antenna interconnects need not necessarily be formed from the topmost interconnect layer to the undermost interconnect layer. The antenna interconnect may be configured by a plurality of layers such as two layers including the topmost layer. In the present example, the shield interconnect 42 is provided in the radially-inward position of the antenna interconnects, and the shield interconnect are also formed from multi-layered interconnects embedded within slit-like openings which turn around. More specifically, a wall of the shield interconnect is formed from the topmost layer interconnects to the undermost layer interconnects, and thus has a structure wherein the wall shields the antenna interconnects away from the electromagnetic noise. It is to be noted that the multi-layered antenna interconnect and multi-layered shield interconnect have also a function of blocking the water entering from outside the chip.

Ninth Example

Next, a fabrication method for forming the structure of the seventh example will be described with reference to FIGS. 42 to 45. The fabrication method is an example of achieving the seventh example, and thus do not limit the scope of the present invention. First, as shown in FIG. 42(a), a first stopper film 92 to be used as a stopper during the CMP step later performed and, depending on the necessity, a sacrifice layer for improvement of the coating capability for the low-permittivity film are formed on a semiconductor substrate on which the shallow-trench isolation film 2, MOSFETs 3 and W contact plugs 5 have been formed. The first stopper film 92 should be preferably made of a material assuring a selectivity ratio against the low-permittivity insulating film 7 and sacrifice layer 97 during the CMP step, and examples thereof include SiN, SiON, and SiCN. The sacrifice layer 97 should preferably be an insulating film including silicon and oxygen, and the examples thereof include $SiO_2$. More preferably, the sacrifice layer 97 is made of a hydrophilic material in the view point of coating capability improvement in the case of forming the low-permittivity insulating film 7 by a coating technique.

Thereafter, as shown in FIG. 42(b), patterning is performed using photoresist 98 for later forming the low-capacitance substrate region. The shape of patterning may be a square lattice arrangement, oblique arrangement, random arrangement or groove lattice, as recited in the first embodiment in this text. Moreover, it may be a so-called honey-comb structure wherein hexagon openings are arranged to improve the filling factor.

Thereafter, as shown in FIG. 42(c), the sacrifice layer 97, first stopper insulating film 92, first interlevel dielectric film 4, and shallow-trench element isolation film 2 are etched by plasma-enhanced etching using the photoresist 98 as a mask, to form openings 99a. Subsequently, as shown in FIG. 43(d), the silicon substrate 1 is etched by plasma-enhanced etching to form openings 99b. The peel-off of the photoresist 98 shown in FIG. 43(c)', may be performed after the etching of the silicon substrate.

Thereafter, as shown in FIG. 43(e), a low-permittivity insulating film 7 is formed for filling the openings. The materials shown in the embodiments of this text are used for the low-permittivity insulating film 7.

Thereafter, unnecessary low-permittivity insulating film 7 and sacrifice layer 97 are removed by CMP, wherein the first stopper insulating film 92 acts as a stopper for the CMP during this CMP, and the structure shown in FIG. 44(f) is formed after the CMP. Subsequently, a second stopper insulating film 93 is formed (FIG. 44(g)).

Thereafter, as shown in FIG. 44(h), a desired interconnection trench pattern is formed using photoresist 101, followed by etching the second interlevel dielectric film 9 by plasma-enhanced etching, as shown in FIG. 45(i). In this step, the second stopper insulating film 93 acts as an etch stopper and prevents the low-permittivity insulating rods 8 from being etched during the etching of the second interlevel dielectric film 9. During the etching of the second interlevel dielectric film 9, a hard mask technique using an insulating film formed on the second interlevel dielectric film 9 may be used instead of the resist mask, although not depicted therein.

Thereafter, the second stopper insulating film 93, first stopper insulating film 92 and low-permittivity insulating rods 8 are concurrently etched by plasma-enhanced etching using the second interlevel dielectric film 9 as a mask. A barrier metal film 102 depending on the necessity and a metallic interconnect layer 10 are deposited on the entire surface including the interconnection trench formed by the plasma-enhanced etching, and unnecessary metallic films are removed by CMP to obtain the structure shown in FIG. 45(k).

The present fabrication method provides a flat surface for the bottom of the first metallic interconnects 10, especially if the first metallic interconnects 10 are formed in the second interlevel dielectric film 9 located on the low-capacitance substrate region in the case where metallic interconnects including copper as the main component thereof are formed using a damascene technique on the semiconductor substrate including therein low-capacitance substrate region. Thus, the performances, such as stability of the line resistance of the metallic interconnects 10, reliability of the insulation, which are required of the metallic interconnects formed in the semiconductor device can be satisfied.

Tenth Example

Next, referring to FIGS. 46 to 48, a fabrication method for forming the structure of the eighth embodiment of the present invention will be described in detail. The fabrication method is an example for achieving the eighth embodiment of the present invention, and thus do not limit the scope of the present invention. The steps of this example are same as the steps of the method of the ninth example up to the step shown in FIG. 43(e), and thus the description thereof is omitted for the steps up to the step of FIG. 43(e) and will be started at FIG. 46(e) which shows the same structure as FIG. 43(e).

After forming the structure shown in FIG. 46(e), the low-permittivity insulating film 7 is etched by plasma-enhanced etching to form the low-permittivity insulator rods 8 (FIG. 46(f)). The etching conditions should preferably include the condition for assuring the selectivity ratio against the sacrifice layer 97. Subsequently, the cap insulating film 94 is deposited so as to fill the openings on the low-permittivity insulator rods 8. The cap insulating film 94 should preferably be made of a material having a higher permittivity and a higher mechanical strength, such as in elastic modulus and hardness, than the low-permittivity insulator rods 8, and thus an insulating material capable of being removed together with the sacrifice layer 97 by using CMP.

Thereafter, the cap insulating film 94 and sacrifice layer 97 are removed for planarization using CMP. In this step, the first stopper insulating film acts as a CMP stopper, whereby the structure shown in FIG. 47(h) is formed after the CMP.

Thereafter, as shown in FIG. 47(i), the second stopper insulating film 93 and second interlevel dielectric film 9 are deposited, followed by forming a desired interconnection trench pattern by using photoresist 101, as shown in FIG. 47(j), and plasma-enhanced etching to obtain the structure shown in FIG. 48(k). In this step, the second stopper insulating film 93 acts as an etch stopper and prevents the cap insulating film 94 from being etched during the etching of the second interlevel dielectric film 9. For the etching of the second interlevel dielectric film 9, a hard mask technique may be used using an insulating film formed on the second interlevel dielectric film 9 in advance, instead of using the resist mask, although not depicted therein.

Thereafter, using the second interlevel dielectric film 9 as a mask, the second stopper insulating film 93, first stopper insulating film 92 and cap insulating film 94 are concurrently etched by plasma-enhanced etching (FIG. 48(l)). Moreover, a barrier metal layer 102 depending on the necessity, and metallic interconnects 101 are deposited, and then unnecessary metallic films are removed by CMP to obtain the structure of FIG. 48(m).

The fabrication method provides a flat surface for the bottom of the first metallic interconnects 10, if the first metallic interconnects 10 formed in the second interlevel dielectric film 9 located on the low-capacitance substrate region in the case where metallic interconnects including copper as the main component thereof are formed using a damascene technique on the semiconductor substrate including therein the low-capacitance substrate region. Thus the performances, such as stability of the line resistance of the metallic interconnects 10 and reliability of insulation, which are requested of the metallic interconnects formed in the semiconductor device can be satisfied.

Eleventh Example

Next, referring to FIG. 49, a fabrication method for forming the structure of the ninth example of the present invention will be described. The fabrication method is an example for achieving the ninth embodiment of the present invention, and thus does not limit the scope of the present invention. The steps of this example are same as the steps of the method of the ninth example for the steps up to the step shown in FIG. 43(e), and thus the description thereof is omitted for the steps up to the step of FIG. 43(e) and will be started at FIG. 49(e) which shows the same structure as FIG. 43(e).

After forming the structure shown in FIG. 49(e), unnecessary low-permittivity insulating film 7 is removed by plasma-enhanced etching to form the low-permittivity insulator rods 8 (FIG. 49(f)). For manufacturing the structure of the ninth embodiment of the present invention, it is necessary that the topmost position of the low-permittivity insulator rods 8 be located lower than the topmost position of the W contact plugs 5 after the plasma-enhanced etching. The cap insulating film 94 is later formed on top of the low-permittivity insulator rods 8 by using this step difference.

Thereafter, as shown in FIG. 49(g), an insulator cap 94 is deposited. The material for the insulator cap 94 should preferably be made of a material having a higher mechanical strength than the low-permittivity insulating film configuring the low-permittivity insulator rods 8 and a resistance against the sputtering for a metal containing titanium, aluminum etc. and etching plasma for the metallic interconnects.

Thereafter, unnecessary cap insulating film 94 and sacrifice layer 97 are removed using CMP. The first stopper insulating film 92 acts as a CMP stopper, whereby the sectional structure shown in FIG. 50(h) is formed after the CMP. It is sufficient that the CMP condition be set such that the cap insulating film 94 and sacrifice layer 97 can be removed and a selectivity ratio against the first stopper insulating film 92 is assured.

After forming the structure shown in FIG. 50(I), the first stopper insulating film 92 is removed using plasma-enhanced etching. It is sufficient that the conditions of the plasma-enhanced etching be set such that the top surface of the W contact plugs is exposed. If the selectivity ratio is secured between the first stopper insulating film 92 and the cap insulating film 94, then the shape of FIG. 50(i) is obtained, whereas if the selectivity ratio is not secured and the etching proceeds concurrently, then the shape of FIG. 50(i)' is obtained. In view of the bottom flatness of the interconnects, the shape of FIG. 50(i)' is more preferable.

After the steps as described above, the multi-layered interconnection structure is formed according to the manufacturing process for the aluminum interconnects generally used, to thereby obtain the structure shown in FIGS. 51(j) and 51(j)' (wherein the detail of the steps for manufacturing the aluminum interconnects is not depicted).

The invention claimed is:

1. A semiconductor device comprising a semiconductor substrate, a transistor formed on a surface area of said semiconductor substrate, and a multi-layered interconnection structure including a plurality of interlevel dielectric films and a plurality of interconnect layers overlying said transistor, wherein a high-permeability region is provided in an interlevel dielectric film, wherein:

said high-permeability region includes therein a plurality of high-permeability magnetic rods including a high-permeability material embedded in respective film openings, said film openings having an aspect ratio (depth/diameter or a side) of 1 or above and penetrating at least one of said interlevel dielectric films to reach another of said interlevel dielectric films, said high-permeability material is a composite material including a low-permittivity insulating material and a high-permeability magnetic material including an electric conductivity or an insulating property.

2. The semiconductor device according to claim 1, wherein said low-permittivity insulating material is a porous insulating material.

3. A semiconductor device comprising a semiconductor substrate having therein a low-capacitance substrate region, a transistor formed on a surface area of said semiconductor substrate, and a multi-layered interconnection structure including a plurality of interlevel dielectric films and a plurality of interconnect layers overlying said transistor, wherein:

a plurality of substrate openings are formed in said low-capacitance substrate region, penetrating at least an undermost one of said interlevel dielectric films to reach an internal of said semiconductor substrate, an on-chip antenna interconnect is formed on said low-capacitance substrate region and is configured by interconnect layers embedded in slit-like openings which are formed to penetrate a plurality of said interlevel dielectric films.

4. A semiconductor device comprising a semiconductor substrate having therein a low-capacitance substrate region, a transistor formed on a surface area of said semiconductor substrate, and a multi-layered interconnection structure including a plurality of interlevel dielectric films and a plurality of interconnect layers overlying said transistor, wherein:

a plurality of substrate openings are formed in said low-capacitance substrate region, penetrating at least an undermost one of said interlevel dielectric films to reach an internal of said semiconductor substrate, an on-chip antenna interconnect is formed on said low-capacitance substrate region in a peripheral area of a semiconductor chip, and a grounded shield interconnect is formed inside said on-chip antenna interconnect.

5. The semiconductor device according to claim 4, wherein said shield interconnect is configured by interconnect layers embedded in slit-like openings formed to penetrate a plurality of said interlevel dielectric films.

* * * * *